(12) United States Patent
Kim et al.

(10) Patent No.: US 10,943,922 B2
(45) Date of Patent: Mar. 9, 2021

(54) VERTICAL MEMORY DEVICES

(71) Applicant: Samsung Electronics Co., Ltd., Suwon-si (KR)

(72) Inventors: Kyoung-Hoon Kim, Seoul (KR); Hong-Soo Kim, Seongnam-si (KR); Ju-Yeon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/856,611

(22) Filed: Apr. 23, 2020

(65) Prior Publication Data

US 2020/0251494 A1   Aug. 6, 2020

Related U.S. Application Data

(63) Continuation of application No. 15/601,501, filed on May 22, 2017, now Pat. No. 10,700,084.

(30) Foreign Application Priority Data

Jul. 11, 2016 (KR) .................. 10-2016-0087722

(51) Int. Cl.
*H01L 27/11582* (2017.01)
*H01L 23/528* (2006.01)
*H01L 27/11556* (2017.01)

(52) U.S. Cl.
CPC .... *H01L 27/11582* (2013.01); *H01L 23/5283* (2013.01); *H01L 27/11556* (2013.01)

(58) Field of Classification Search
None
See application file for complete search history.

(56) References Cited

U.S. PATENT DOCUMENTS

| | | |
|---|---|---|
| 7,951,704 B2 | 5/2011 | Fang et al. |
| 8,096,511 B2 | 1/2012 | Frenkiel et al. |
| 8,741,767 B2 | 6/2014 | Park et al. |
| 9,252,097 B2 | 2/2016 | Baba |
| 9,419,013 B1 | 8/2016 | Lee et al. |
| 2003/0104674 A1 | 6/2003 | Kasai |

(Continued)

FOREIGN PATENT DOCUMENTS

| | | |
|---|---|---|
| JP | H11154679 A | 6/1999 |
| JP | 2001053143 A | 2/2001 |

(Continued)

*Primary Examiner* — Bo B Jang
(74) *Attorney, Agent, or Firm* — Harness, Dickey & Pierce, P.L.C.

(57) ABSTRACT

A vertical memory device includes a substrate including a cell region and a peripheral circuit region, gate electrodes sequentially stacked on the cell region of the substrate in a vertical direction substantially perpendicular to an upper surface of the substrate, a channel on the cell region and extending through the gate electrodes in the vertical direction, a first lower contact plug on the peripheral circuit region and extending in the vertical direction, a second lower contact plug on the peripheral circuit region adjacent to the first lower contact plug and extending in the vertical direction, and a first upper wiring electrically connected to the first lower contact plug. The first upper wiring is configured to and apply an electrical signal to the first lower contact plug. The second lower contact plug is not electrically connected to an upper wiring configured to apply an electrical signal.

20 Claims, 48 Drawing Sheets

(56) References Cited

U.S. PATENT DOCUMENTS

| | | |
|---|---|---|
| 2006/0278918 A1 | 12/2006 | Inoue |
| 2009/0230462 A1 | 9/2009 | Tanaka et al. |
| 2009/0267128 A1 | 10/2009 | Maejima |

FOREIGN PATENT DOCUMENTS

| | | |
|---|---|---|
| KR | 100772251 B | 10/2007 |
| KR | 100791697 B | 12/2007 |
| KR | 20080087418 A | 10/2008 |
| KR | 20090041895 A | 4/2009 |
| KR | 20110037242 A | 4/2011 |

VERTICAL MEMORY DEVICES

CROSS-REFERENCE TO RELATED APPLICATIONS

This application is a continuation of U.S. application Ser. No. 15/601,501, filed on May 22, 2017, which claims priority under 35 U.S.C. § 119 to Korean Patent Application No. 10-2016-0087722 filed on Jul. 11, 2016 in the Korean Intellectual Property Office (KIPO), the contents of each of which are incorporated by reference herein in their entirety.

BACKGROUND

1. Field

Inventive concepts generally relate to a vertical memory device, and more particularly, inventive concepts relate to a vertical non-volatile memory device having a contact plug.

2. Description of Related Art

Contact plugs in a peripheral region of a VNAND flash memory device may not have a uniform density. Contact plugs having a relatively low density may not be formed to contact a substrate or gate structure, or to have a size less than a desired size, which may generate an electrical failure.

SUMMARY

Example embodiments provide a vertical memory device including a contact plug having improved electrical characteristics.

According to some example embodiments of inventive concepts, a vertical memory device may include a substrate including a cell region and a peripheral circuit region, gate electrodes sequentially stacked on the cell region of the substrate in a vertical direction that is substantially perpendicular to an upper surface of the substrate, a channel on the cell region of the substrate and extending through the gate electrodes in the vertical direction, a first lower contact plug on the peripheral circuit region of the substrate and extending in the vertical direction, a second lower contact plug on the peripheral circuit region of the substrate adjacent to the first lower contact plug and extending in the vertical direction, and a first upper wiring electrically connected to the first lower contact plug. The first upper wiring is configured to apply an electrical signal to the first lower contact plug. The second lower contact plug may not be electrically connected to an upper wiring configured to apply an electrical signal.

According to some example embodiments of inventive concepts, a vertical memory device may include a substrate including a cell region and a peripheral circuit region, gate electrodes sequentially stacked on the cell region of the substrate in a vertical direction that is substantially perpendicular to an upper surface of the substrate, a channel on the cell region of the substrate and extending through the gate electrodes in the vertical direction, first lower contact plugs each on the peripheral circuit region of the substrate and extending in the vertical direction, at least one second lower contact plug extending in the vertical direction on the peripheral circuit region of the substrate and being adjacent to at least one of the first lower contact plugs, first upper contact plugs contacting upper surfaces of the first lower contact plugs, respectively, and first upper wirings contacting upper surfaces of the first lower contact plugs.

In some example embodiments of inventive concepts, a method of manufacturing the vertical memory device, at least one additional lower contact plug may be further formed to be adjacent the lower contact plug having a relatively low density on the peripheral region of the substrate so that the lower contact plug may contact the target structure well and have a desired size. Accordingly, the vertical memory device including the lower contact plug may have improved electrical characteristics.

According to some example embodiments of inventive concepts, a vertical memory device may include a substrate including a cell region and a peripheral circuit region, a plurality of gate electrodes stacked on top of each and spaced apart in a vertical direction from each other on the cell region of the substrate, a plurality of channel structures spaced apart from each other on the cell region of the substrate and extending in the vertical direction through the plurality of gate electrodes, an upper wiring on the substrate over the peripheral circuit region, a first lower contact plug on the peripheral circuit region of the substrate below the upper wiring, a second lower contact plug adjacent to the first lower contact plug on the peripheral circuit region of the substrate; and an insulating interlayer extending between the upper wiring and the second lower contact plug to insulate the second lower contact plug from the upper wiring. The first lower contact plug extends in the vertical direction and may be electrically connected to the upper wiring.

BRIEF DESCRIPTION OF THE DRAWINGS

The above and other aspects and features of inventive concepts will become readily understood from the detail description that follows, with reference to the accompanying drawings, in which like reference numbers refer to like elements unless otherwise noted, and in which.

DETAILED DESCRIPTION

FIGS. 1 to 34 are cross-sectional views illustrating stages of a method of manufacturing a vertical memory device. Particularly, FIGS. 1-2, 5, 8, 10, 13, 18, 20, 22, 25, 28 and 31 are plan views, and FIGS. 3-4, 6-7, 9, 11-12, 14-17, 19, 21, 23-24, 26-27, 29-30 and 32-34 are cross-sectional views.

Figure 1:
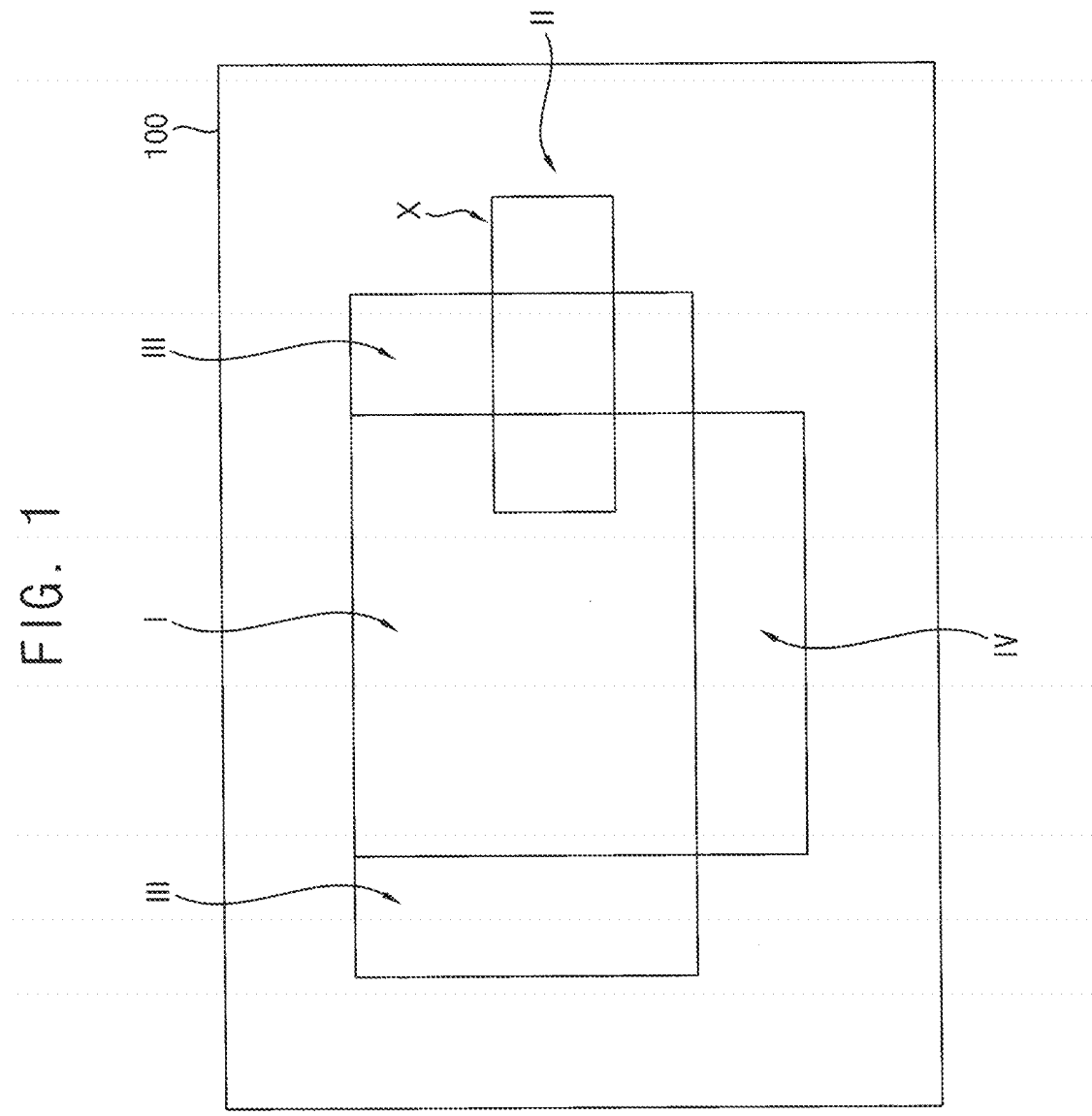
FIGS. 1 to 34 are cross-sectional views illustrating stages of a method of manufacturing a vertical memory device.

Each of the figures except for FIG. 1 shows a region X of FIG. 1. FIGS. 3, 23, 26, 29 and 32 are cross-sectional views taken along lines A-A' of corresponding plan views, respectively, FIGS. 4, 6, 7, 16, 19, 24, 27, 30 and 33 are cross-sectional views taken along lines B-B' of corresponding plan views, respectively, and FIGS. 9, 11, 12, 14, 15, 17, 18 and 34 are cross-sectional views taken along lines C-C' of corresponding plan views. FIG. 12 is an enlarged cross-sectional view of a region Y of FIG. 11.

For purposes of illustration, a direction substantially perpendicular to an upper surface of a substrate is defined as a first direction, and two directions substantially parallel to the upper surface of the substrate and crossing each other are defined as second and third directions, respectively. In some example embodiments, the second and third directions may be substantially perpendicular to each other.

Referring to FIG. 1, a substrate 100 may include first to fourth regions I, II, III and IV.

The substrate 100 may include a semiconductor material, e.g., silicon, germanium, silicon-germanium, etc., or III-V semiconductor compounds, e.g., GaP, GaAs, GaSb, etc. In some example embodiments, the substrate 100 may be a silicon-on-insulator (SOI) substrate, or a germanium-on-insulator (GOI) substrate.

In some example embodiments, the first to fourth regions I, II, III and IV of the substrate 100 may serve as a cell region, a peripheral circuit region, an X-decoder region, and a page buffer region, respectively. Memory cells may be formed in the first region I, peripheral circuits for driving the memory cells may be formed in the second region II, an X-decoder may be formed in the third region III, and a pager buffer and a Y-decoder may be formed in the fourth region IV. The third region III together with the fourth region IV may be referred to as a core region, and the core region together with the peripheral circuit region may be referred to as a peripheral region.

Figure 2:
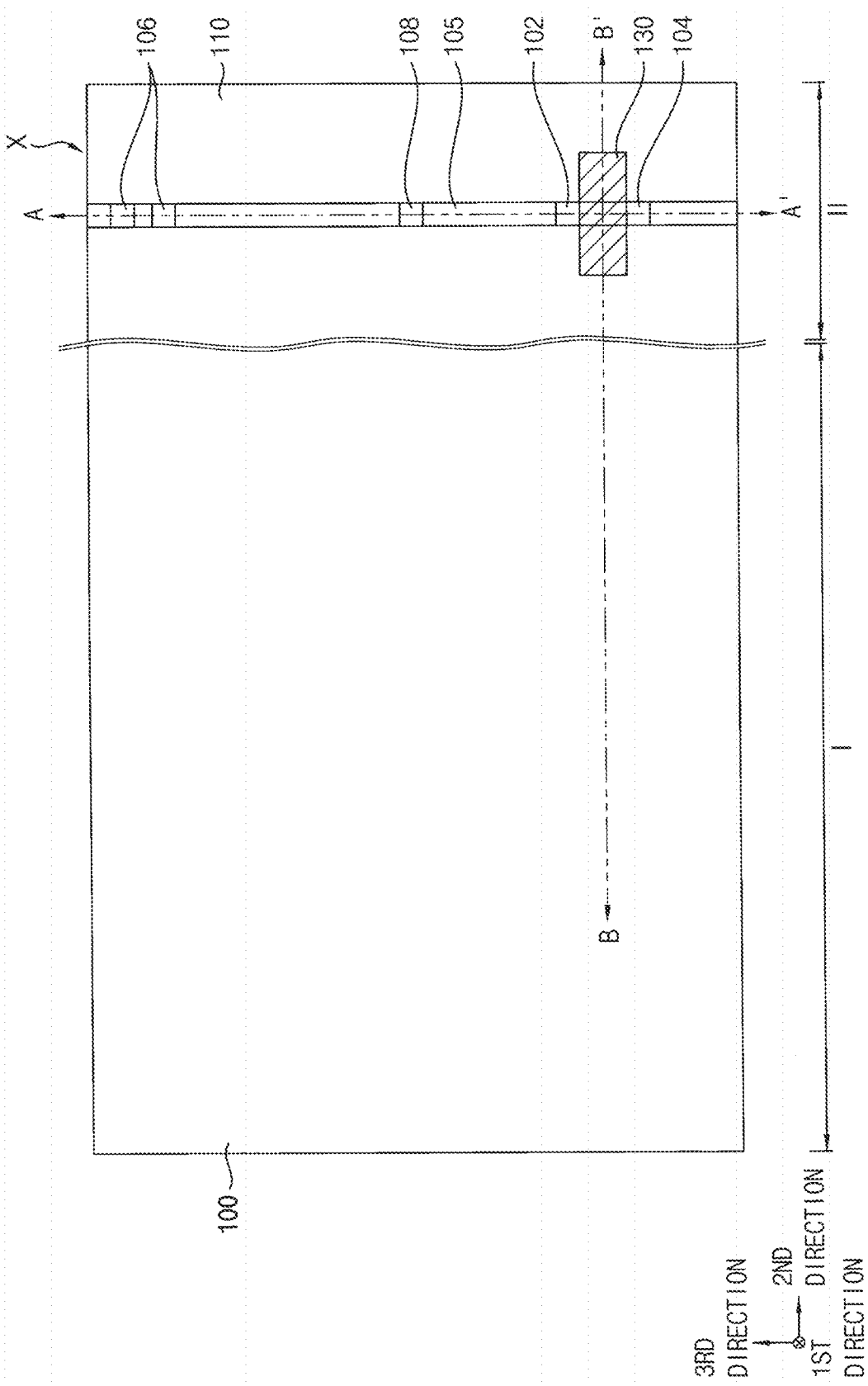
Figure 3:
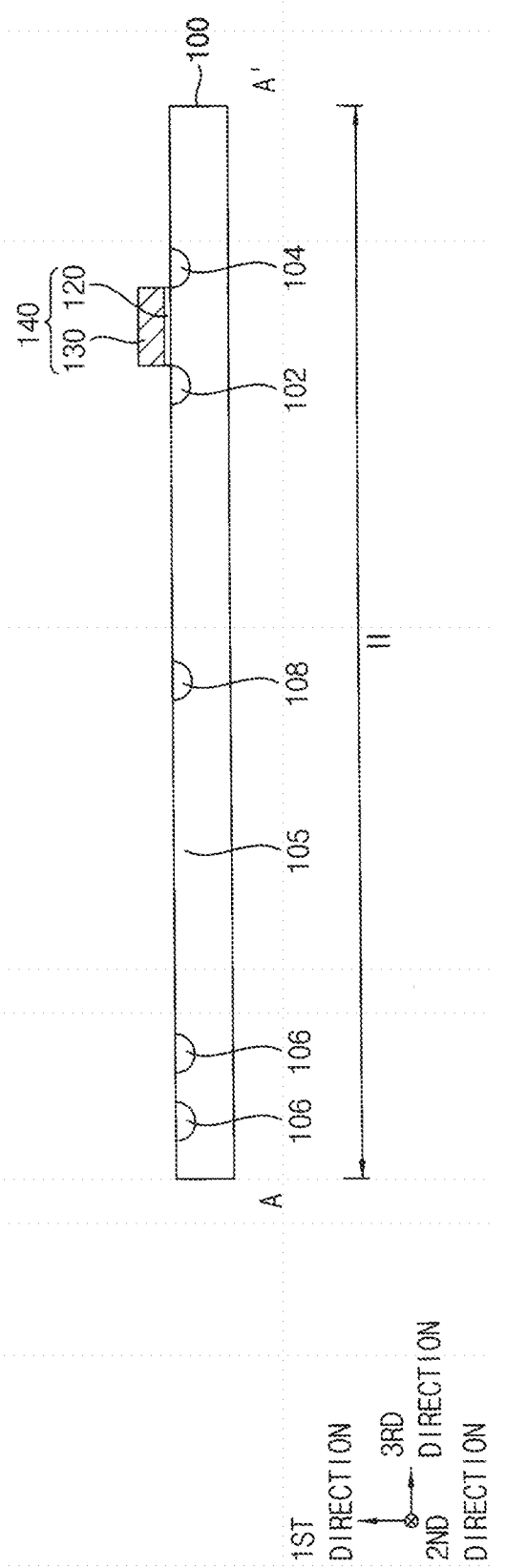

Referring to FIGS. 2 and 3, a first gate structure 140 and first to fourth impurity regions 102, 104, 106 and 108 may be formed on the second region II of the substrate 100.

The second region II of the substrate 100 may be divided into a field region on which an isolation pattern 110 is formed, and a first active region 105 on which no isolation pattern is formed. The isolation pattern 110 may be formed by a shallow trench isolation (STI) process, and may be formed of an oxide, e.g., silicon oxide.

In some example embodiments, the first active region 105 may extend in the third direction. FIGS. 2 and 3 show only one first active region 105, however, inventive concepts may not be limited thereto, and a plurality of first active regions 105 may be formed in the second direction. The first active region 105 may have various shapes, and thus may, e.g., extend in the second direction, or may have a rectangular shape in a plan view.

The first gate structure 140 may be formed by sequentially stacking a gate insulation layer and a gate electrode layer on the substrate 100, and patterning the gate electrode layer and the gate insulation layer. Thus, the first gate structure 140 may have a first gate insulation pattern 120 and a first gate electrode pattern 130 sequentially stacked. A gate spacer (not shown) may be further formed on each of opposite sidewalls of the first gate structure 140.

The first and second impurity regions 102 and 104 may be formed at upper portions of the first active region 105 adjacent the first gate structure 140. A plurality of third impurity regions 106 may be formed at upper portions of the first active region 105 to be adjacent to each other, and FIGS. 2 and 3 show two third impurity regions 106. The fourth impurity region 108 may be formed at an upper portion of the first active region 105 to be far from the first to third impurity regions 102, 104 and 106. In some example embodiments, the first to fourth impurity regions 102, 104, 106 and 108 may be doped with n-type or p-type impurities, and the impurities doped into the first to fourth impurity regions 102, 104, 106 and 108 may have conductivity types the same as or different from each other.

Figure 4:
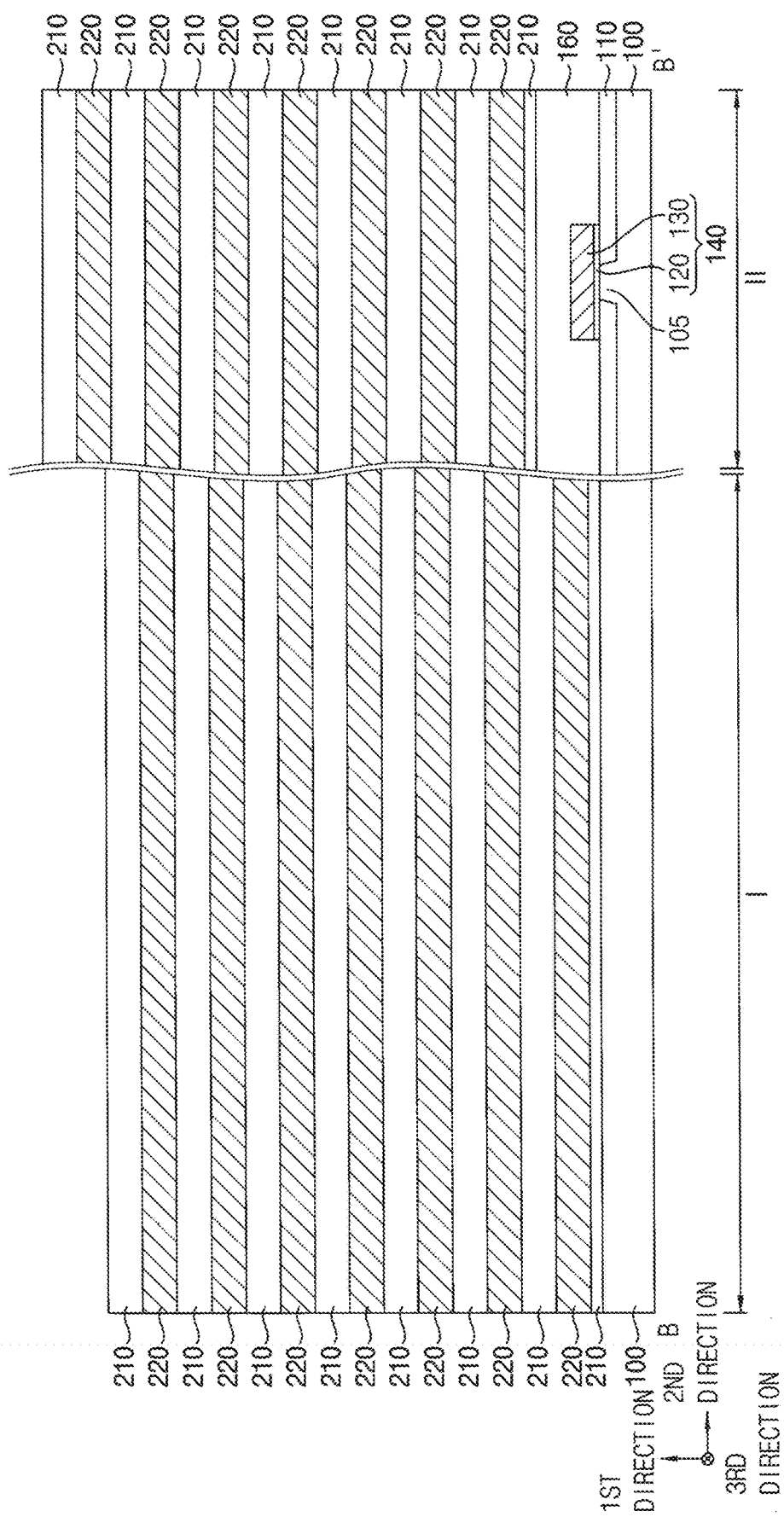

Referring to FIG. 4, a first insulating interlayer 160 may be formed on the second region II of the substrate 100 to cover the first gate structure 140.

The first insulating interlayer 160 may be formed of an oxide, e.g., silicon oxide.

An insulation layer 210 and a sacrificial layer 220 may be alternately and repeatedly formed on the first region I of the substrate 100 and the first insulating interlayer 160 on the second region II of the substrate 100. Thus, a plurality of insulation layers 210 and a plurality of sacrificial layers 220 may be alternately stacked on each other in the first direction. FIG. 4 shows for purposes of illustration eight second insulation layers 210 and seven sacrificial layers 220 alternately stacked. However, inventive concepts may not be limited to any particular number of the insulation layers 210 and the sacrificial layers 220.

The insulation layers 210 and the sacrificial layers 220 may be formed by a chemical vapor deposition (CVD) process, a plasma chemical vapor deposition (PECVD) process, an atomic layer deposition (ALD) process, etc.

The insulation layers 210 may be formed of a silicon oxide, e.g., plasma enhanced tetraethylorthosilicate (PE-TEOS), high density plasma (HDP) oxide, plasma enhanced oxide (PEOX), etc. The sacrificial layers 220 may be formed of a material having an etching selectivity with respect to the insulation layers 210, e.g., silicon nitride.

Figure 5:
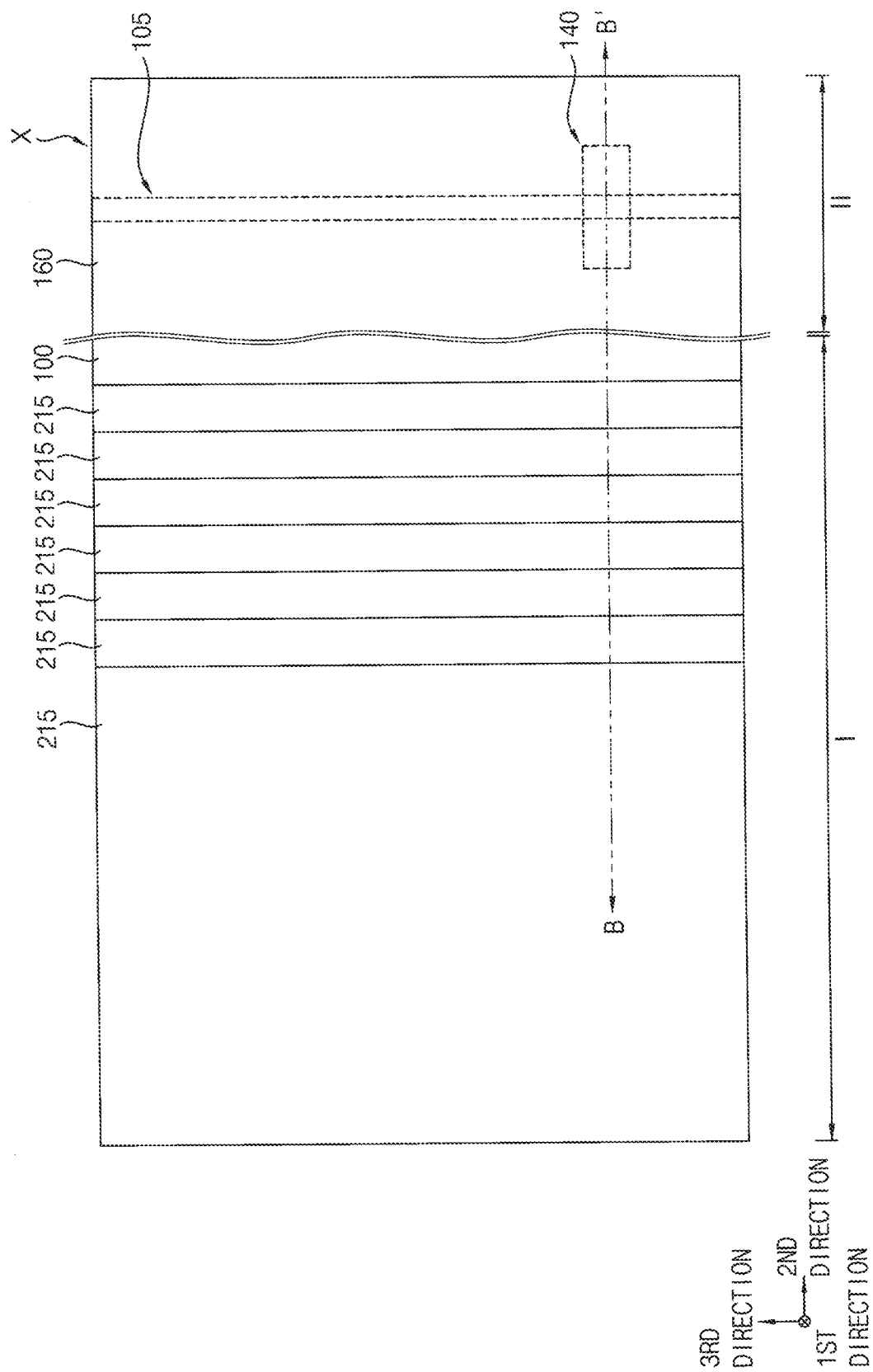
Figure 6:
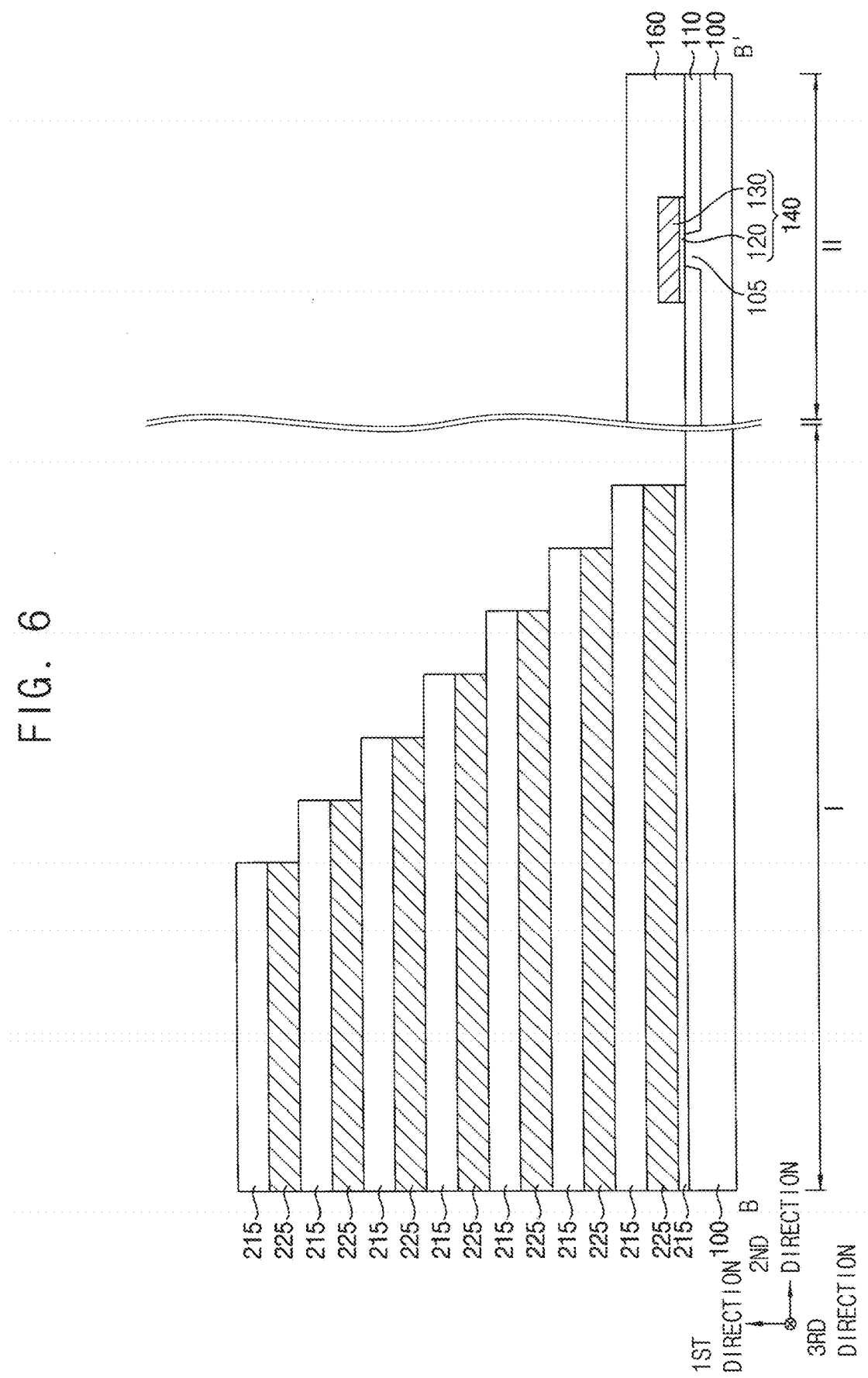

Referring to FIGS. 5 and 6, a photoresist pattern (not shown) may be formed on an uppermost one of the insulation layers 210, and the uppermost one of the insulation layers 210 and an uppermost one of the sacrificial layers 220 therebeneath may be etched using the photoresist pattern as an etching mask. Thus, a portion of one of the insulation layers 210 beneath the uppermost one of the sacrificial layers 220 may be exposed. After reducing the area of the photoresist pattern by a given ratio, the uppermost one of the insulation layers 210, the uppermost one of the sacrificial layers 220, the exposed one of the insulation layers 210, and one of the sacrificial layers 220 therebeneath may be etched using the reduced photoresist pattern as an etching mask, which may be referred to as a trimming process. The trimming process may be repeatedly performed to form a staircase structure including a plurality of steps each including a sacrificial pattern 225 and an insulation pattern 215 sequentially stacked.

In some example embodiments, the steps of the staircase structure may have areas gradually decreasing from a bottom toward a top thereof.

Figure 7:
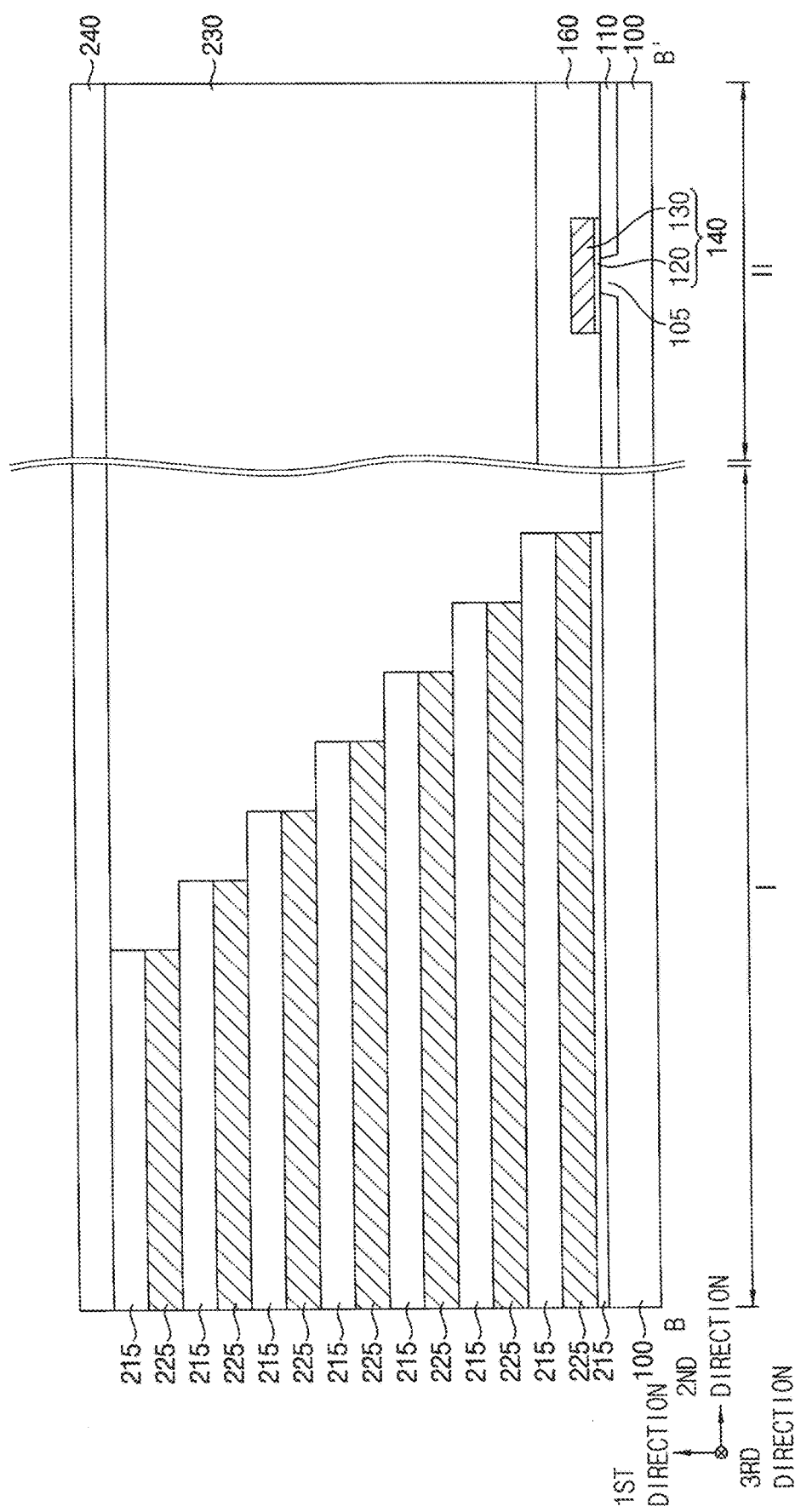

Referring to FIG. 7, a second insulating interlayer may be formed on the substrate 100 to cover the staircase structure, and the second insulating interlayer may be planarized until an upper surface of an uppermost one of the insulation patterns 215 may be exposed to form a second insulating interlayer pattern 230 covering a sidewall of the staircase structure.

The second insulating interlayer may be formed of an oxide, e.g., silicon oxide, and thus may be merged with the insulation pattern 215. The planarization process may be performed by a CMP process and/or an etch back process.

A third insulating interlayer 240 may be formed on upper surfaces of the staircase structure and the second insulating interlayer pattern 230.

The third insulating interlayer 240 may be formed of an oxide, e.g., silicon oxide, and thus may be merged with the second insulating interlayer pattern 230 and/or the uppermost one of the insulation patterns 215.

Figure 8:
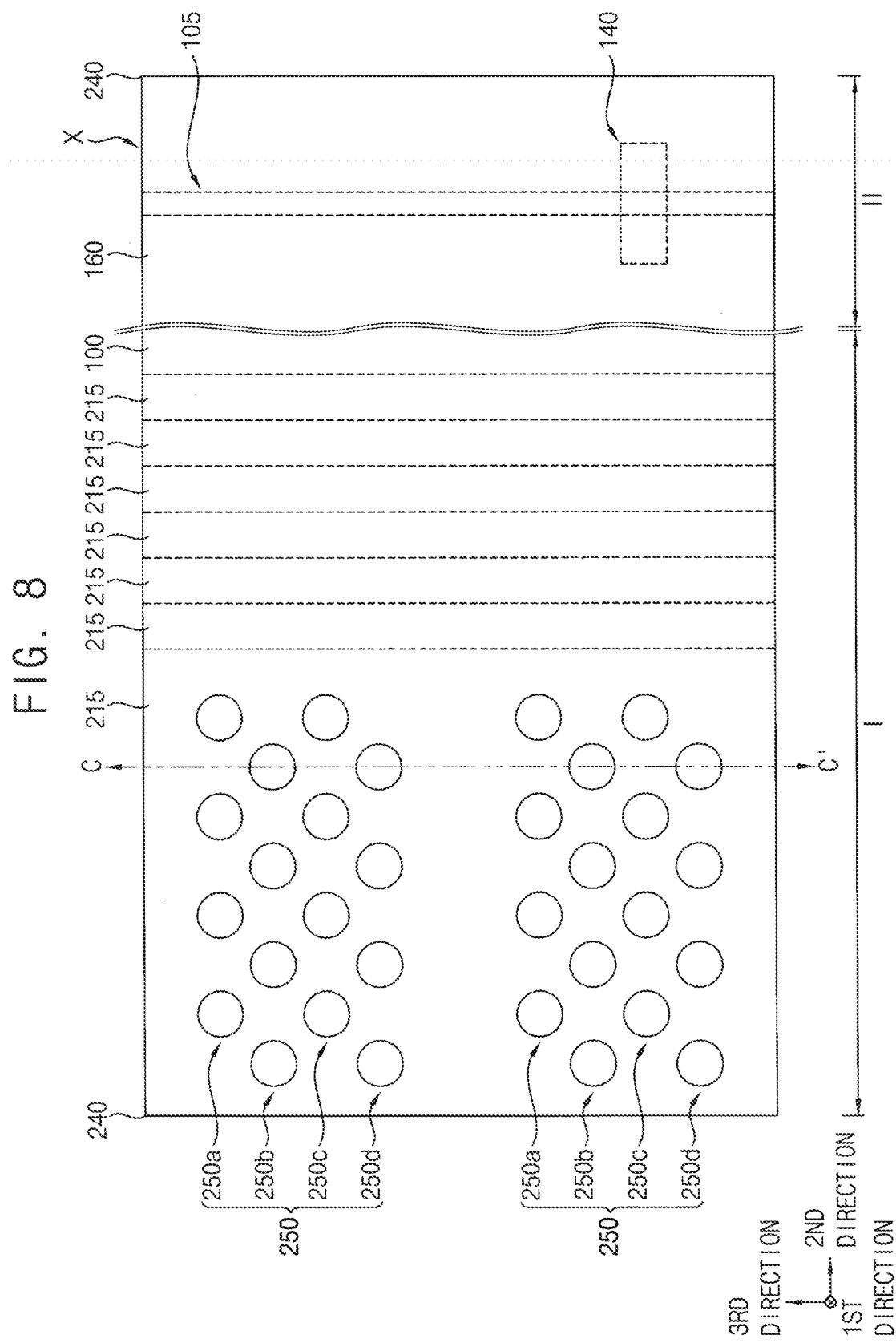
Figure 9:
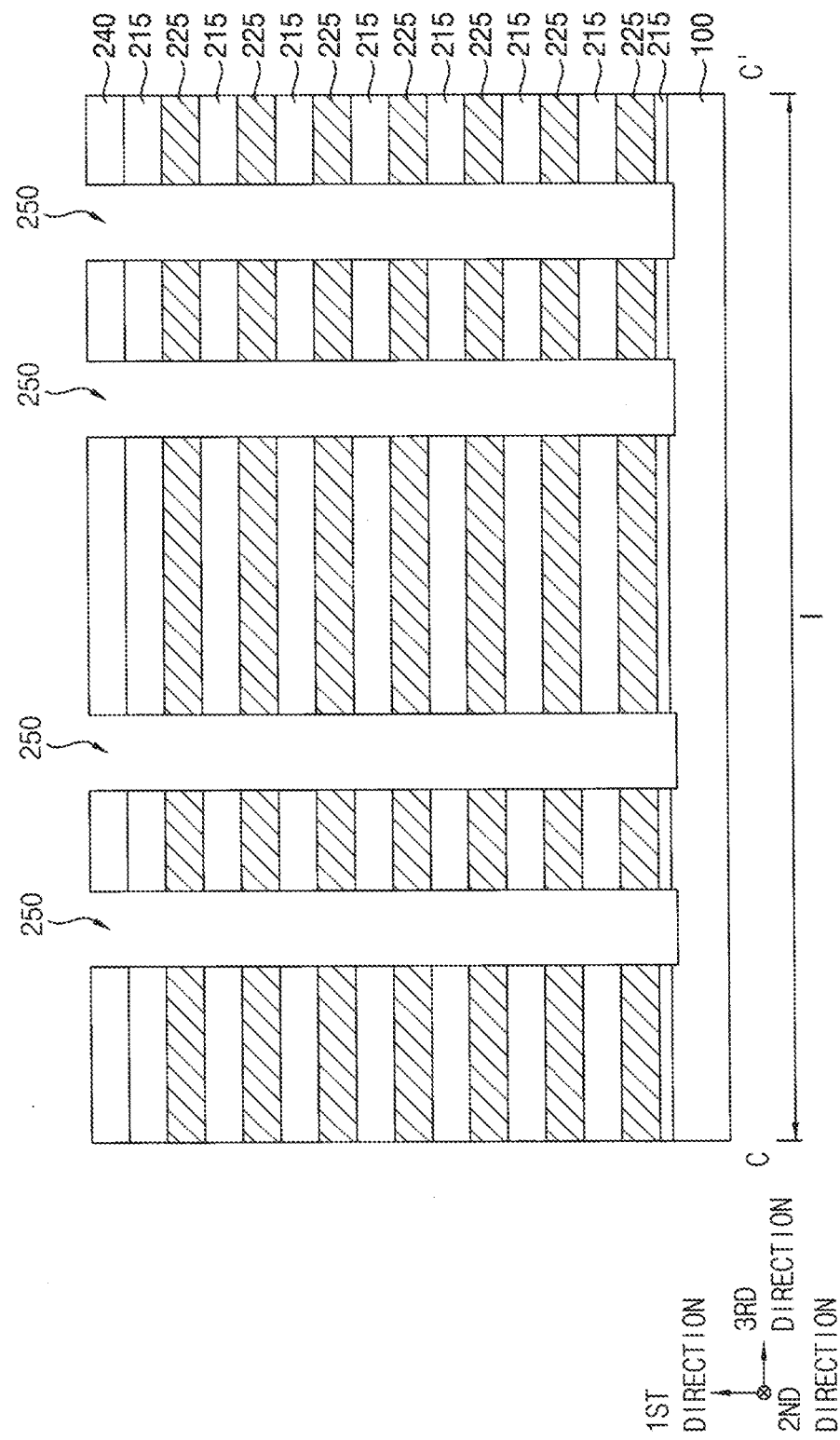

Referring to FIGS. 8 and 9, a first mask (not shown) may be formed on the third insulating interlayer 240, and the third insulating interlayer 240, the insulation patterns 215 and the sacrificial patterns 225 may be etched using the first mask as an etching mask to form a channel hole 250 therethrough exposing an upper surface of the first region I of the substrate 100.

A plurality of channel holes 250 may be formed in each of the second and third directions to define a channel hole array. In some example embodiments, the channel hole array may include a first channel hole column 250a including a plurality of first channel holes disposed in the second direction, and a second channel hole column 250b including a plurality of second channel holes disposed in the second direction, which may be spaced apart from the first channel hole column 250a in the third direction. The first channel holes may be disposed at acute angles from the second channel holes with the second direction or the third direction. Thus, the first and second channel holes may be arranged in a zigzag layout in the second direction so as to be densely formed in a unit area.

The first and second channel hole columns 250a and 250b may be disposed alternately and repeatedly in the third direction. In some example embodiments, the first and second channel hole columns 250a and 250b may be disposed in the third direction twice to form a channel hole group including four channel hole columns.

Hereinafter, the four channel hole columns in each channel hole group may be referred to as first, second, third and fourth channel hole columns 250a, 250b, 250c and 250d in this order. That is, FIG. 8 shows two channel hole groups spaced apart from each other in the third direction, and each channel hole group includes the first, second, third and fourth channel hole columns 250a, 250b, 250c and 250d disposed in the third direction.

However, the number of the channel columns in each channel group may not be limited thereto.

The channel hole 250 may have a shape of a circle in a plan view, however, inventive concepts may not be limited thereto. For example, the channel hole 250 may have a shape of an ellipse, a rectangle, a square, etc., in a plan view.

Figure 10:
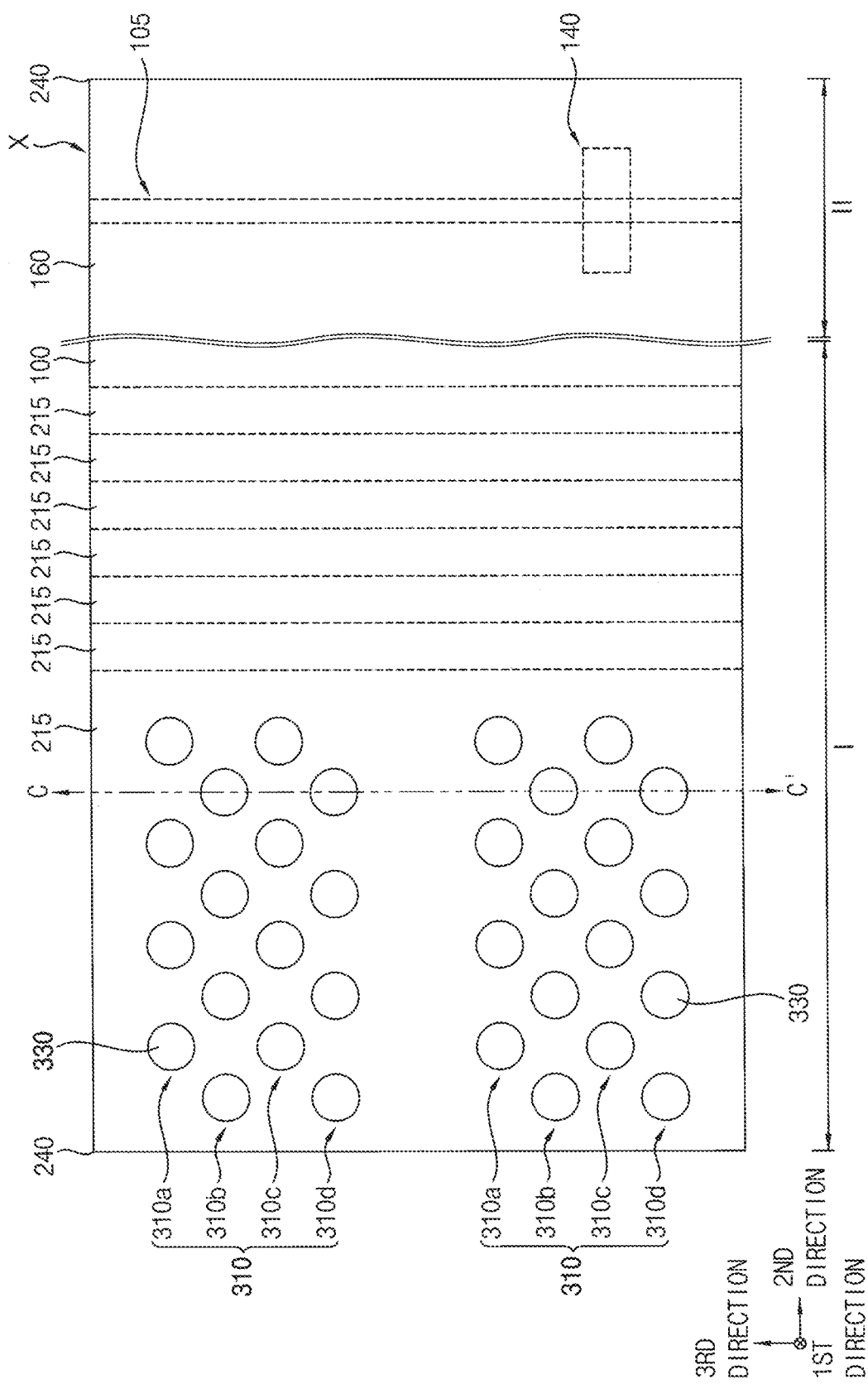
Figure 11:
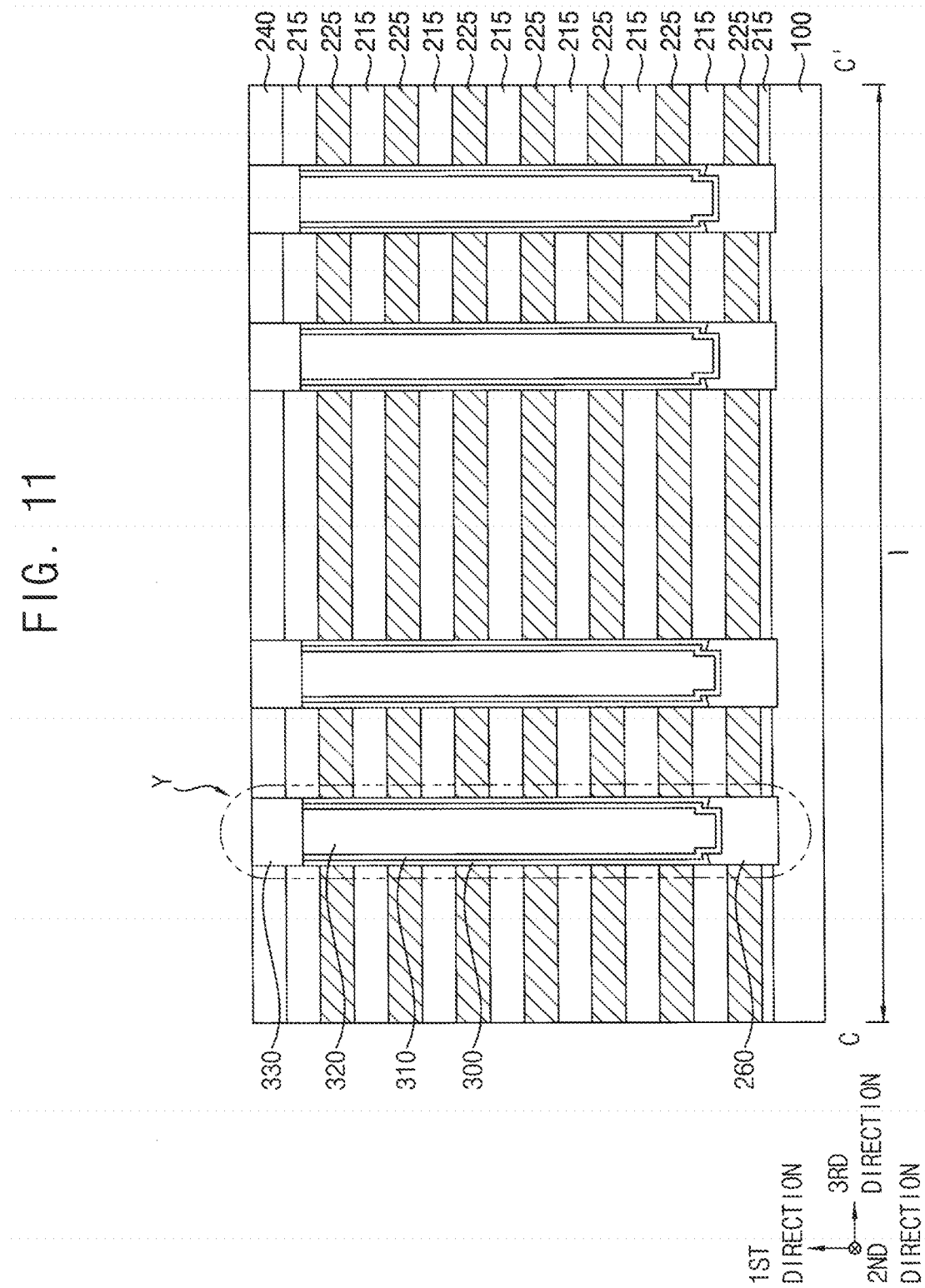
Figure 12:
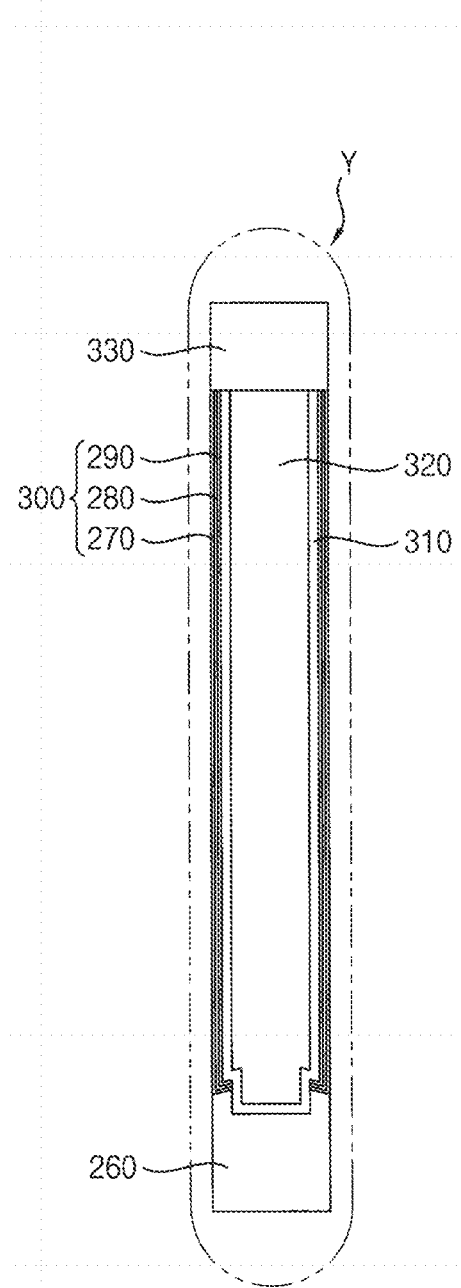

Referring to FIGS. 10 to 12, after removing the first mask, a semiconductor pattern 260 may be formed to partially fill each channel hole 250.

Particularly, a selective epitaxial growth (SEG) process may be performed using the exposed upper surface of the substrate 100 as a seed to form the semiconductor pattern 260 partially filling each of the channel holes 250. Thus, the semiconductor pattern 260 may be formed to include single crystalline silicon or single crystalline germanium according to the material of the substrate 100, and in some cases, impurities may be doped thereinto.

Alternatively, an amorphous silicon layer may be formed to fill the channel holes 250, and a laser epitaxial growth (LEG) process or a solid phase epitaxy (SPE) process may be performed on the amorphous silicon layer to form the semiconductor pattern 260.

In some example embodiments, the semiconductor pattern 260 may be formed such that an upper surface of the semiconductor pattern 260 may be located between a top and a bottom of one of the insulation patterns 215 at a second level from an upper surface of the substrate 100 in the first direction.

The semiconductor pattern 260 may serve as a channel 310 subsequently formed, and thus may be referred to as a lower channel.

A first blocking layer, a charge storage layer, a tunnel insulation layer, and a first spacer layer (not shown) may be sequentially formed on sidewalls of the channel holes 250, an upper surface of the semiconductor pattern 260, and an upper surface of the third insulating interlayer 240, the first spacer layer may be anisotropically etched to form a first spacer (not shown) on sidewalls of the channel holes 250, and the tunnel insulation layer, the charge storage layer and the first blocking layer may be etched using the first spacer as an etching mask to form a tunnel insulation pattern 290, a charge storage pattern 280, and a first blocking pattern 270, respectively, on the semiconductor pattern 260 and the sidewalls of the channel holes 250. Each of the tunnel insulation pattern 290, the charge storage pattern 280, and the first blocking pattern 270 may have a cup-like shape of which a central bottom is open. An upper portion of the semiconductor pattern 260 may be also removed. The tunnel insulation pattern 290, the charge storage pattern 280, and the first blocking pattern 270 may form a charge storage structure 300.

The first blocking layer may be formed of an oxide, e.g., silicon oxide, the charge storage layer may be formed of a nitride, e.g., silicon nitride, the tunnel insulation layer may be formed of an oxide, e.g., silicon oxide, and the first spacer layer may be formed of a nitride, e.g., silicon nitride.

After removing the first spacer, a channel layer may be formed on the exposed semiconductor pattern 260, the tunnel insulation pattern 290 and the third insulating interlayer 240, and a filling layer may be formed on the channel layer to fill a remaining portion of the channel hole 250.

The channel layer may be formed of polysilicon doped with impurities or undoped polysilicon, or amorphous silicon. When the channel layer includes amorphous silicon, a laser epitaxial growth (LEG) process or a solid phase epitaxy (SPE) process may be further performed so that the amorphous silicon may be converted into single crystalline silicon. The filling layer may be formed of an oxide, e.g., silicon oxide.

The filling layer and the channel layer may be planarized until an upper surface of the third insulating interlayer 240 may be exposed to form a filling pattern 320 filling the remaining portion of each channel hole 250, and the channel layer may be transformed into the channel 310.

Thus, the charge storage structure 300, the channel 310 and the filling pattern 320 may be sequentially stacked on the semiconductor pattern 260 in each channel hole 250. The charge storage structure 300 may have a cup-like shape of which a central bottom is open, the channel 310 may have a cup-like shape, and the filling pattern 320 may have a pillar shape.

As the channel holes 250 may define a channel hole group including the first to fourth channel hole columns 250a, 250b, 250c and 250d, and thus the channels 310 may also define a channel group and a channel array.

An upper portion of a first structure including the filling pattern 320, the channel 310 and the charge storage structure 300 may be removed to form a trench (not shown), and a capping pattern 330 may fill the trench.

Particularly, the upper portion of the first structure may be removed by an etch-back process to form the trench, a capping layer may be formed on the first structure and the third insulating interlayer 240 to fill the trench, and an upper portion of the capping layer may be planarized until the upper surface of the third insulating interlayer 240 may be exposed to form the capping pattern 330. In some example embodiments, the capping layer may be formed of undoped or doped polysilicon or amorphous silicon, and when the capping layer includes amorphous silicon, a crystallization process may be further performed.

The first structure, the semiconductor pattern 260 and the second capping pattern 330 in each of the channel holes 250 may define a second structure.

Figure 13:
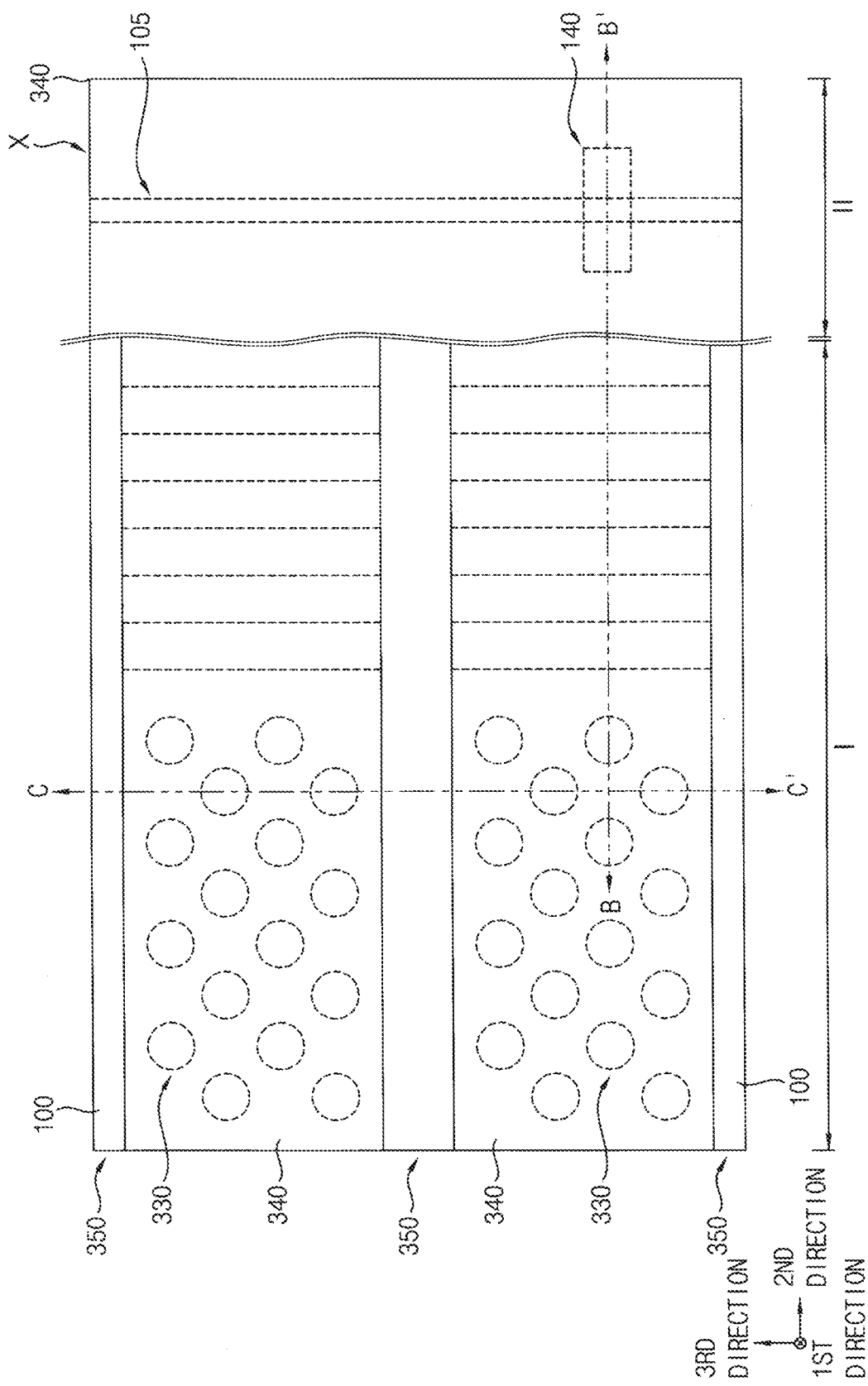
Figure 14:
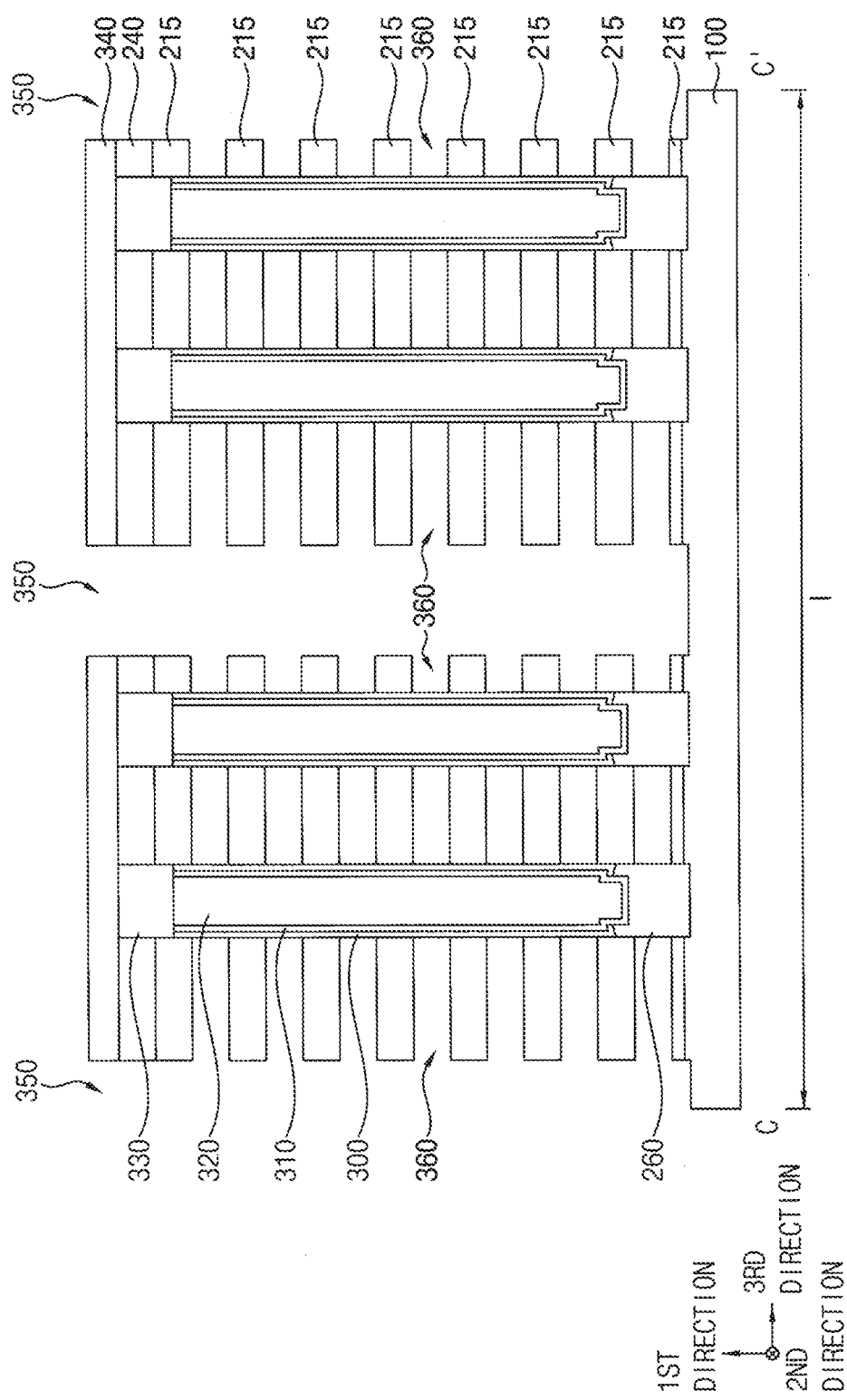

Referring to FIGS. 13 and 14, a fourth insulating interlayer 340 may be formed on the third insulating interlayer 240 and the capping pattern 330. After forming a second mask (not shown) on the fourth insulating interlayer 340, openings 350 may be formed through the third and fourth insulating interlayers 240 and 340, the insulation patterns 215 and the sacrificial patterns 225 using the second mask as an etching mask to expose an upper surface of the substrate 100. The fourth insulating interlayer 340 may be formed of an oxide, e.g., silicon oxide.

In some example embodiments, the opening 350 may extend in the second direction between the channel groups on the first region I of the substrate 100, and a plurality of openings 350 may be formed in the third direction. Thus, one channel group containing four channel columns may be formed between neighboring ones of the openings 350, however, inventive concepts may not be limited thereto. According to the number of the channel columns included in each channel group, the number of the channel columns between the neighboring ones of the openings 350 may be changed.

After removing the second mask, the sacrificial patterns 225 exposed by the openings 350 may be removed to form a gap 360 between the insulation patterns 215 at respective neighboring levels, and a portion of an outer sidewall of the first blocking pattern 270 and a portion of a sidewall of the semiconductor pattern 260 may be exposed by the gap 360. In some example embodiments, the sacrificial patterns 225 exposed by the openings 350 may be removed by, for example, a wet etch process using an etch solution including phosphoric acid and/or sulfuric acid.

Figure 15:
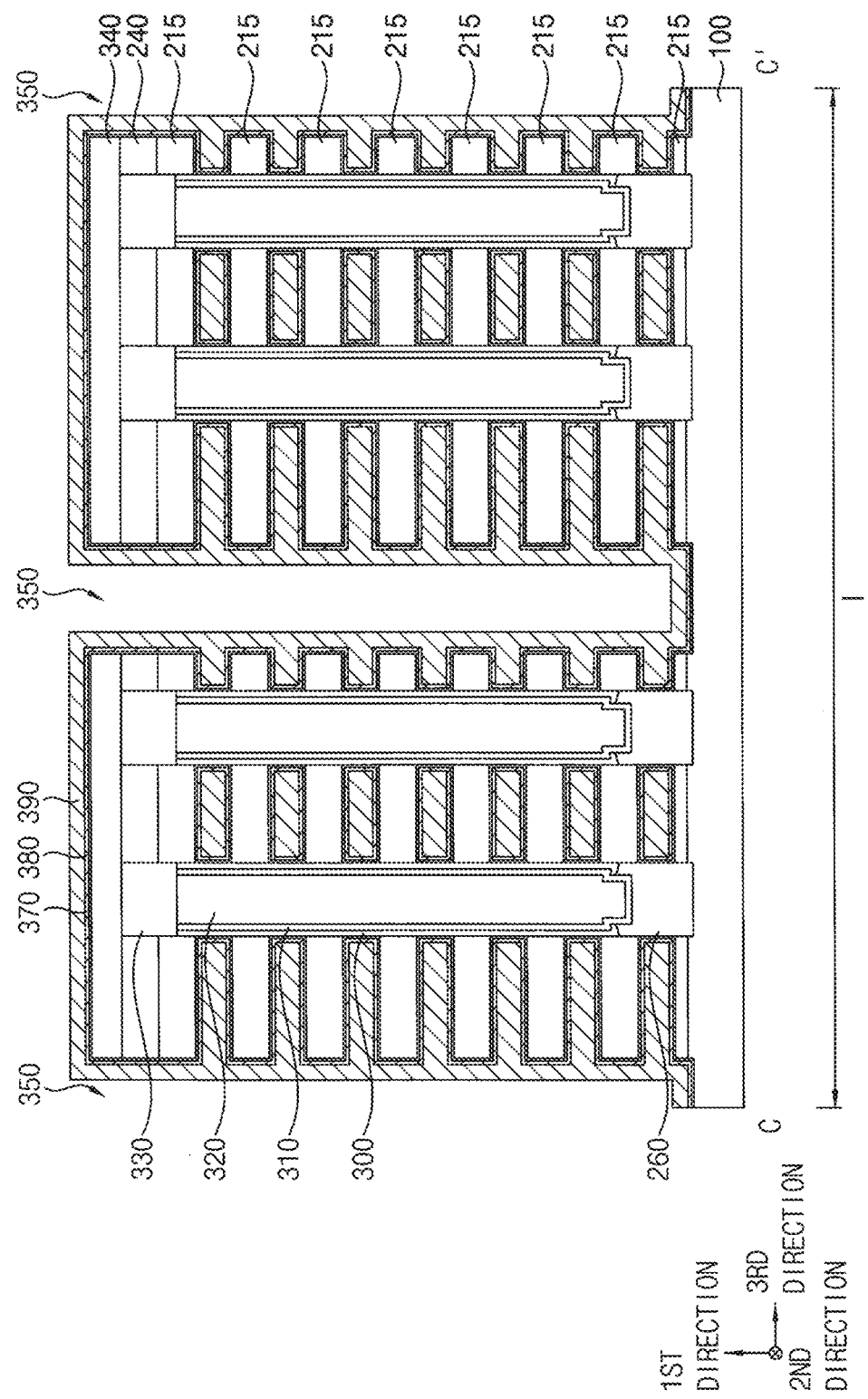

Referring to FIG. 15, a second blocking layer 370 may be formed on the exposed portion of the outer sidewall of the first blocking pattern 270, the exposed portion of the sidewall of the semiconductor pattern 360, an inner wall of the gap 360, surfaces of the insulation patterns 215, the exposed upper surface of the substrate 100 and an upper surface of the fourth insulating interlayer 340, a gate barrier layer 380 may be formed on the second blocking layer 370, and a gate conductive layer 390 may be formed on the gate barrier layer 380 to sufficiently fill a remaining portion of the gap 360.

The second blocking layer 370 may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide. The gate conductive layer 390 may be formed of a metal having a low resistance, e.g., tungsten, titanium, tantalum, platinum, etc., and the gate barrier layer 480 may be formed of a metal nitride, e.g., titanium nitride, tantalum nitride, etc. Alternatively, the gate barrier layer 380 may be formed to include a metal layer and a metal nitride layer sequentially stacked.

Figure 16:
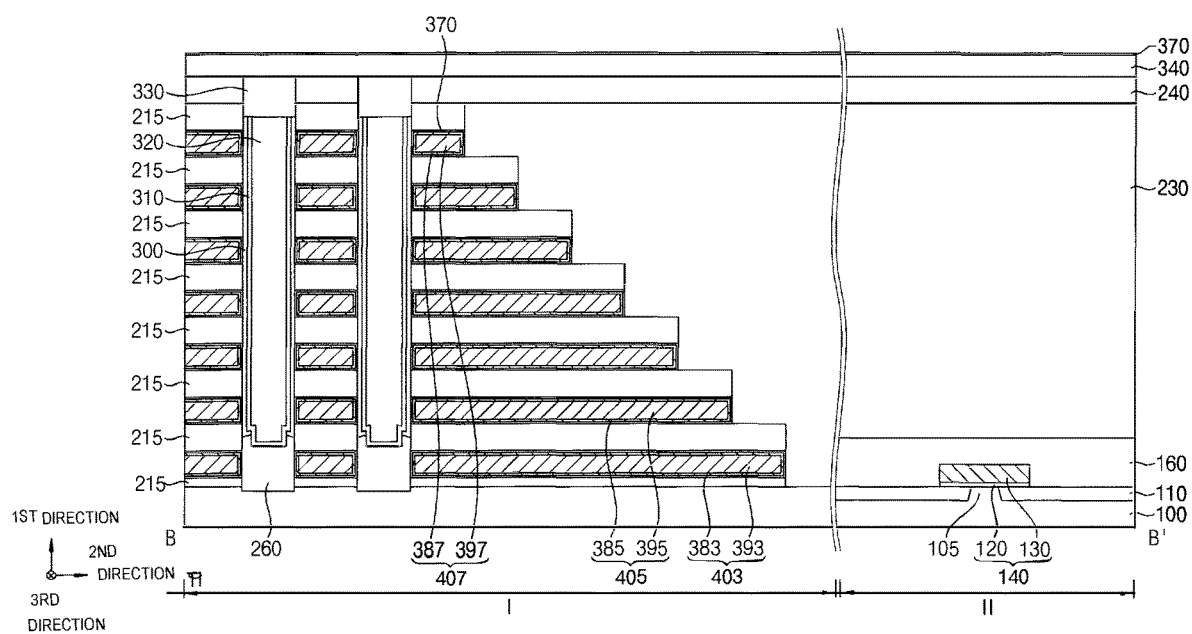
Figure 17:
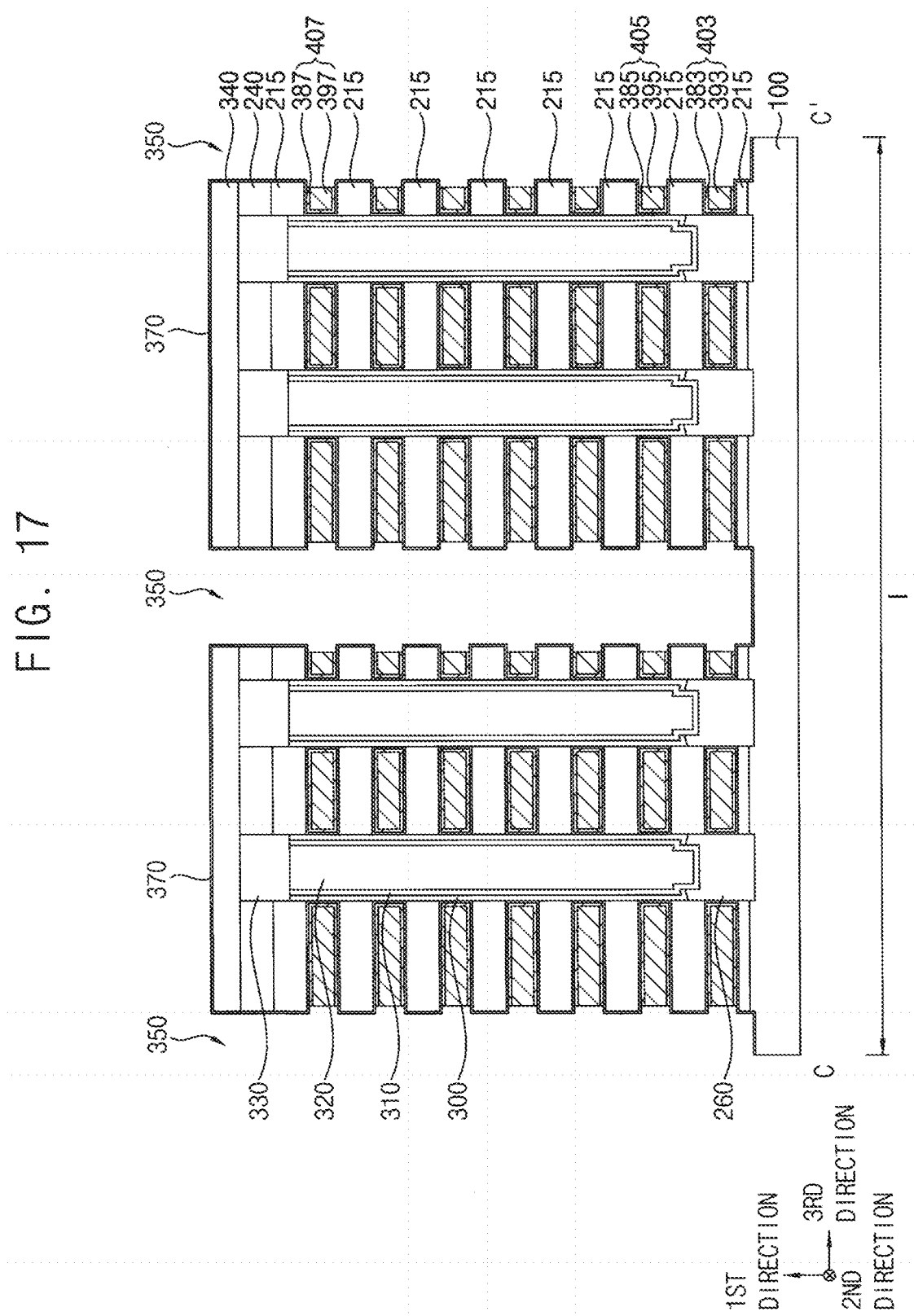

Referring to FIGS. 16 and 17, the gate conductive layer 390 and the gate barrier layer 380 may be partially removed to form a gate conductive pattern and a gate barrier pattern, respectively, in the gap 360, which may form a gate electrode. In some example embodiments, the gate conductive layer 390 and the gate barrier layer 380 may be partially removed by a wet etching process.

In some example embodiments, the gate electrode may be formed to extend in the second direction, and a plurality of gate electrodes may be formed in the third direction. That is, a plurality of gate electrodes each extending in the second direction may be spaced apart from each other by the opening 350.

An end portion of the gate electrode in the second direction may be referred to as a pad. That is, a plurality of gate electrodes may be stacked in the first direction to be spaced apart from each other, and each of the gate electrodes may extend in the second direction on the first region I of the substrate 100. Lengths of the gate electrodes in the second direction may gradually decrease from a bottom level toward a top level, and thus the gate electrodes may have a staircase shape.

The gate electrodes may include a first gate electrode 403, a second gate electrode 405, and a third gate electrode 407 sequentially stacked in the first direction. The first gate electrode 403 may serve as a ground selection line (GSL), the second gate electrode 405 may serve as a word line, and the third gate electrode 407 may serve as a string selection line (SSL). Each of the first, second and third gate electrodes 403, 405 and 407 may be formed at one level or at a plurality of levels. One or more than one dummy word lines (not shown) may be further formed between the first and second gate electrodes 403 and 405, and/or between the second and third gate electrodes 405 and 407.

In some example embodiments, the first gate electrode 403 may be formed at a lowermost level from the upper surface of the substrate 100, the third gate electrode 407 may be formed at an uppermost level and a closest level to the uppermost level thereunder from the upper surface of the substrate 100, and the second gate electrode 405 may be formed at even numbers of levels between the first and third gate electrodes 405 and 407. Thus, the first gate electrode 403 may be close to a semiconductor pattern 260, and each of the second and third gate electrodes 405 and 407 may be close to the channel 310.

The first gate electrode 403 may include a first gate conductive pattern 393, and a first gate barrier pattern 383 covering a top, a bottom, and a portion of a sidewall of the first gate conductive pattern 393. The second gate electrode 405 may include a second gate conductive pattern 395, and a second gate barrier pattern 385 covering a top, a bottom, and a portion of a sidewall of the second gate conductive pattern 395. The third gate electrode 407 may include a third gate conductive pattern 397, and a third gate barrier pattern 387 covering a top, a bottom, and a portion of a sidewall of the third gate conductive pattern 397.

FIG. 17 shows the second blocking layer 370 is not partially removed but extends in the first direction, however, inventive concepts may not be limited thereto. That is, the second blocking layer 370 may be partially removed to form a second blocking pattern only on the inner walls of the gaps 360.

Figure 18:
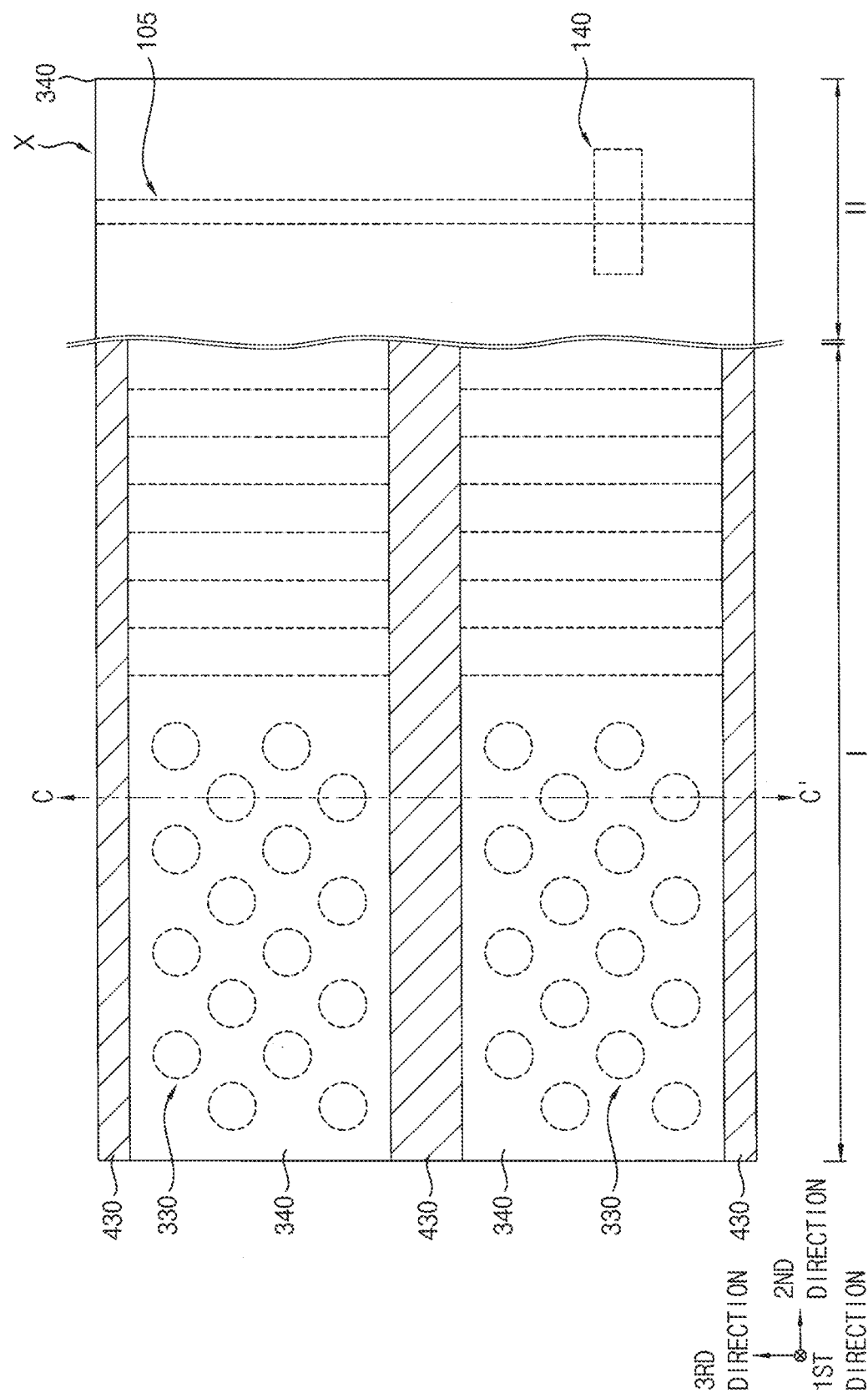
Figure 19:
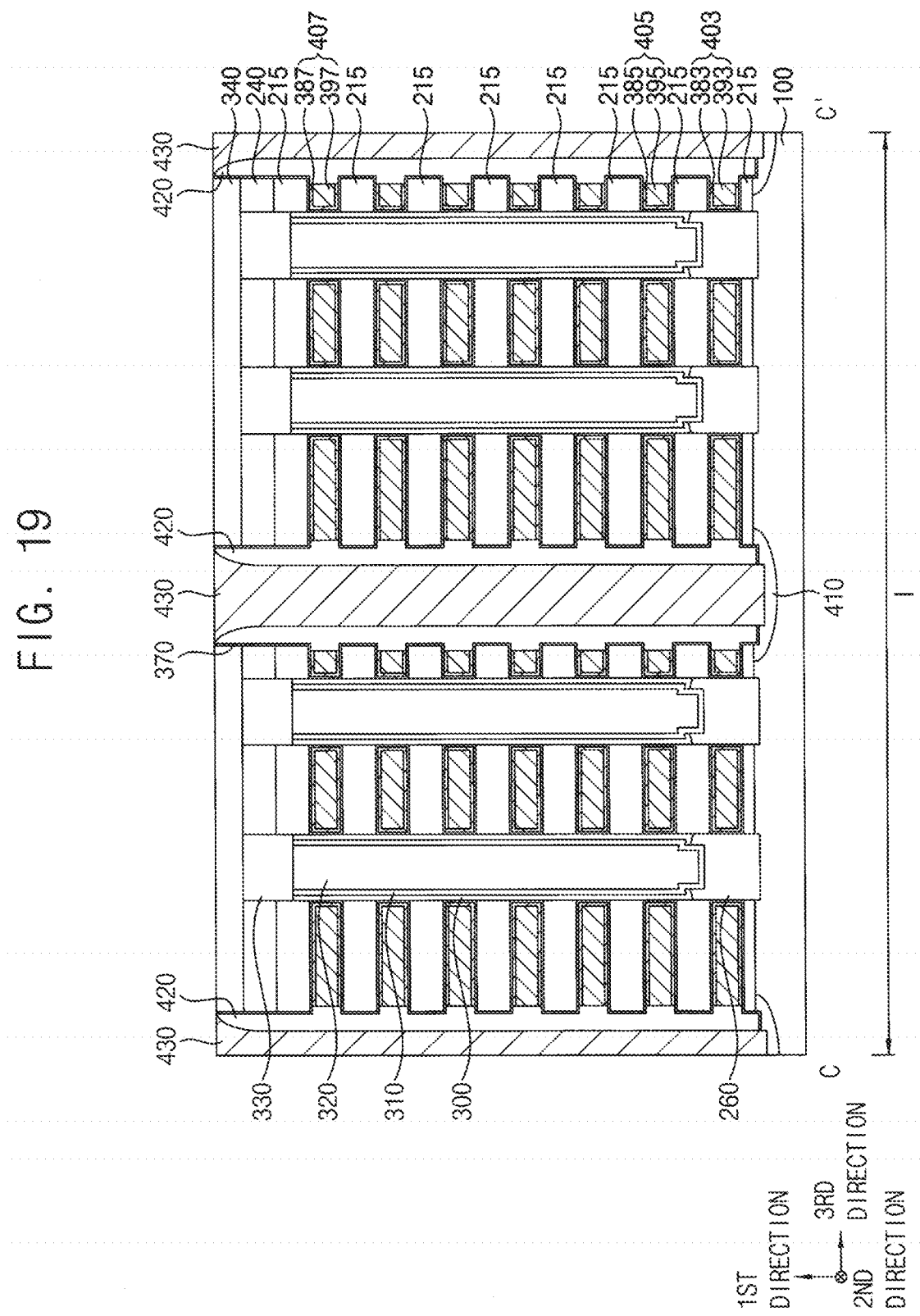

Referring to FIGS. 18 and 19, impurities may be implanted into the exposed upper surface of the substrate 100 by the opening 350 to form a fifth impurity region 410. In some example embodiments, the impurities may include n-type impurities, for example, phosphorus and/or arsenic.

A second spacer layer may be formed on the exposed upper surface of the substrate 100 by the opening 350, a sidewall of the opening 350, and an upper surface of the fourth insulating interlayer 340, and may be anisotropically etched to form a second spacer 420 on the sidewall of the opening 350. Accordingly, the fifth impurity region 410 at an upper portion of the substrate 100 may be partially exposed. The second spacer layer may be formed of an oxide, e.g., silicon oxide.

A common source line (CSL) 430 may be formed on the exposed fifth impurity region 410 to fill a remaining portion of the opening 350.

In some example embodiments, a conductive layer may be formed on the exposed fifth impurity region 410, the second spacer 420 and the fourth insulating interlayer 340 to fill the opening 350, and may be planarized until the upper surface of the fourth insulating interlayer 340 may be exposed to form the CSL 430. A portion of the second blocking layer 370 on the upper surface of the fourth insulating interlayer 340 may be also removed. The conductive layer may be formed of a metal, a metal nitride, and/or a metal silicide.

The CSL 430 may be formed in the opening 350 to contact the fifth impurity region 410.

Figure 20:
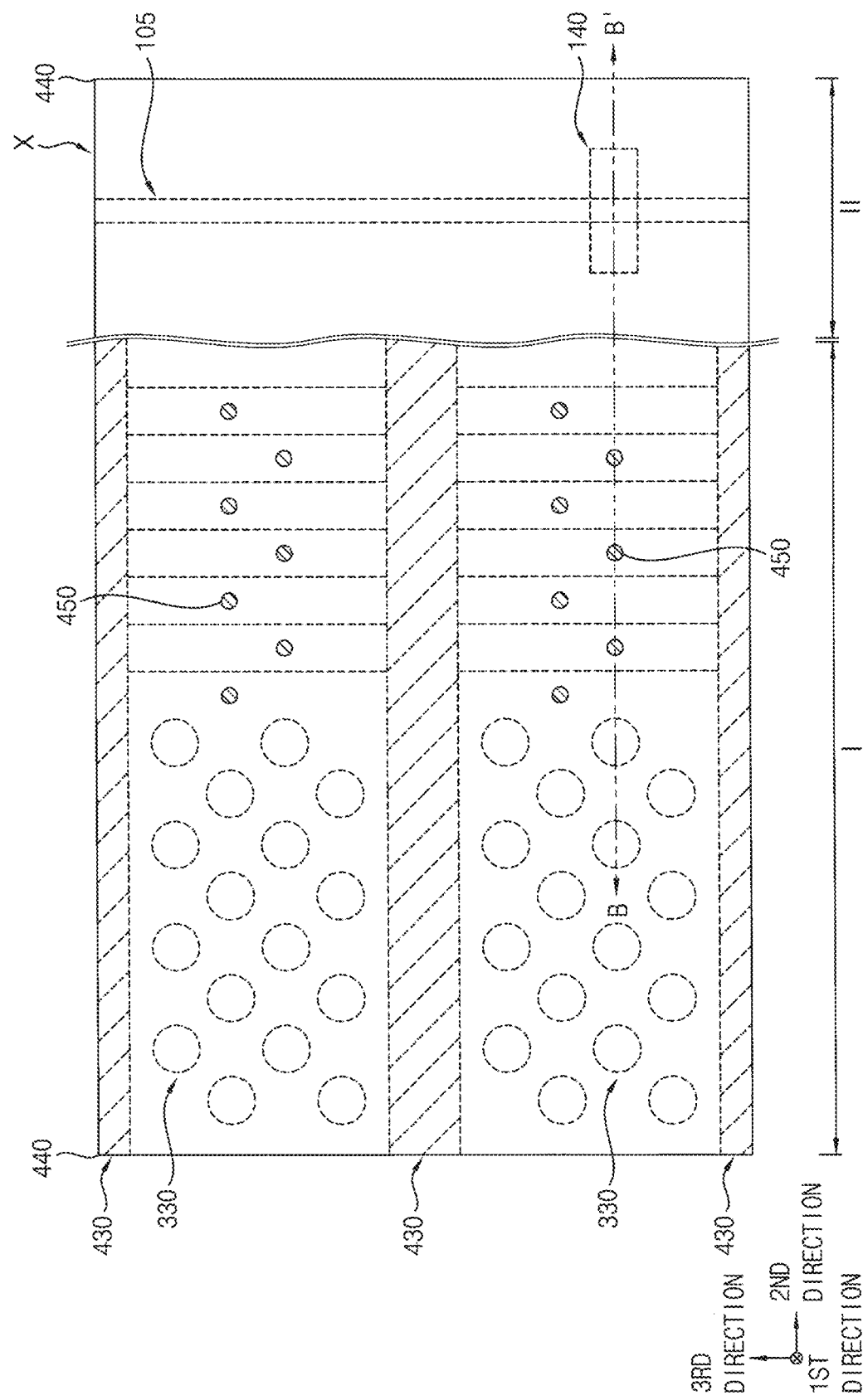
Figure 21:
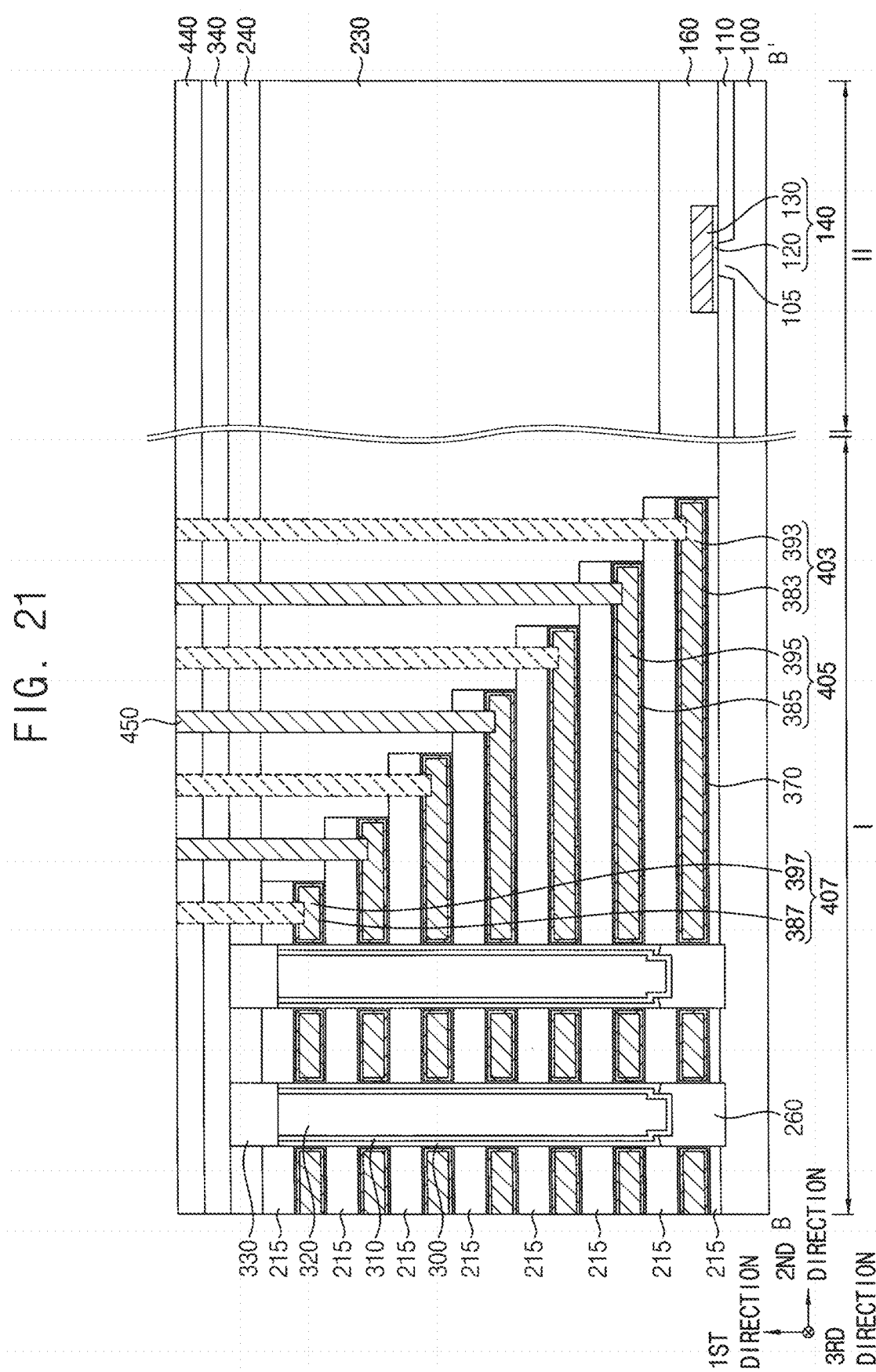

Referring to FIGS. 20 and 21, a fifth insulating interlayer 440 may be formed on the fourth insulating interlayer 430, the CSL 430, the second spacer 420 and the second blocking layer 370, and first lower contact plugs 450 may be formed through the third to fifth insulating interlayers 240, 340 and 440, the second insulating interlayer pattern 230, the insulation pattern 215, the second blocking layer 370, and the gate barrier patterns 383, 385 and 387 to contact upper surfaces of the gate conductive patterns 393, 395 and 397, respectively.

The fifth insulating interlayer 440 may be formed of an oxide, e.g., silicon oxide, and thus may be merged with the underlying fourth insulating interlayer 340. The first lower contact plugs 450 may be formed of a metal, e.g., tungsten, titanium, tantalum, copper, aluminum, etc., and/or a metal nitride, e.g., titanium nitride, tantalum nitride, tungsten nitride, etc.

The first lower contact plugs 450 may be formed by forming first contact holes (not shown) through the third to fifth insulating interlayers 240, 340 and 440, the second insulating interlayer pattern 230, the insulation pattern 215, the second blocking layer 370, and the gate barrier patterns 383, 385 and 387 to expose the upper surfaces of the gate conductive patterns 393, 395 and 397, respectively, forming a conductive layer on the exposed upper surfaces of the gate conductive patterns 393, 395 and 397 and an upper surface of the fifth insulating interlayer 440 to fill the contact holes, and planarizing the conductive layer until the upper surface of the fifth insulating interlayer 440 may be exposed.

The first lower contact plugs 450 may be formed on the pads, respectively, of the staircase shape. Each of the first lower contact plugs 450 may be formed on a portion of each of the pads not covered by upper ones of the pads.

In some example embodiments, the first lower contact plugs 450 may be formed in a zigzag layout along the second direction in each channel group, in a plan view. Alternatively, the first lower contact plugs 450 may be formed linearly along the second direction in each channel group.

Figure 22:
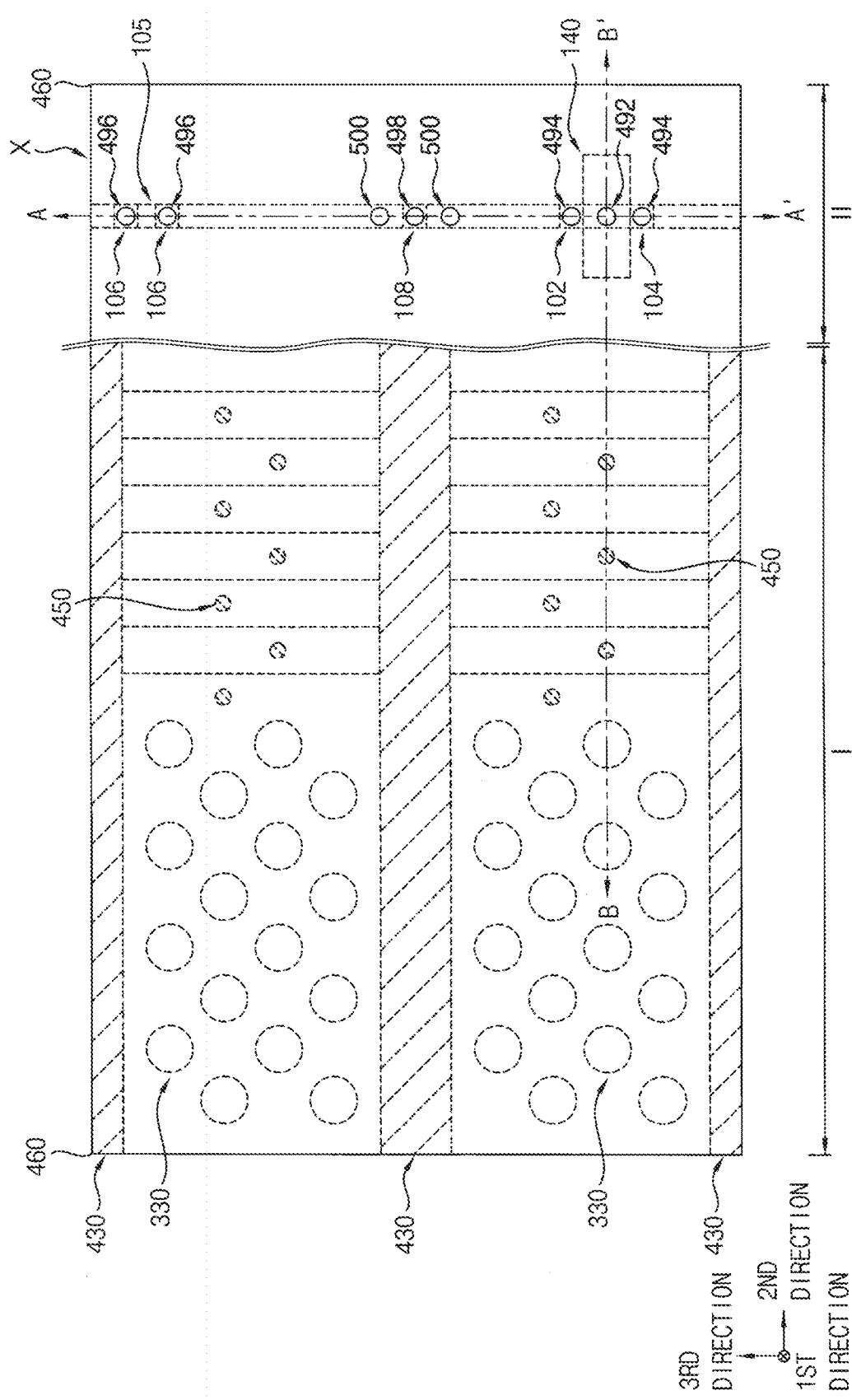
Figure 23:
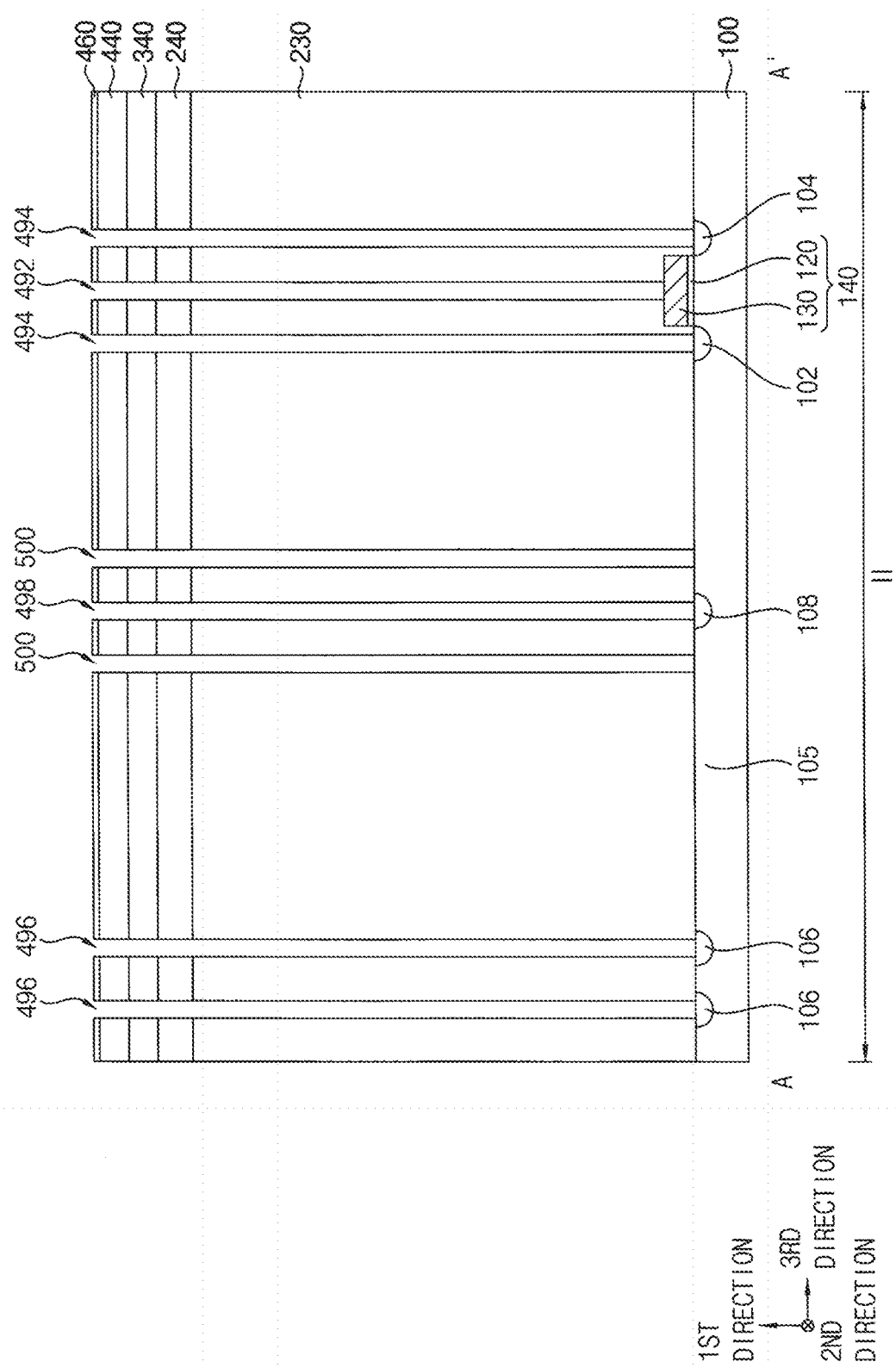
Figure 24:
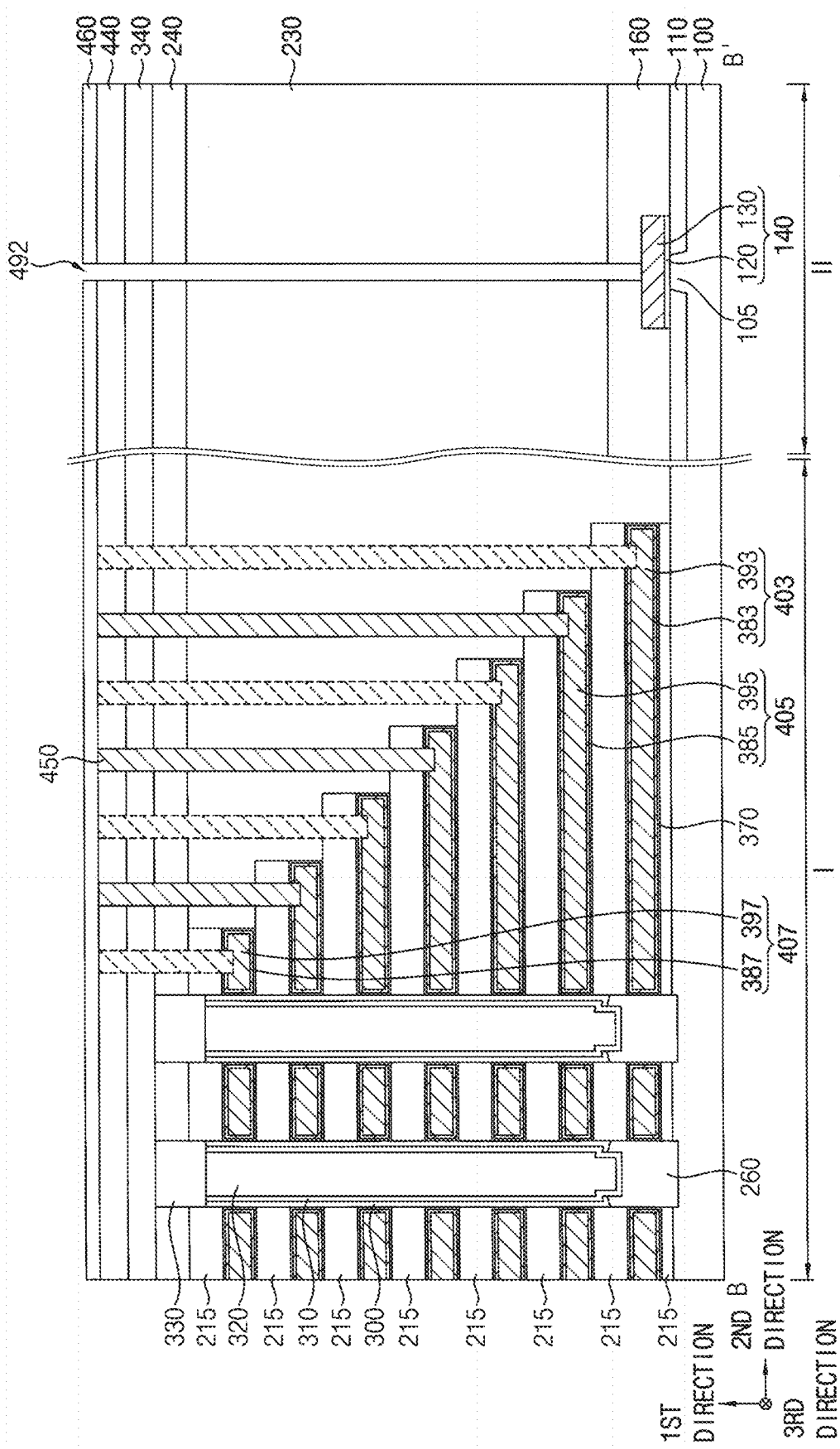

Referring to FIGS. 22 to 24, a sixth insulating interlayer 460 may be formed on the fifth insulating interlayer 440 and the first lower contact plugs 450, a third mask (not shown) may be formed on the sixth insulating interlayer 460, and the third to sixth insulating interlayers 240, 340, 440 and 460, the second insulating interlayer pattern 230, and the first insulating interlayer 160 may be etched using the third mask as an etching mask to form second to sixth contact holes 492, 494, 496, 498 and 500 therethrough. The sixth insulating interlayer 460 may be formed of an oxide, e.g., silicon oxide, and thus may be merged with the underlying fifth insulating interlayer 440.

In some example embodiments, the second contact hole 492 may expose an upper surface of the first gate structure 140, the third contact hole 494 may expose upper surfaces of the first and second impurity regions 102 and 104 adjacent the first gate structure 140, the fourth contact hole 496 may expose an upper surface of the third impurity region 106, the fifth contact hole 498 may expose an upper surface of the fourth impurity region 108, and the sixth contact hole 500 may expose a portion of the first active region 105 adjacent the fourth impurity region 108.

A plurality of second and third contact holes 492 and 494 may be formed to be adjacent to each other, and a plurality of fourth contact holes 496 may be formed to adjacent to each other. However, the fifth contact hole 498 may be formed to be relatively far from the second to fourth contact holes 492, 494 and 496.

In some example embodiments, one or a plurality of sixth contact holes 500 may be further formed to be adjacent the fifth contact hole 498. Thus, even if the fifth contact hole 498 is formed under a relatively isolated environment, the sixth contact hole 500 may be further formed adjacent the fifth contact hole 498, so that the fifth and sixth contact holes 498 and 500 as a whole may not have such a low density when compared to that of the second and third contact holes 492 and 494 or the fourth contact holes 496. Accordingly, the etching process for forming the fifth contact hole 498 may be easily performed to expose the upper surface of the fourth impurity region 108, and the fifth contact hole 498 may have a desired size.

Contact holes having a relatively low density may have process failures, e.g., a not-open failure, or may have a size lower than a desired size when compared to contact holes having a relatively high density. In the recent vertical NAND (VNAND) flash memory device, as the number of the gate lines vertically stacked increases, the aspect ratio of the contact holes may increase, and thus the above problem may more frequently occur. However, in some example embodiments, at least one sixth contact hole 500 may be further formed adjacent the fifth contact hole 498 having a relatively low density to increase the density of the whole area in which the fifth contact hole 498 is formed, and thus the fifth contact hole 498 may have a desired size and may expose a desired portion.

FIGS. 22 to 24 show one second contact hole 492, one fifth contact hole 498, two third contact holes 494, and two fourth contact holes 496, however, inventive concepts may not be limited thereto. Any case in which the fifth contact hole 498 is formed at a density lower than that of the second and third contact holes 492 and 494 adjacent to each other, or that of the fourth contact holes 496 adjacent to each other may be included in the scope of inventive concepts.

Figure 25:
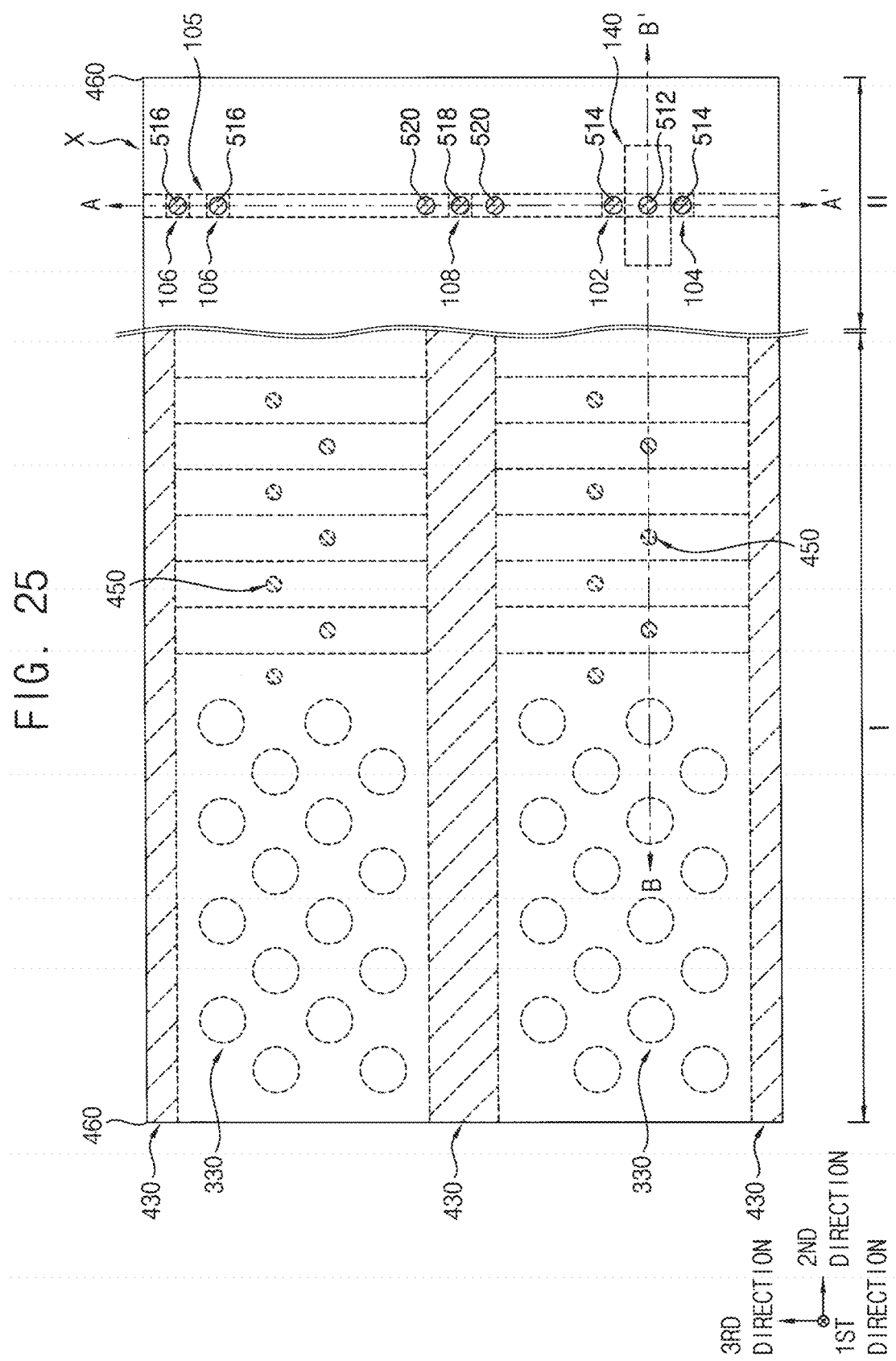
Figure 26:
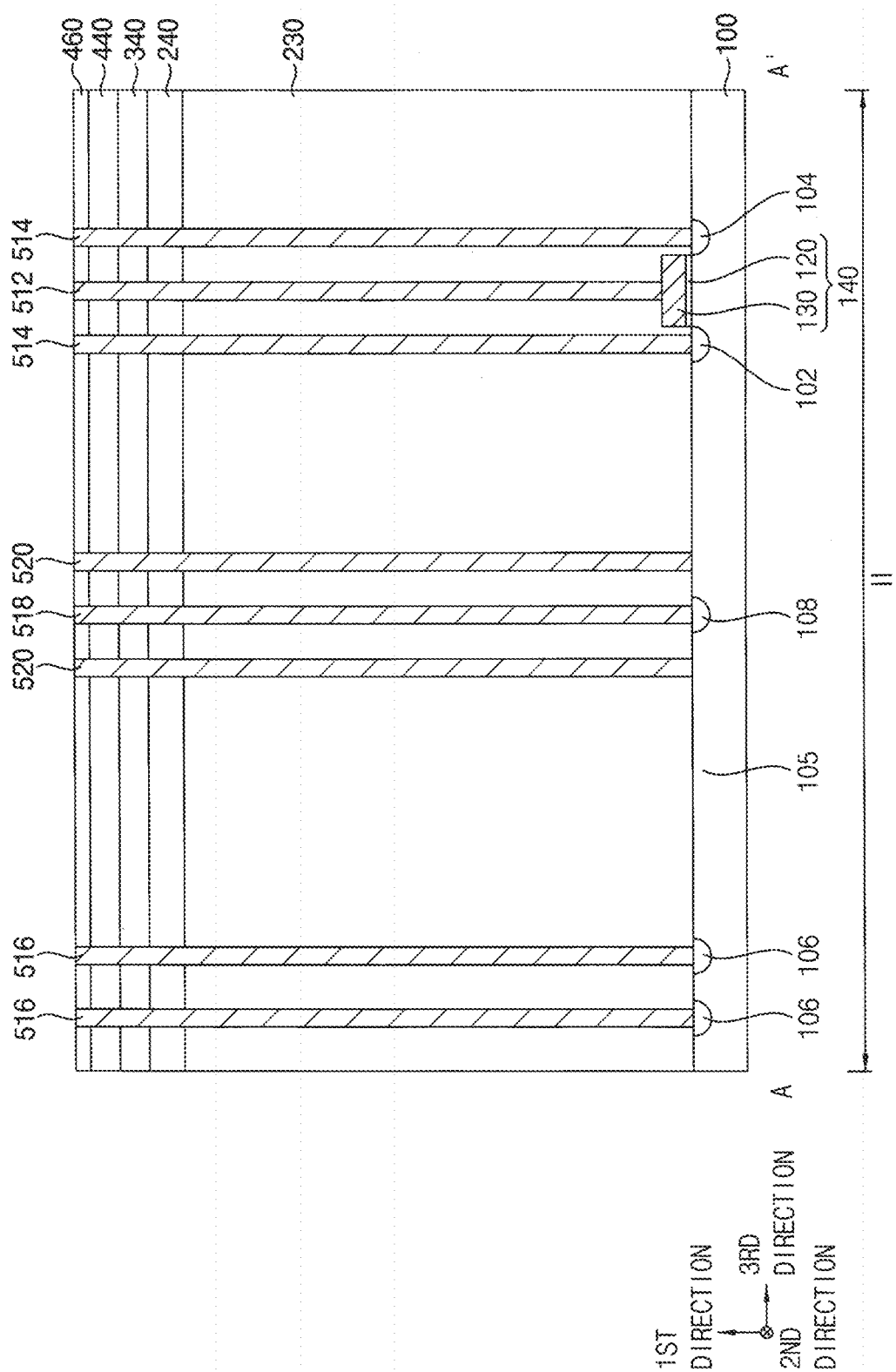
Figure 27:
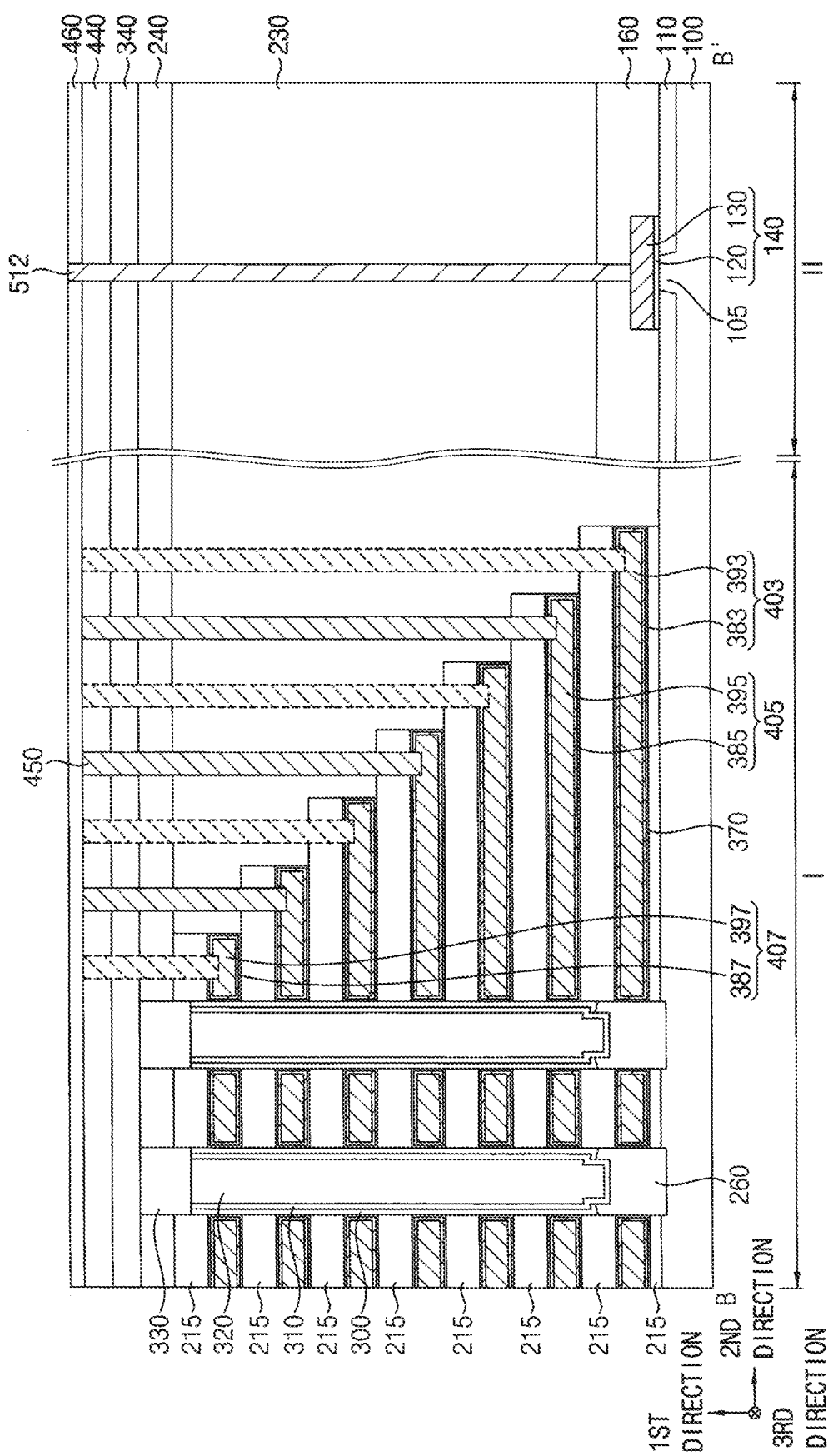

Referring to FIGS. 25 to 27, second to sixth lower contact plugs 512, 514, 516, 518 and 520 may be formed in the second to sixth contact holes 492, 494, 496, 498 and 500, respectively.

The second to sixth lower contact plugs 512, 514, 516, 518 and 520 may be formed by forming a conductive layer on the exposed upper surface of the first gate structure 140 and the first to fourth impurity regions 102, 104, 106 and 108, and an upper surface of the sixth insulating interlayer 460, and planarizing the conductive layer until the upper surface of the sixth insulating interlayer 460 may be exposed. The second to sixth lower contact plugs 512, 514, 516, 518 and 520 may be formed of a metal, e.g., tungsten, titanium, tantalum, copper, aluminum, etc., and/or a metal nitride, e.g., titanium nitride, tantalum nitride, tungsten nitride, etc.

Figure 28:
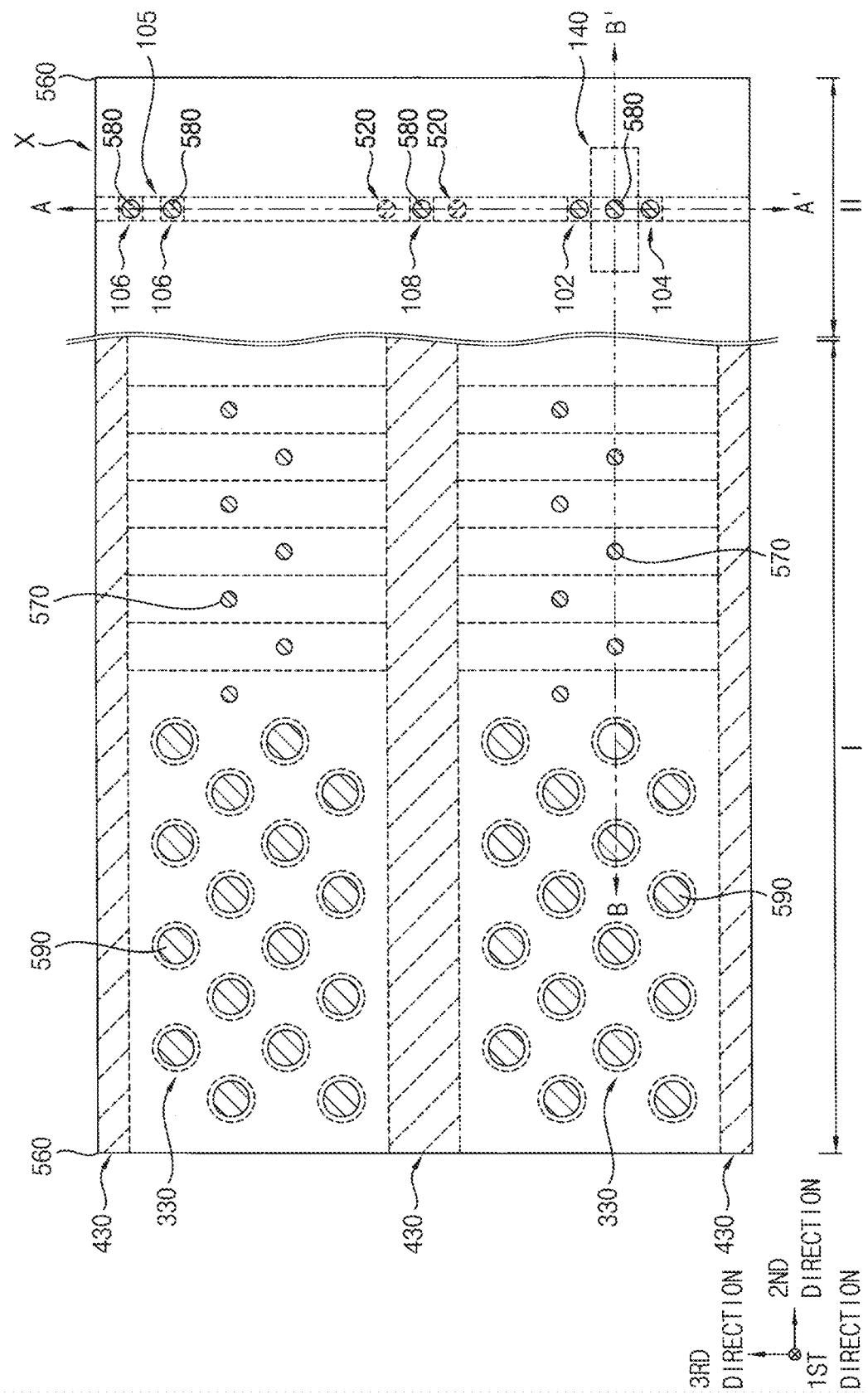
Figure 29:
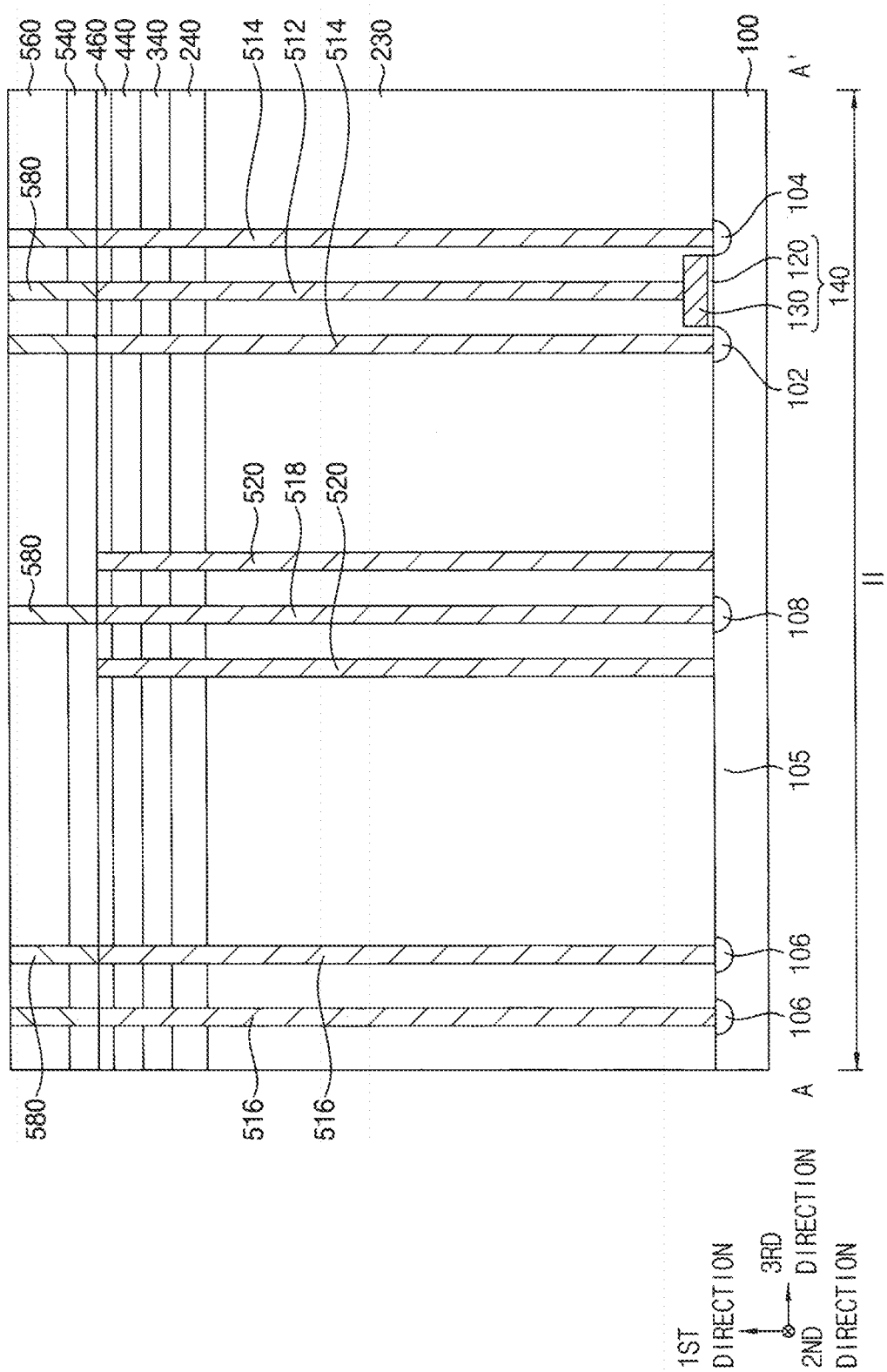
Figure 30:
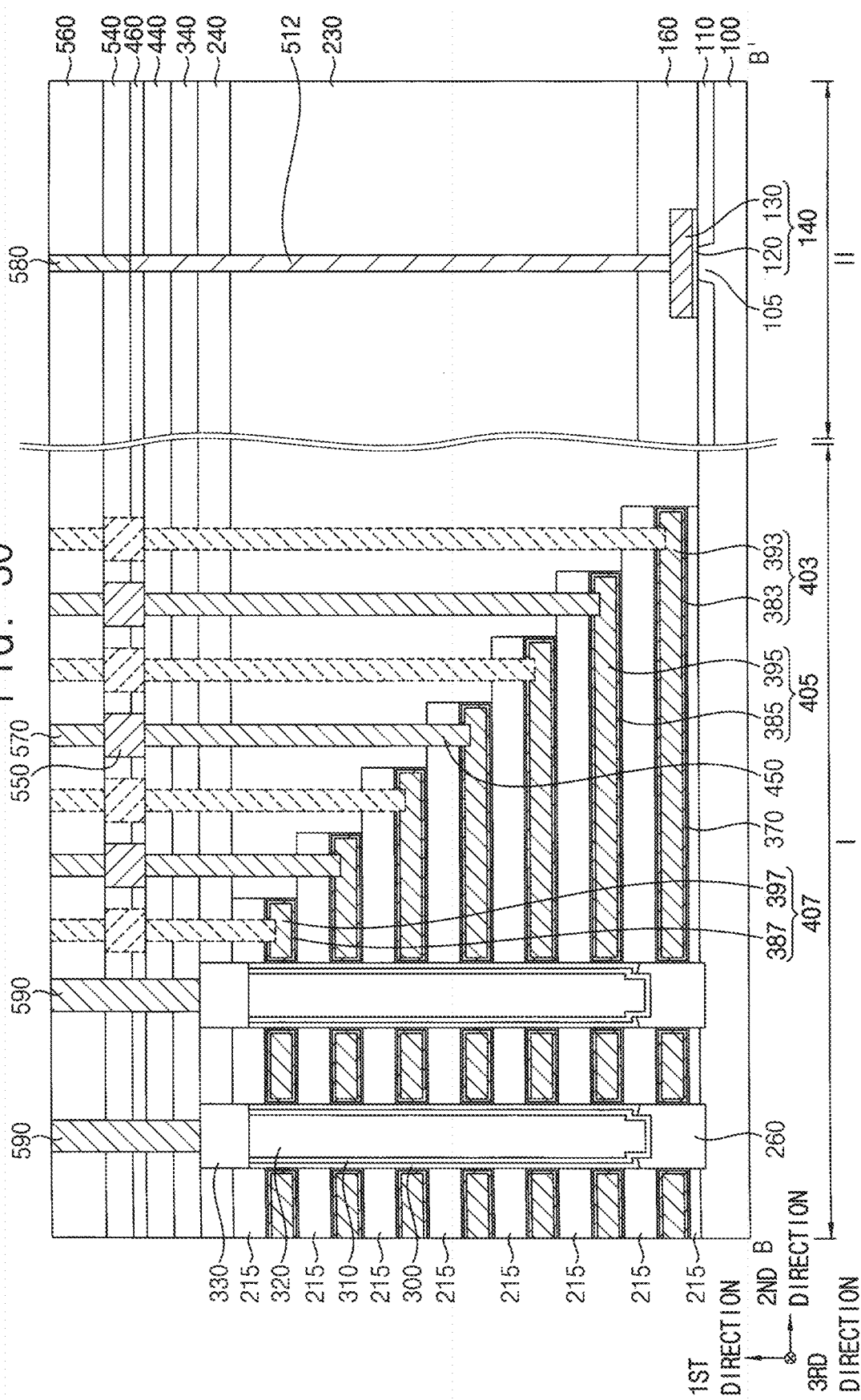
Figure 31:
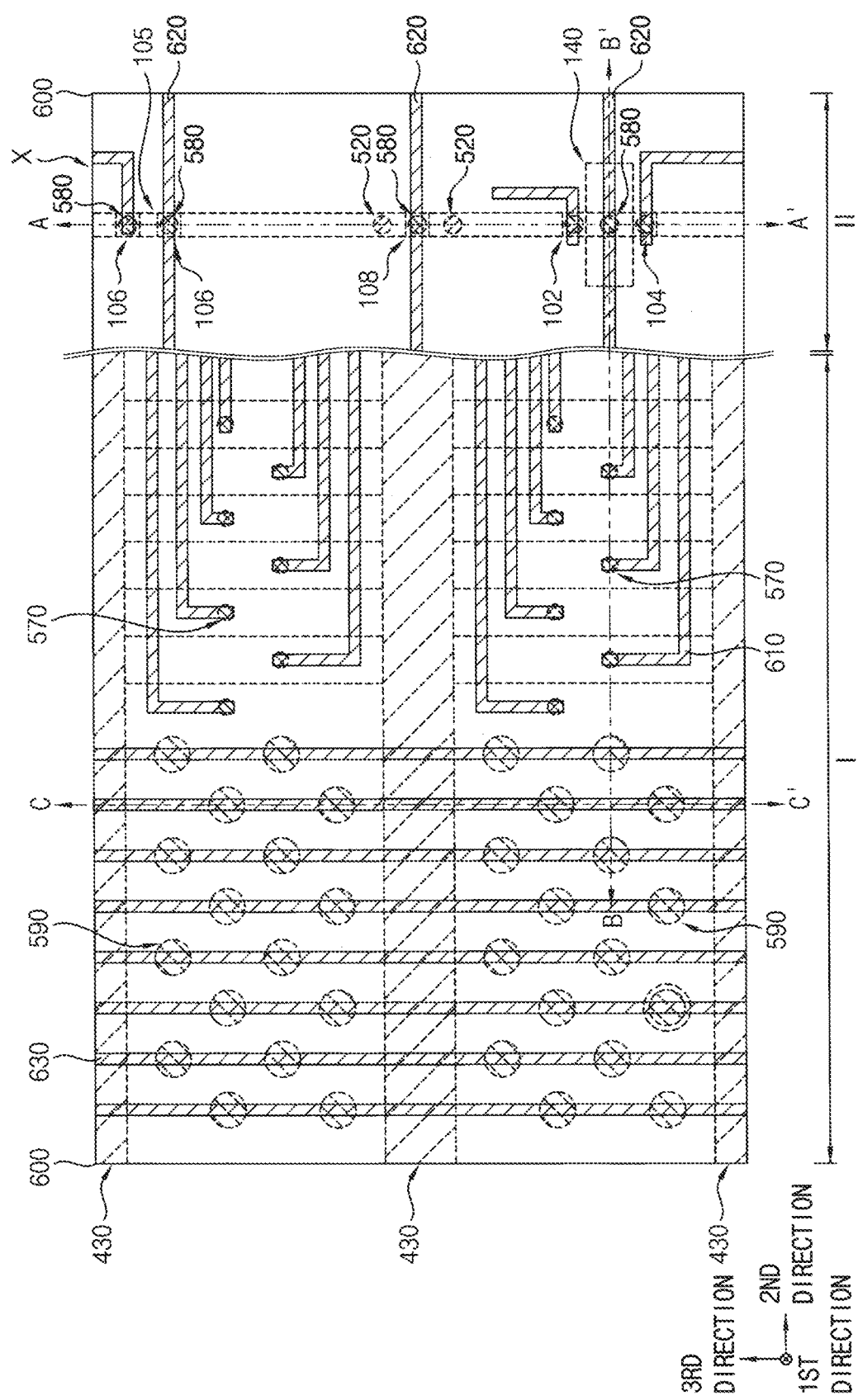
Figure 32:
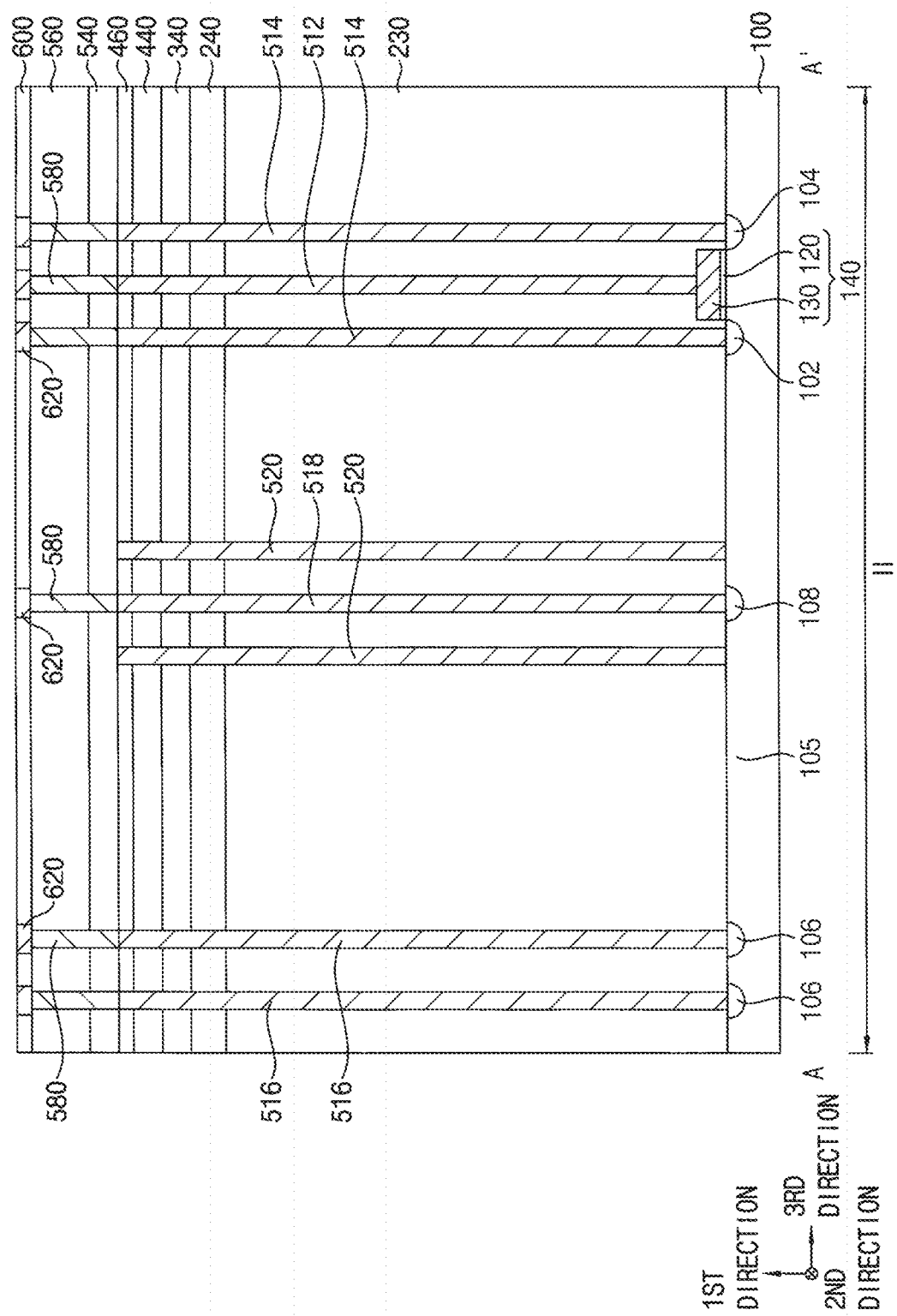
Figure 33:
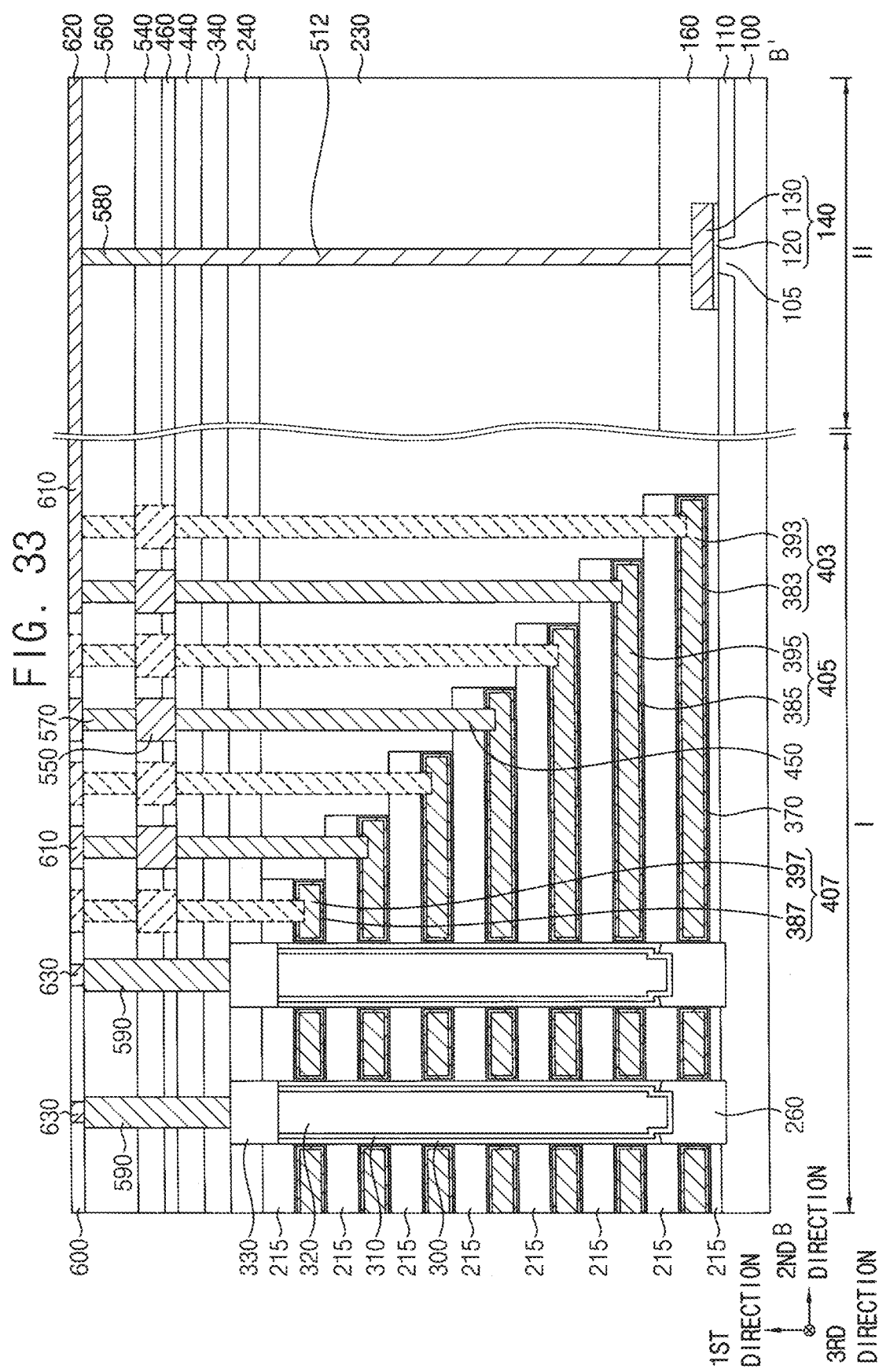
Figure 34:
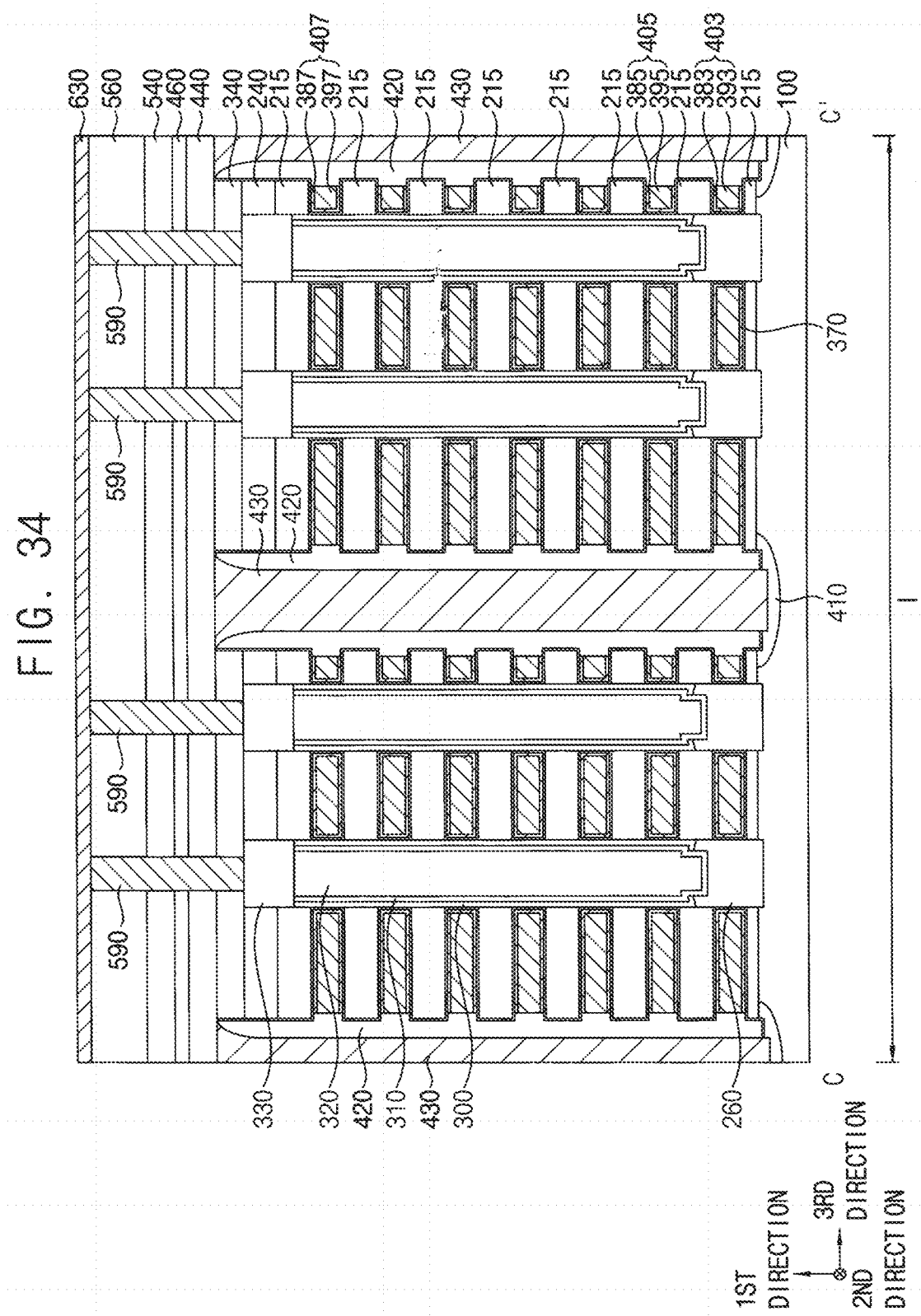

Referring to FIGS. 28 to 30, a seventh insulating interlayer 540 may be formed on the sixth insulating interlayer 460 and the second to sixth lower contact plugs 512, 514, 516, 518 and 520, and intermediate contact plugs 550 may be formed through the sixth and seventh insulating interlayers 460 and 540 to contact upper surfaces of the first lower contact plugs 450, respectively.

In some example embodiments, the intermediate contact plugs 550 may be formed on the first lower contact plugs 450 on the first region I of the substrate 100, and may not be formed on the second to sixth lower contact plugs 512, 514, 516, 518 and 520 on the second region II of the substrate 100. The intermediate contact plugs 550 may be formed on the lower contact plugs (not shown) on the third and fourth regions III and IV of the substrate 100.

An eight insulating interlayer 560 may be formed on the seventh insulating interlayer 540 and the intermediate contact plugs 550, and first to third upper contact plugs 570, 580 and 590 may be formed. Particularly, the first upper contact plug 570 may be formed through the eighth insulating interlayer 560, the second upper contact plug 580 may be formed through the seventh and eighth insulating interlayers 540 and 560, and the third upper contact plug 590 may be formed through the fourth to eighth insulating interlayers 340, 440, 460, 540 and 560.

In some example embodiments, the first upper contact plug 570 may contact upper surfaces of the intermediate contact plugs 550, the second upper contact plug 580 may contact upper surfaces of the second to fifth lower contact plugs 512, 514, 516 and 518, and the third upper contact plug 590 may contact the capping pattern 330.

The seventh and eighth insulating interlayers 540 and 560 may be formed of an oxide, e.g., silicon oxide, and thus may be merged with the underlying sixth and seventh insulating interlayers 460 and 540. The intermediate contact plugs 550 and the first to third upper contact plugs 570, 580 and 590 may be formed of a metal, e.g., tungsten, titanium, tantalum, copper, aluminum, etc. and/or a metal nitride, e.g., titanium nitride, tantalum nitride, tungsten nitride, etc.

Referring to FIGS. 31 to 34, a ninth insulating interlayer 600 may be formed on the eighth insulating interlayer 560 and the first to third upper contact plugs 570, 580 and 590, and first to third upper wirings 610, 620 and 630 may be formed through the ninth insulating interlayer 600.

The ninth insulating interlayer 600 may be formed of an oxide, e.g., silicon oxide, and thus may be merged with the underlying eighth insulating interlayer 560. The first to third upper wirings 610, 620 and 630 may be formed of a metal, e.g., tungsten, titanium, tantalum, copper, aluminum, etc. and/or a metal nitride, e.g., titanium nitride, tantalum nitride, tungsten nitride, etc.

In some example embodiments, the first upper wiring 610 may contact an upper surface of at least one of the first upper contact plug 570, the second upper wiring 620 may contact an upper surface of at least one of the second upper contact plugs 580, and the third upper wiring 630 may contact an upper surface of at least one of the third upper contact plugs 590.

The first to third upper wirings 610, 620 and 630 may have various shapes. In some example embodiments, each of the first and second upper wirings 610 and 620 may extend in each of the second and third directions, or may include first and second extension portions extending in the second and third directions, respectively, and the third upper wiring 630 may extend in the third direction.

Thus, each of the first to third upper wirings 610, 620 and 630 may provide an electrical signal. An electrical signal applied by the first upper wiring 610 may be transferred through the first upper contact plug 570, the intermediate contact plug 550 and the first lower contact plug 450 into the gate electrodes 403, 405 and 407, an electrical signal applied by the second upper wiring 620 may be transferred through the second upper contact plug 580, and the second to fifth lower contact plugs 512, 514, 516 and 518 into the first gate structure 140 or the first to fourth impurity regions 102, 104, 106 and 108, and an electrical signal applied by the third upper wiring 630 may be transferred through the third upper contact plug 590 and the capping pattern 330 into the channel 310. The third upper wiring 630 may serve as a bit line of the vertical memory device. In the figures, one third upper wiring 630 extend over each of the capping patterns 330, however, inventive concepts may not be limited thereto. For example, two third upper wirings 630 may extend over each of the capping patterns 330.

In some example embodiments, no upper wirings may be connected to the sixth lower contact plug 520 adjacent the fifth lower contact plug 518, and thus no signals may be applied thereto. That is, the sixth lower contact plug 520 may be formed in order that the fifth lower contact plug 518 having a relatively lower density may be in good contact with the fourth impurity region 108 and have a desired size, and thus a signal need not to be applied to the sixth lower contact plug 520. Accordingly, no upper contact plugs or upper wirings need to be connected to the sixth lower contact plug 520, and may be referred to as a dummy lower contact plug.

As illustrated above, in the method of manufacturing the vertical memory device in some example embodiments, the at least one sixth lower contact plug 520 may be further formed to be adjacent the fifth lower contact plug 518 having a relatively low density on the second region II of the substrate 100 so that the fifth lower contact plug 518 may contact the target structure well and have a desired size. Accordingly, the vertical memory device including the fifth lower contact plug 518 may have improved electrical characteristics.

The dummy lower contact plug may have various shapes, locations and numbers, which will be illustrated hereinafter. Vertical memory devices that will be illustrated hereinafter may include elements substantially the same as or similar to those of the vertical memory device illustrated with reference to FIGS. 1 to 34, except for the dummy lower contact plug, and thus detailed descriptions thereon are omitted herein.

Figure 35:
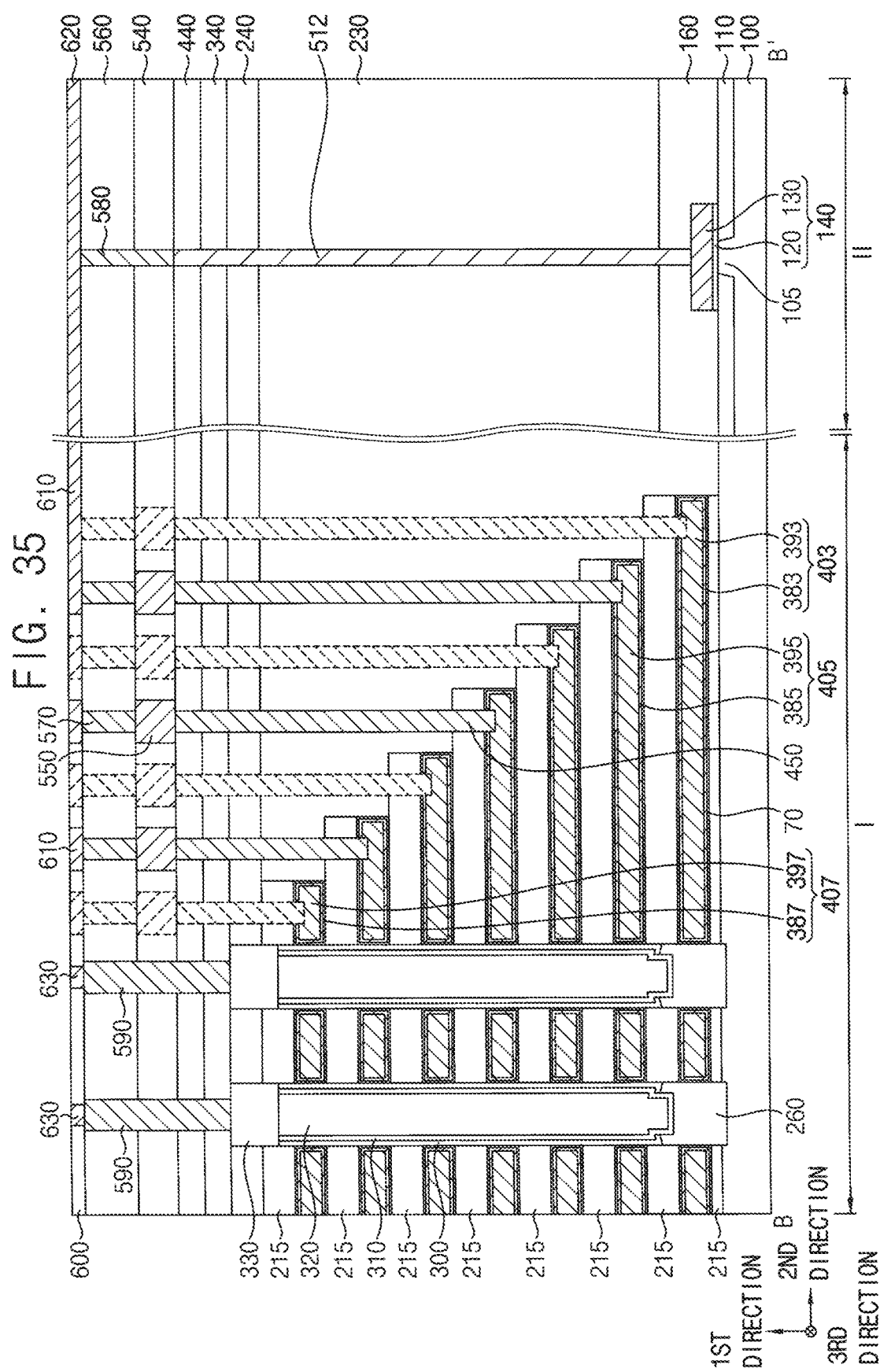
FIG. 35 is a cross-sectional view illustrating a vertical memory device in accordance with some example embodiments.

FIG. 35 is a cross-sectional view illustrating a vertical memory device in accordance with some example embodiments.

Referring to FIG. 35, the vertical memory device may not include the sixth insulating interlayer 460, and thus upper surfaces of the second to sixth lower contact plugs 512, 514, 516, 518 and 520 may be substantially coplanar with those of the first lower contact plugs 450.

Figure 36:
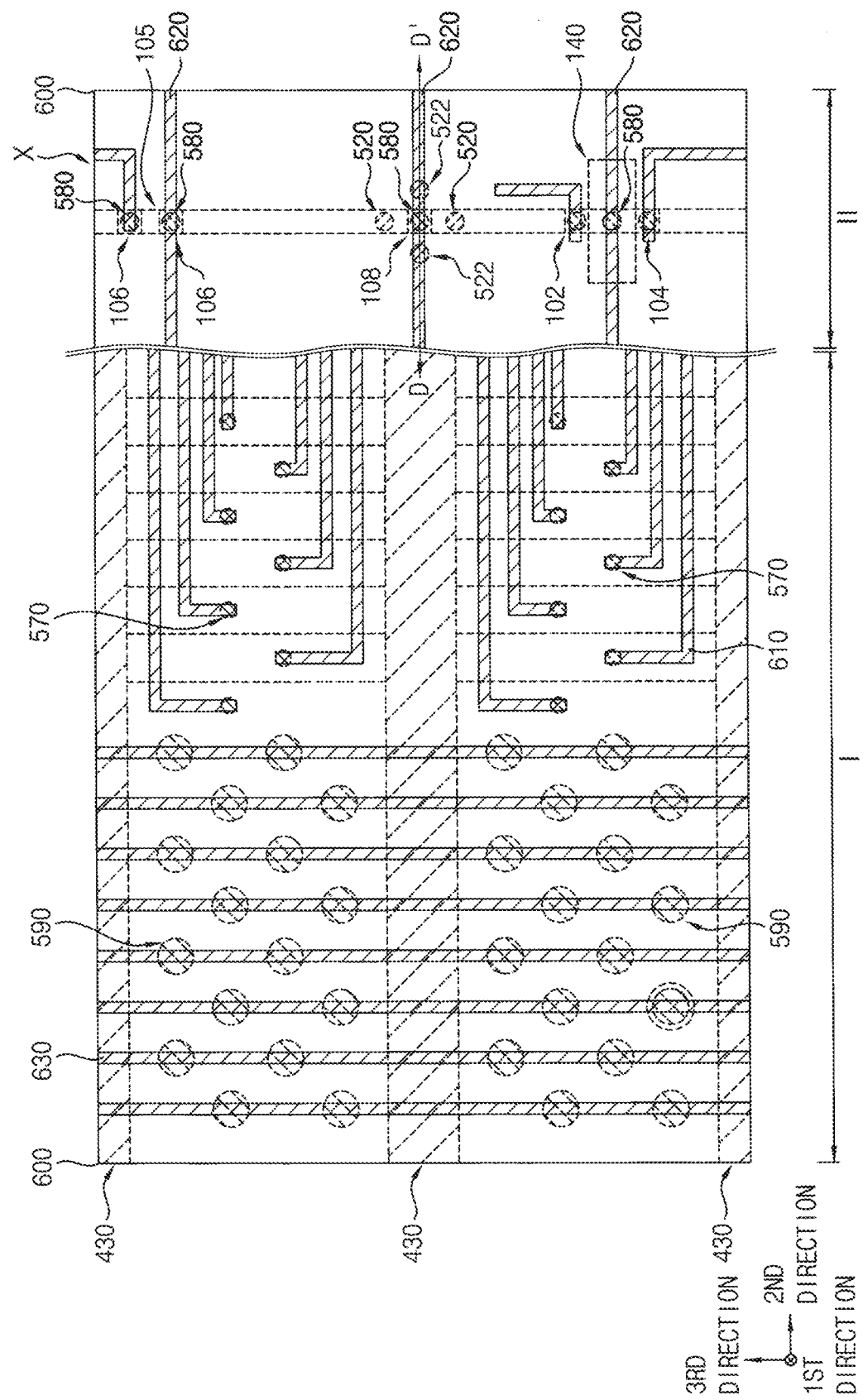
FIGS. 36 and 37 are a plan view and a cross-sectional view, respectively, illustrating a vertical memory device in accordance with some example embodiments.
Figure 37:
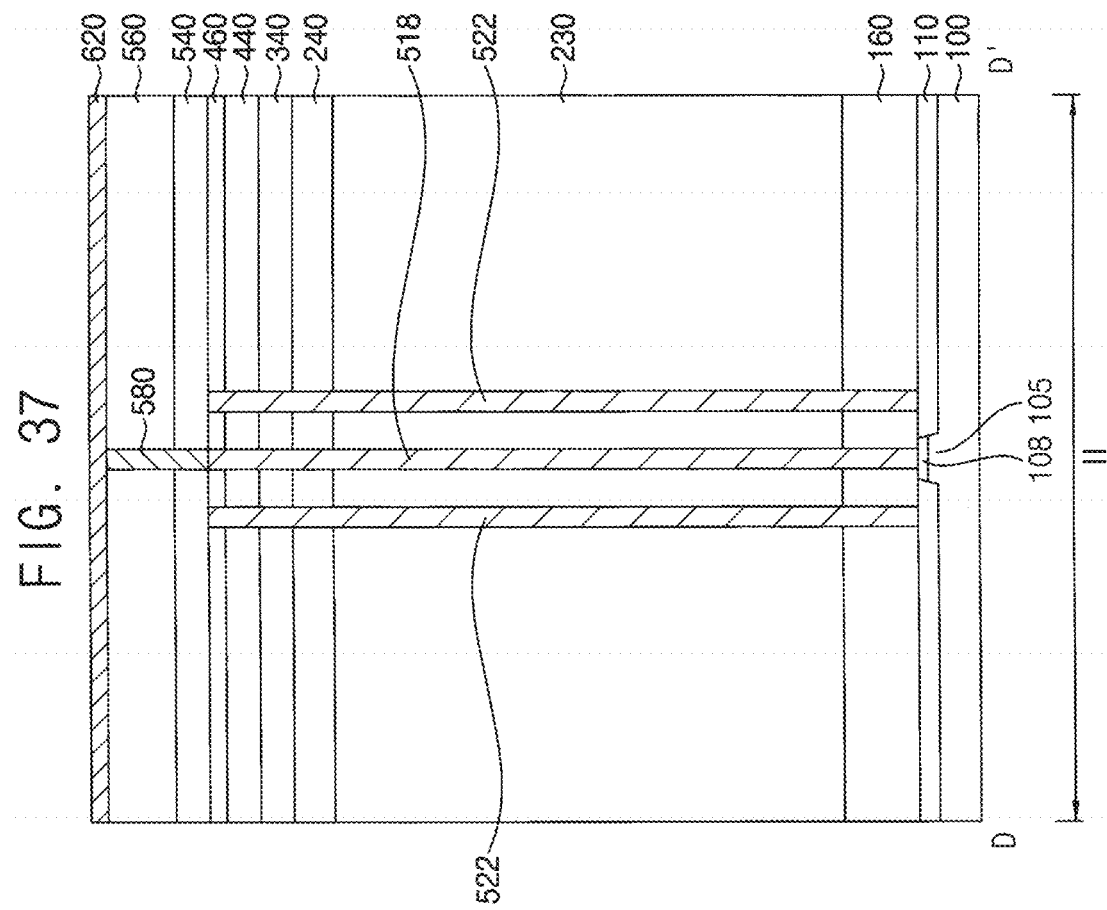

FIGS. 36 and 37 are a plan view and a cross-sectional view, respectively, illustrating a vertical memory device in accordance with some example embodiments.

Referring to FIGS. 36 and 37, the vertical memory device may further include a seventh lower contact plug 522.

The seventh lower contact plug 522 may be adjacent the fifth lower contact plug 518, and may be formed on the isolation pattern 110. In some example embodiments, one or more than one seventh lower contact plugs 522 may be formed.

The seventh contact plug 522 may be a dummy lower contact plug to which no electrical signal may be applied, as the sixth lower contact plug 520. Thus, no upper contact plug may be formed on the seventh lower contact plug 522, and may not be electrically connected to the upper wirings.

The seventh lower contact plug 522 may be formed adjacent the fifth lower contact plug 518, and thus the sixth lower contact plug 520 serving as the dummy lower contact plug may not be formed.

Figure 38:
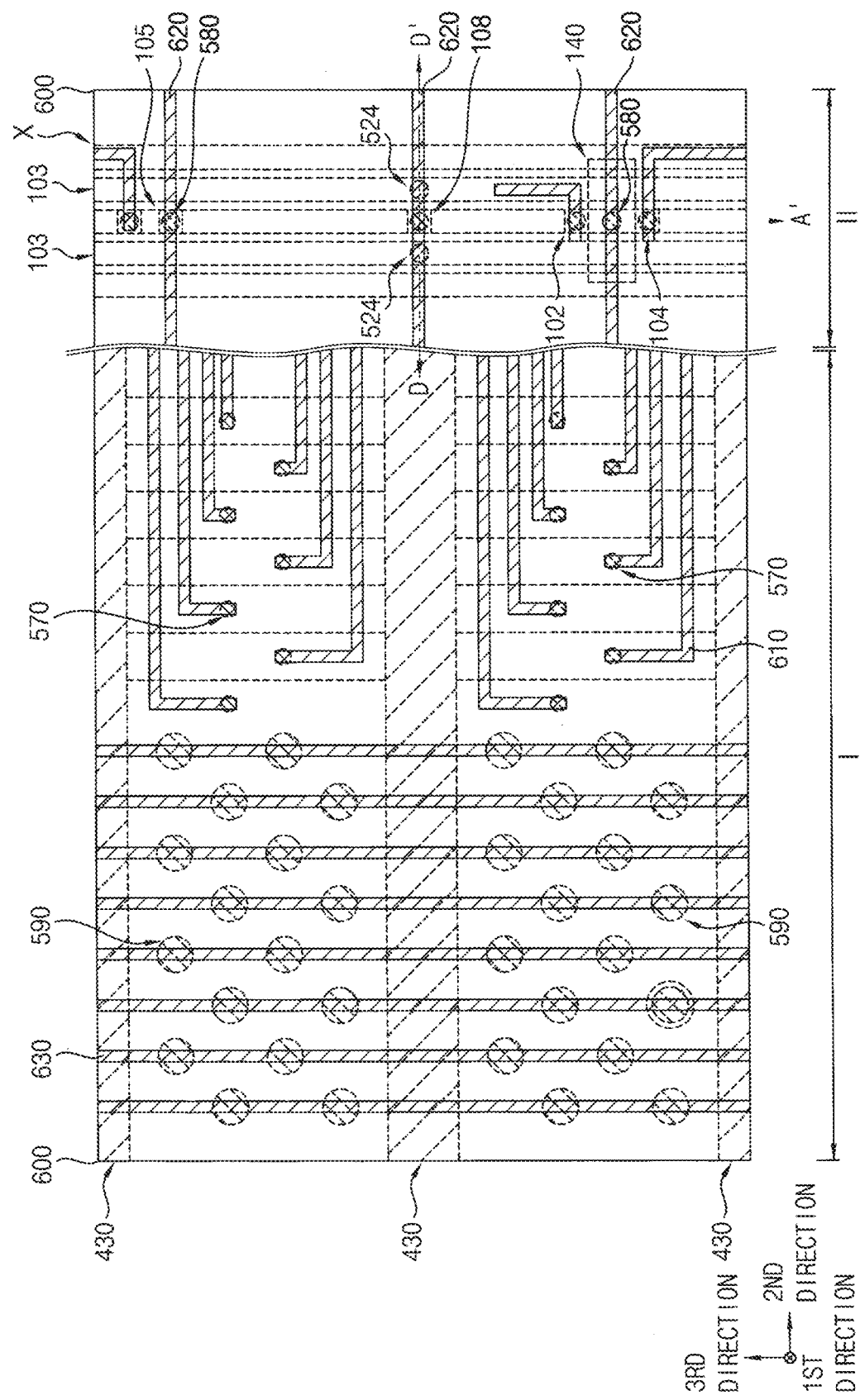
FIGS. 38 and 39 are a plan view and a cross-sectional view, respectively, illustrating a vertical memory device in accordance with some example embodiments.
Figure 39:
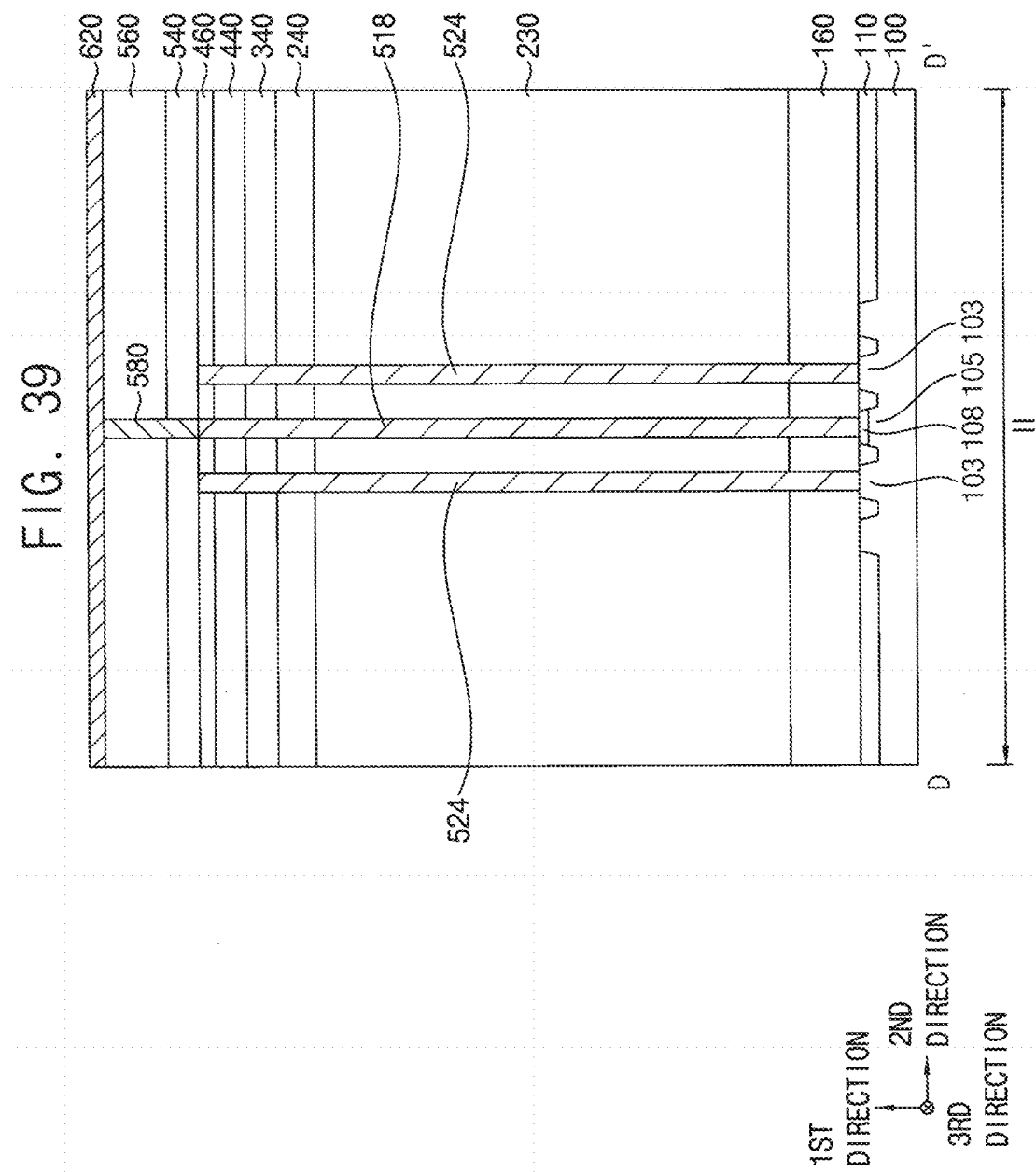

FIGS. 38 and 39 are a plan view and a cross-sectional view, respectively, illustrating a vertical memory device in accordance with some example embodiments.

Referring to FIGS. 38 and 39, the vertical memory device may further include a second active region 103 and an eighth lower contact plug 524.

The second active region 103 may be formed adjacent the first active region 105 on the second region II of the substrate 100. In an example embodiment, each of the first and second active regions 105 and 103 may extend in the third direction, and a plurality of second active regions 103 may be formed to be spaced apart from each other in the second direction.

In some example embodiments, the second active region 103 may serve as a dummy active region unlike the first active region 105 at which an actual source/drain region may be formed. The second active region 103 may increase the density of the active regions so that the first active region 105 may have a desired height with no dishing in a planarization process.

The eighth lower contact plug 524 may be formed on at least one of the second active regions 103. The eighth lower contact plug 524 may serve as a dummy lower contact plug like the sixth lower contact plug 520. Thus, no upper contact plug may be formed on the eighth lower contact plug 524, and may not be electrically connected to upper wirings applying electrical signals.

The eighth lower contact plug 524 may be formed adjacent the fifth lower contact plug 518, and thus the sixth lower contact plug 520 serving as the dummy lower contact plug may not be formed, however, inventive concepts may not be limited thereto.

Figure 40:
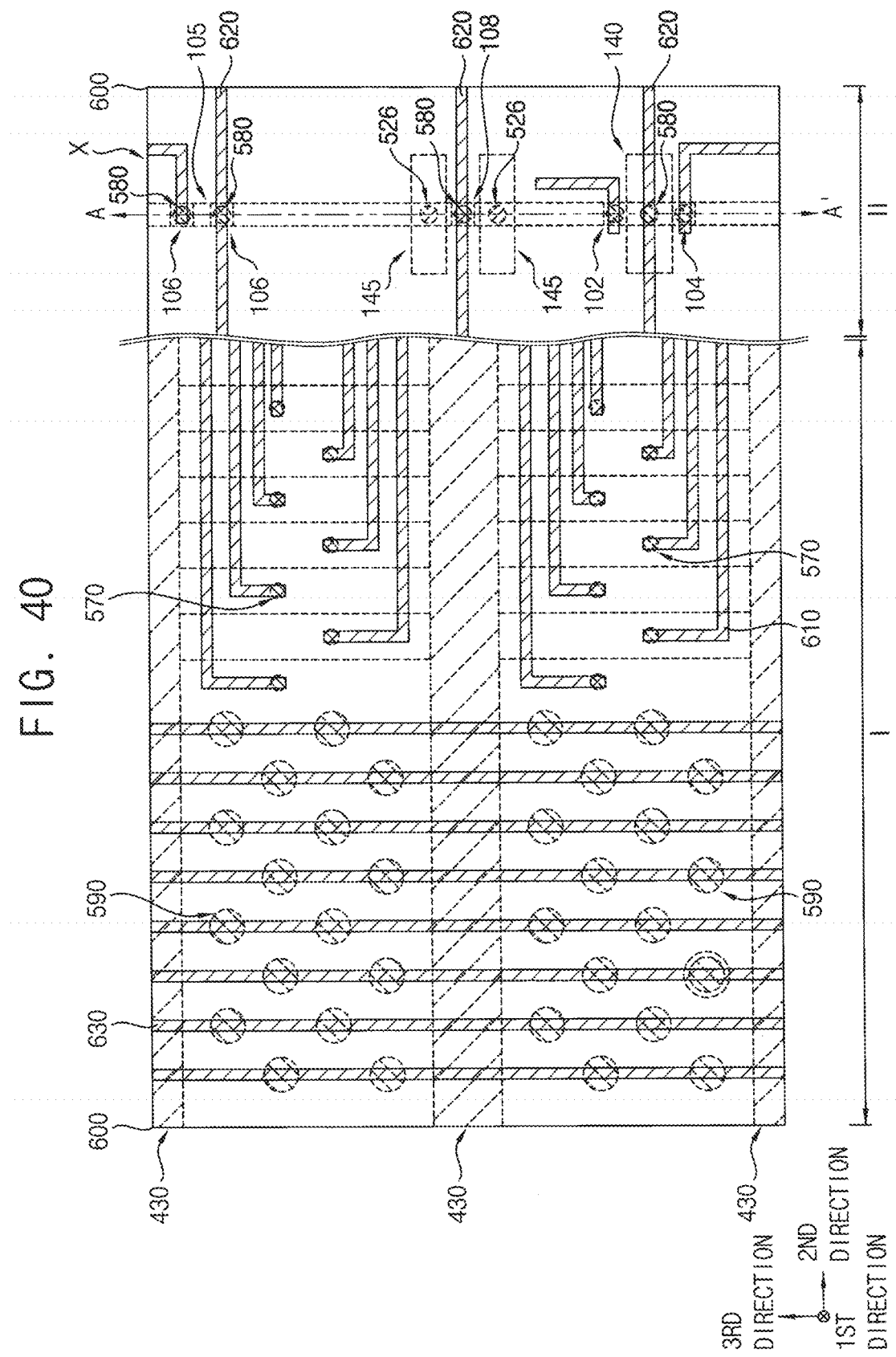
FIGS. 40 and 41 are a plan view and a cross-sectional view, respectively, illustrating a vertical memory device in accordance with some example embodiments.
Figure 41:
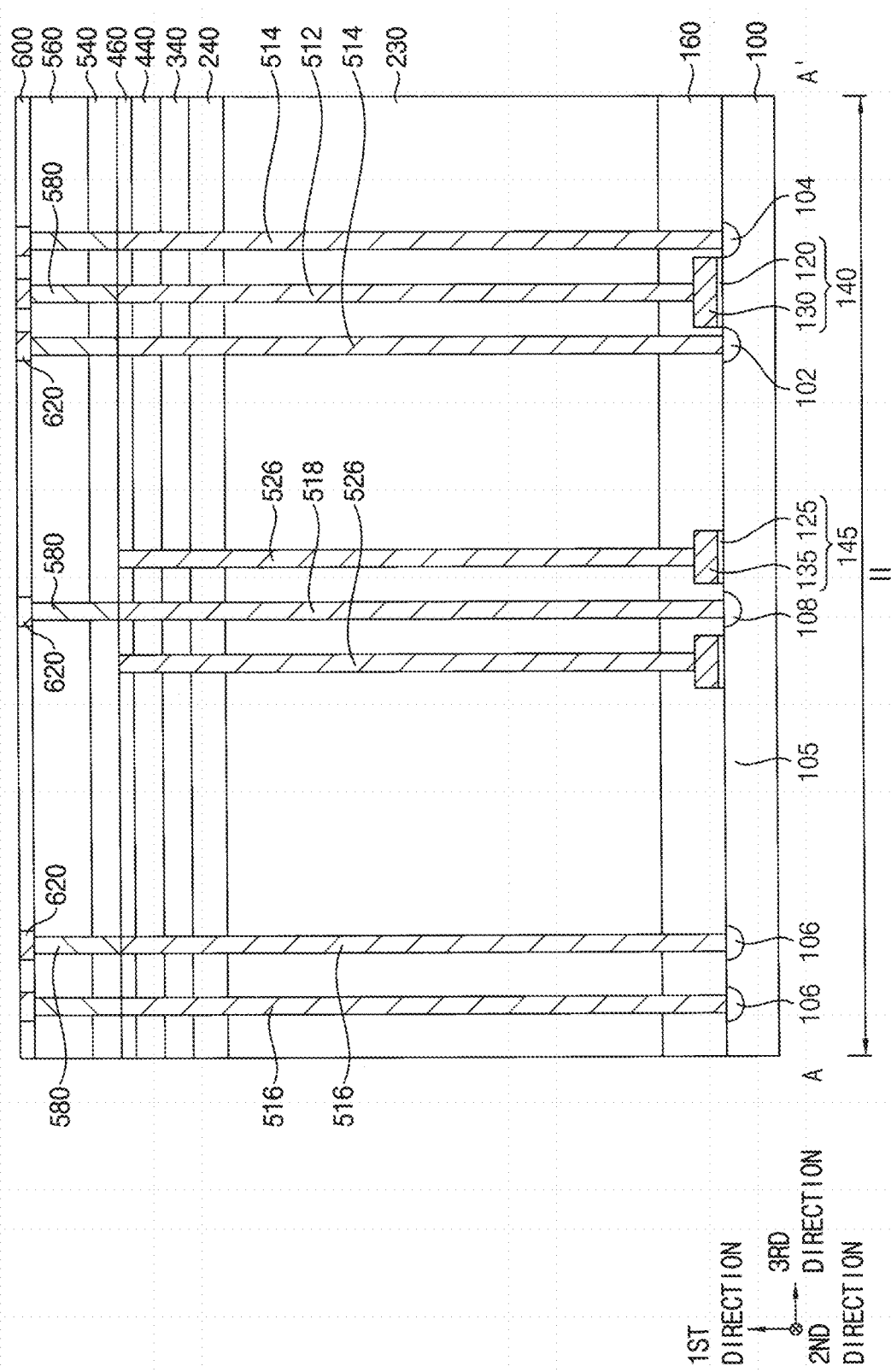

FIGS. 40 and 41 are a plan view and a cross-sectional view, respectively, illustrating a vertical memory device in accordance with some example embodiments.

Referring to FIGS. 40 and 41, the vertical memory device may further include a second gate structure 145 and a ninth lower contact plug 526.

The second gate structure 145 may be formed adjacent the fourth impurity region 108 at an upper portion of the first active region 105. The second gate structure 145 may include a second gate insulation pattern 125 and a second gate electrode pattern 135 sequentially stacked, and one or more than one second gate structures 145 may be formed.

In some example embodiments, the second gate structure 145 may be a dummy gate structure unlike the first gate structure 140 that may form a transistor together with an actual source/drain region. The second gate structure 145 may increase the density of the gate structures so that the first gate structure 140 may have a desired height with no dishing in a planarization process.

The ninth lower contact plug 526 may be formed on at least one of the second gate structures 145. The ninth lower contact plug 526 may serve as a dummy lower contact plug like the sixth lower contact plug 520. Thus, no upper contact plug may be formed on the ninth lower contact plug 526, and may not be electrically connected to upper wirings applying electrical signals.

The ninth lower contact plug 526 may be formed adjacent the fifth lower contact plug 518, and thus the sixth lower contact plug 520 serving as the dummy lower contact plug may not be formed, however, inventive concepts may not be limited thereto.

Figure 42:
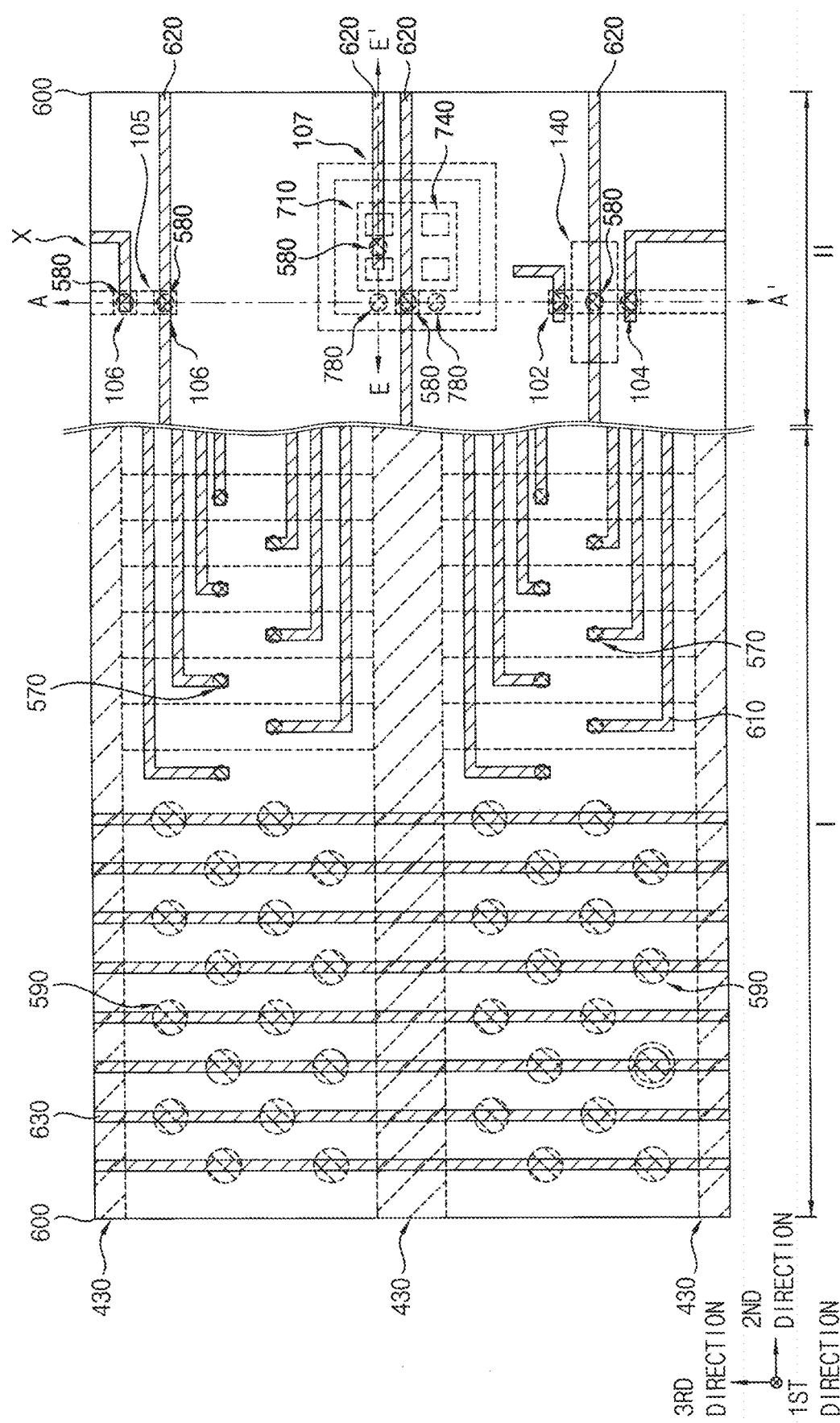
FIGS. 42 to 44 are a plan view and cross-sectional views, respectively, illustrating a vertical memory device in accordance with some example embodiments.
Figure 43:
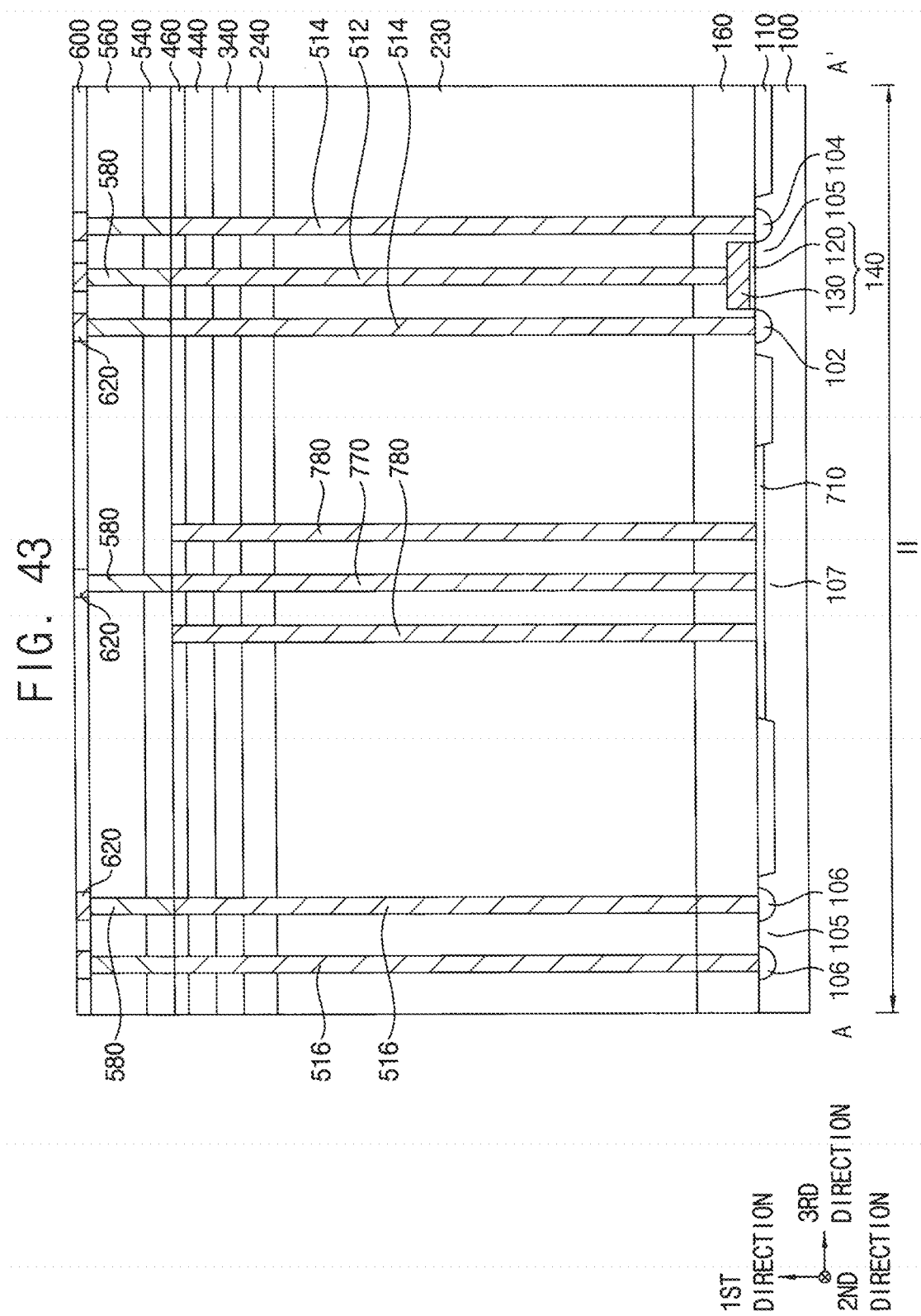
Figure 44:
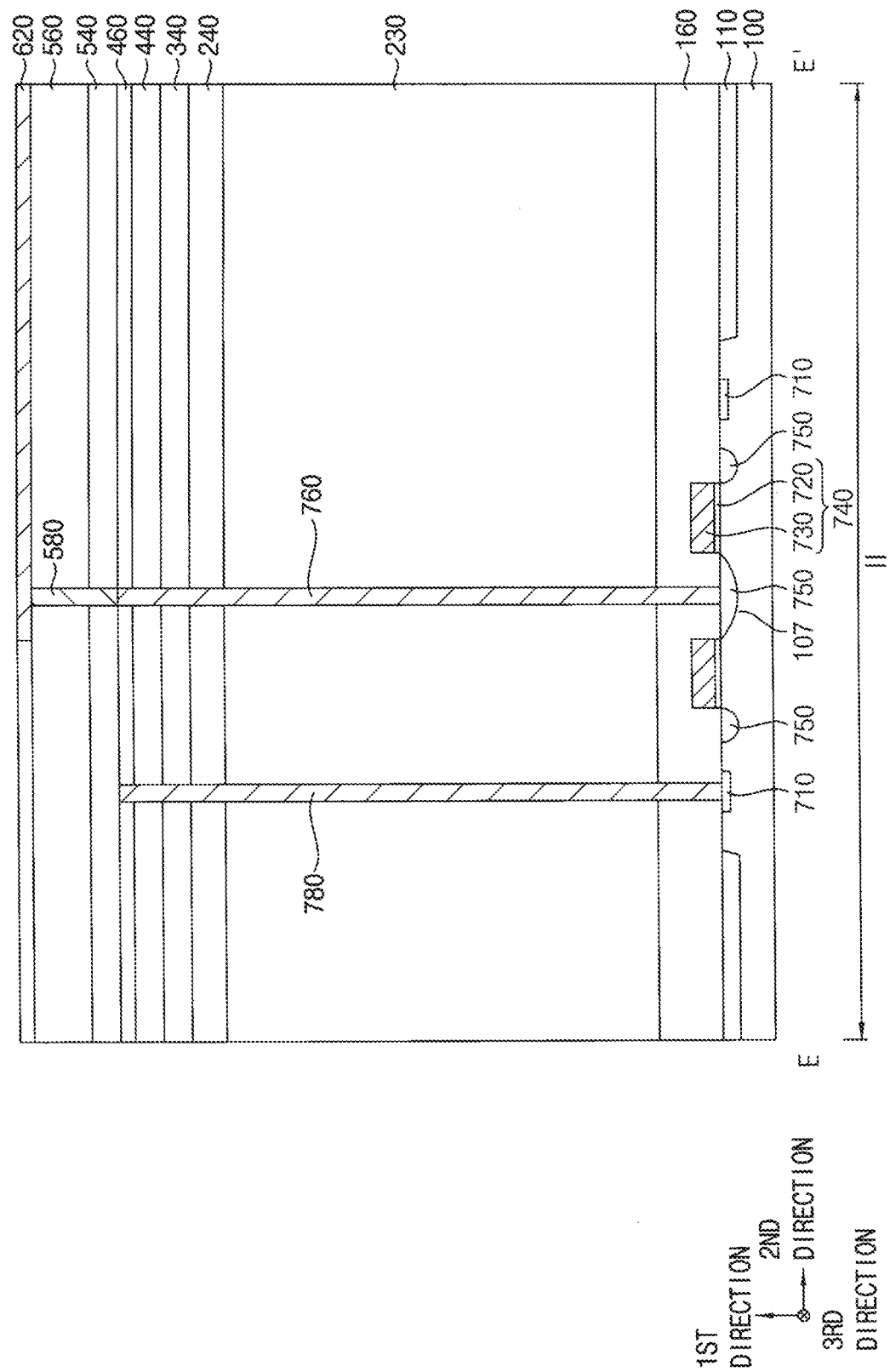

FIGS. 42 to 44 are a plan view and cross-sectional views, respectively, illustrating a vertical memory device in accordance with some example embodiments. FIG. 43 is a cross-sectional view taken along a line A-A' of FIG. 42, and FIG. 44 is a cross-sectional view taken along a line E-E' of FIG. 42.

Referring to FIGS. 42 to 44, the vertical memory device may further include a third active region 107, a guard ring 710, a third gate structure 740, a sixth impurity region 750, and tenth to twelfth lower contact plugs 760, 770 and 780, and may not include the fourth impurity region 108, and the fifth and sixth lower contact plugs 518 and 520.

In an example embodiment, the third active region 107 may have a rectangular shape or a circular shape in a plan view, and the guard ring 710 may be formed at an edge upper portion of the third active region 107. The guard ring 710 may have a rectangular shape or a circular shape in a plan view. In some example embodiments, the third active region 107 may be lightly doped with impurities, and the guard ring 710 may be heavily doped with impurities.

The third gate structure 740 may be formed on the third active region 107. One or more than one third gate structures 740 may be formed. The third gate structure 740 may include a third gate insulation pattern 720 and a third gate electrode pattern 730 sequentially stacked.

The sixth impurity region 750 may be formed at an upper portion of the third active region 107 adjacent the third gate structure 740.

The tenth lower contact plug 760 may contact an upper surface of the sixth impurity region 750, and each of the eleventh and twelfth lower contact plugs 770 and 780 may be formed on the guard ring 710. The second upper contact plug 580 may be formed on each of the tenth and eleventh lower contact plugs 770 and 780, and thus an electrical signal may be applied from the second upper wiring 620 through the second upper contact plug 580. No upper contact plug may be formed on the twelfth lower contact plug 780, and no electrical signal may be applied to the twelfth lower contact plug 780 from the upper wirings.

The twelfth lower contact plug 780 may serve as a dummy lower contact plug, and may help the eleventh lower contact plug 770 to have a desired size and contact the upper surface of the underlying guard ring 710.

Figure 45:
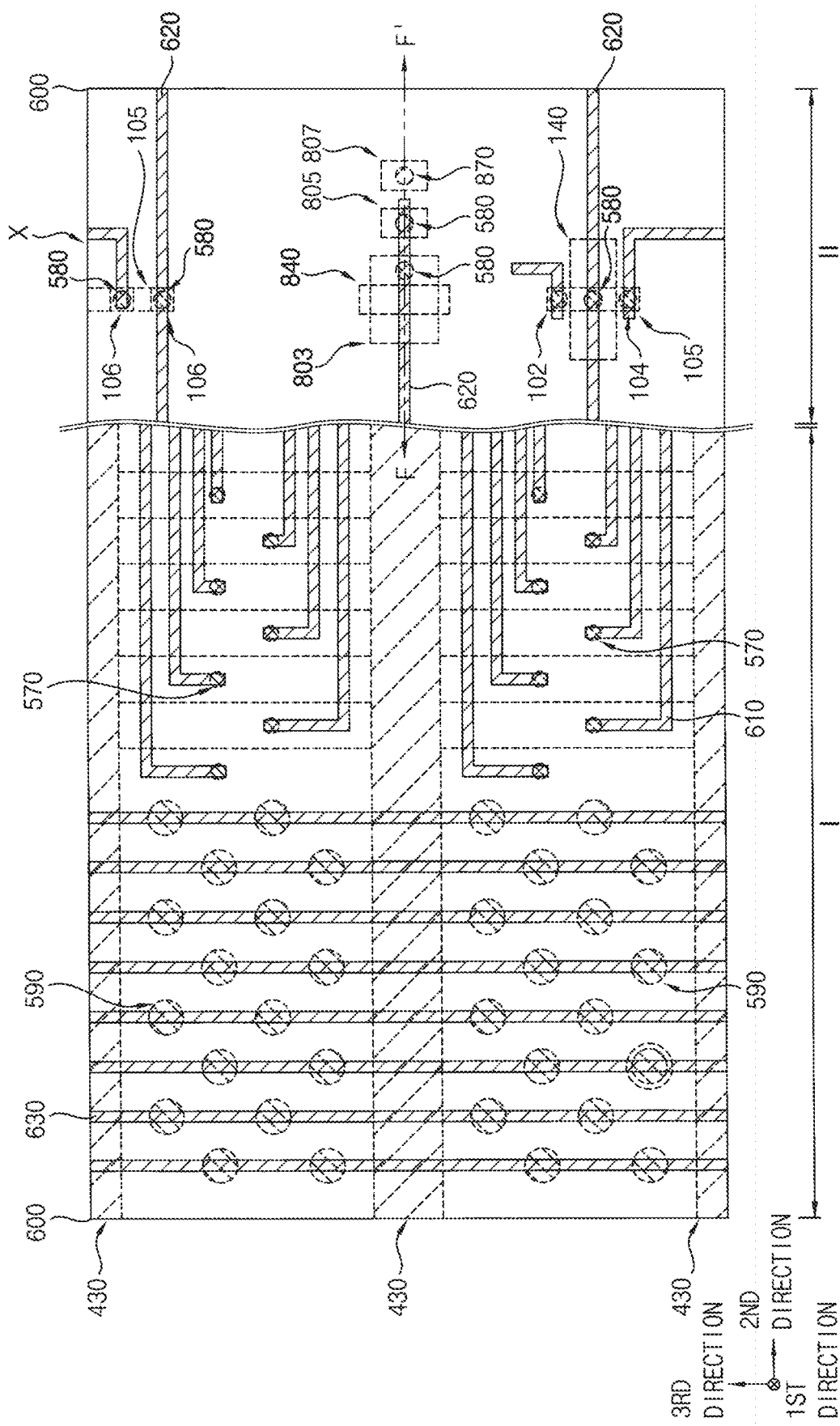
FIGS. 45 and 46 are a plan view and a cross-sectional view, respectively, illustrating a vertical memory device in accordance with some example embodiments.
Figure 46:
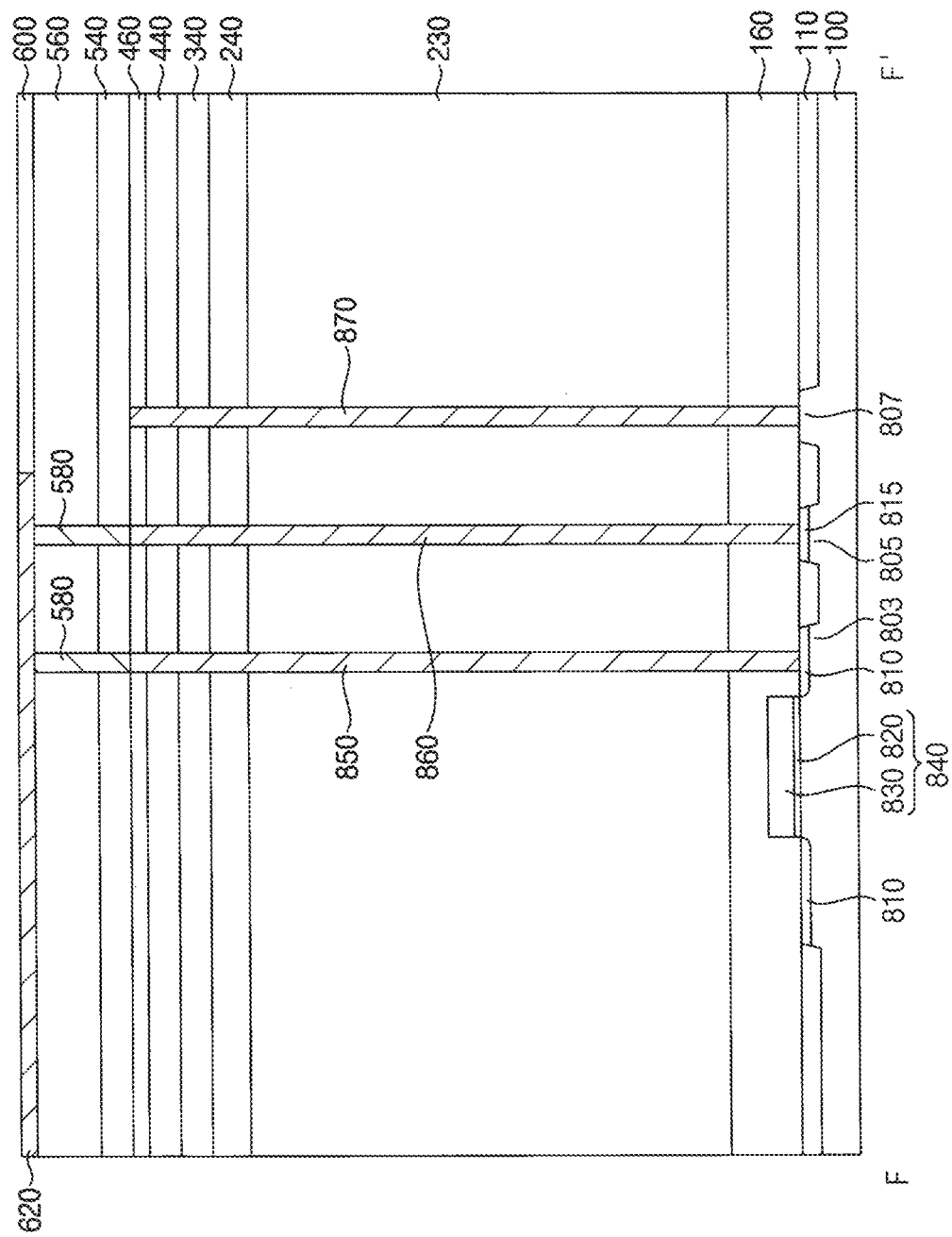

FIGS. 45 and 46 are a plan view and a cross-sectional view, respectively, illustrating a vertical memory device in accordance with some example embodiments. FIG. 46 is a cross-sectional view taken along a line F-F' of FIG. 45.

Referring to FIGS. 45 and 46, the vertical memory device may further include fourth to sixth active regions 803, 805 and 807, seventh and eighth impurity regions 810 and 815, a fourth gate structure 840, and thirteenth to fifteenth lower contact plugs 850, 860 and 870, and may not include the fourth impurity region 108 and the fifth and sixth lower contact plugs 518 and 520.

The fourth and fifth active regions 803 and 805 may be spaced apart from each other, and the sixth active region 807 may be formed adjacent the fifth active region 805. The seventh and eighth impurity regions 810 and 815 may be formed at the fourth and fifth active regions 803 and 805, respectively.

The fourth gate structure 840 may be formed on the fourth active region 803, and may include a fourth gate insulation pattern 820 and a fourth gate electrode pattern 830 sequentially stacked. The fourth gate structure 840 and the seventh impurity region 810 may form a transistor.

Plasma ions stacked in the formation of the transistor may move into the eighth impurity region 815. Thus, the eighth impurity region 815 may be referred to as an antenna diode.

The thirteenth and fourteenth lower contact plugs 850 and 860 may contact upper surfaces of the seventh and eighth impurity regions 810 and 815, respectively, and an electrical signal may be applied from the second upper wiring 620 through the second upper contact plug 580 thereto. The fifteenth lower contact plug 870 may be formed on the sixth active region 807 having no impurity region therein, and no electrical signal may be applied from the upper wirings thereto. The fifteenth lower contact plug 870 may serve as a dummy contact plug, and may help the fourteenth lower contact plug 860 to have a desired size and contact the upper surface of the underlying eighth impurity region 815.

Figure 47:
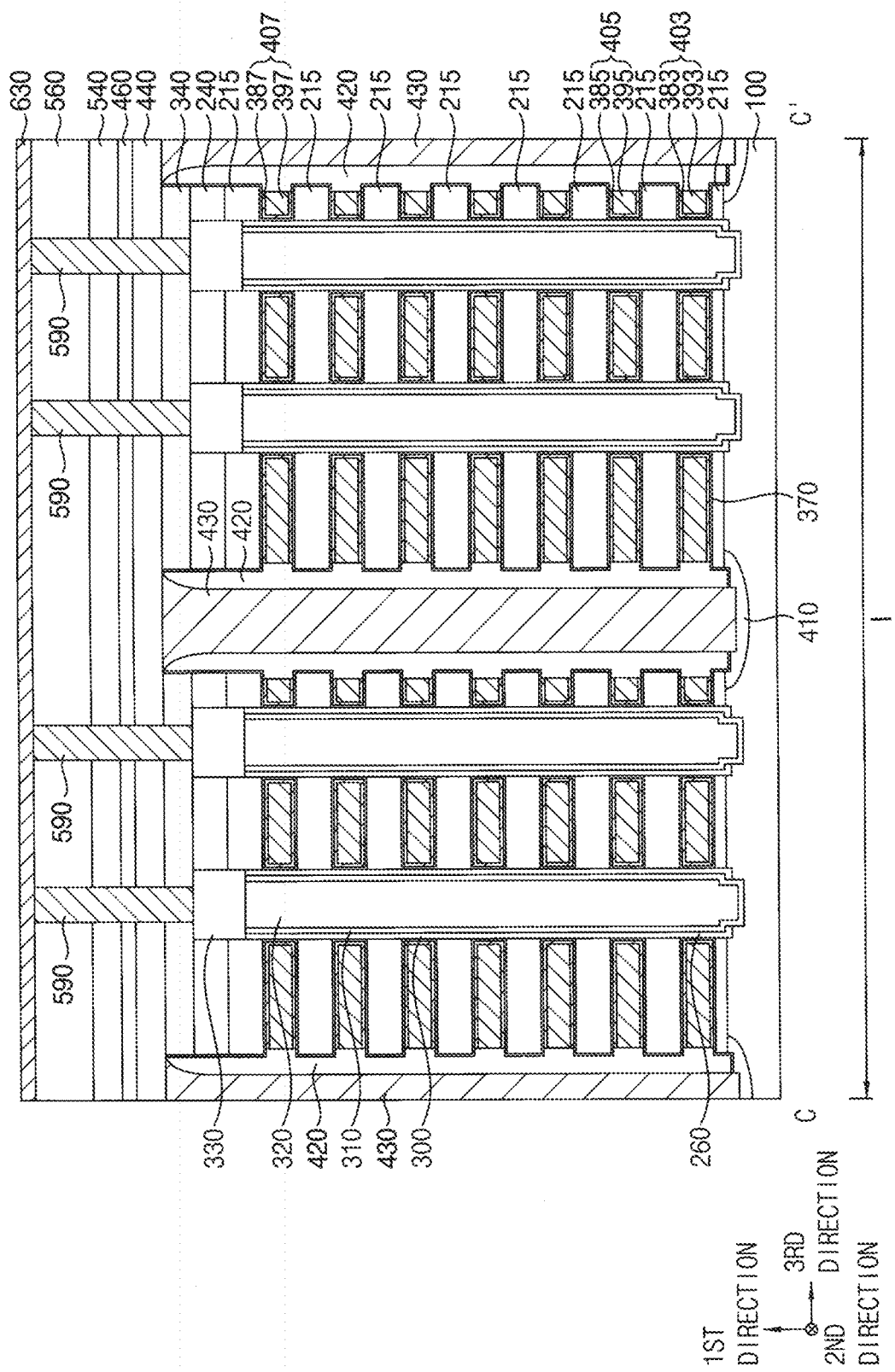
FIG. 47 is a cross-sectional view illustrating a vertical memory device in accordance with some example embodiments.

FIG. 47 is a cross-sectional view illustrating a vertical memory device in accordance with some example embodiments. This vertical memory device may be substantially the same as or similar to that of FIGS. 31 to 34, except for the semiconductor pattern, the channel, and the charge storage structure. Thus, like reference numerals refer to like elements, and detailed descriptions thereon may be omitted below in the interest of brevity.

Referring to FIG. 47, the vertical memory device may not include the semiconductor pattern 260 shown in FIGS. 31 to 34. Thus, the channel 310 may have a cup-like shape contacting the upper surface of the substrate 100, and the charge storage structure 300 may have a cup-like shape of which a central bottom is open. The charge storage structure 300 may contact the upper surface of the substrate 100, and may cover an outer sidewall of the channel 310.

Figure 48:
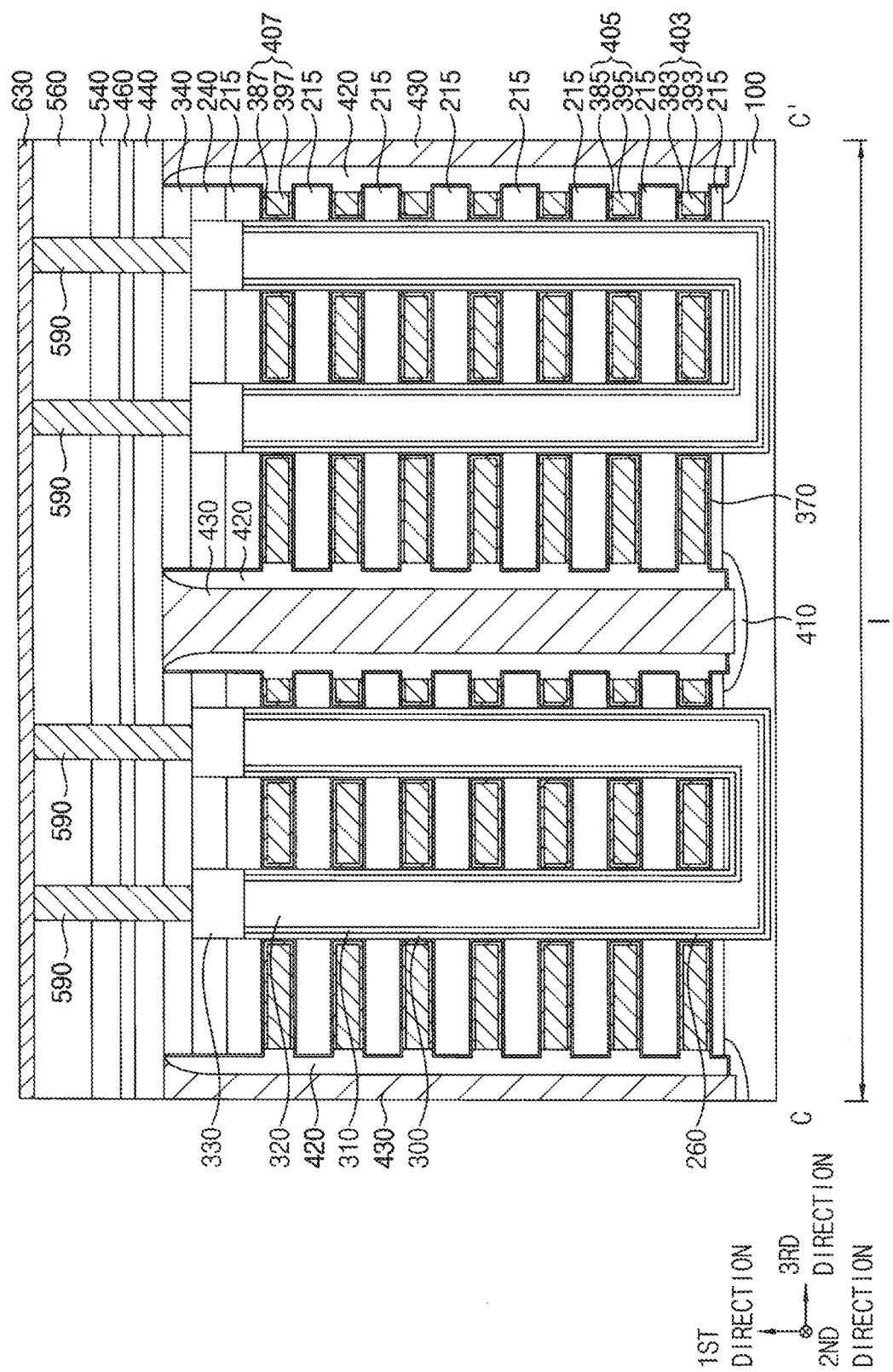
FIG. 48 is a cross-sectional view illustrating a vertical memory device in accordance with some example embodiments.

FIG. 48 is a cross-sectional view illustrating a vertical memory device in accordance with some example embodiments. This vertical memory device may be substantially the same as or similar to that of FIGS. 31 to 34, except for the semiconductor pattern, the channel and the charge storage structure. Thus, like reference numerals refer to like elements, and detailed descriptions thereon may be omitted below in the interest of brevity.

Referring to FIG. 48, the vertical memory device may not include the semiconductor pattern 260 shown in FIGS. 31 to 34, and two neighboring channels 310 may be connected to each other through a trench on the substrate 100.

Thus, the charge storage structures 300 covering outer sidewalls of the two neighboring channels 310 may be also connected to each other.

While example embodiments have been particularly shown and described, it will be understood by one of ordinary skill in the art that variations in form and detail may be made therein without departing from the spirit and scope of the claims.

What is claimed is:

1. A vertical memory device, comprising:
a substrate including a cell region and a peripheral circuit region;
gate electrodes sequentially stacked on the cell region of the substrate in a vertical direction that is substantially perpendicular to an upper surface of the substrate;
a channel on the cell region of the substrate, the channel extending through the gate electrodes in the vertical direction;
a charge storage structure on an outer sidewall of the channel;
first lower contact plugs on the cell region of the substrate, the first lower contact plugs extending in the vertical direction and contacting the gate electrodes, respectively;
a second lower contact plug on the peripheral circuit region of the substrate, the second lower contact plug extending in the vertical direction;
a dummy lower contact plug to which no electrical signal can be applied, the dummy lower contact plug on the peripheral circuit region of the substrate adjacent the second lower contact plug, the dummy lower contact plug extending in the vertical direction, and an upper end of the dummy lower contact plug not being electrically connected to a wiring configured to apply an electrical signal;
a bit line electrically connected to the channel;
first upper wirings electrically connected to the first lower contact plugs, respectively, the first upper wirings configured to apply an electrical signal to the first lower contact plugs; and
a second upper wiring electrically connected to the second lower contact plug, the second upper wiring configured to apply an electrical signal to the second lower contact plug.

2. The vertical memory device of claim 1, wherein an upper surface of the dummy lower contact plug is higher than an upper surface of an uppermost one of the gate electrodes.

3. The vertical memory device of claim 1, wherein an upper surface of the dummy lower contact plug is higher than or substantially coplanar with upper surfaces of the first lower contact plugs.

4. The vertical memory device of claim 1, further comprising:
intermediate contact plugs contacting upper surfaces of the first lower contact plugs, respectively; and
first upper contact plugs contacting upper surfaces of the intermediate contact plugs, respectively, and contacting lower surfaces of the first upper wirings, respectively.

5. The vertical memory device of claim 1, further comprising:
a first upper contact plug between the second lower contact plug and the second upper wiring, wherein
the first upper contact plug contacts the second lower contact plug and the second upper wiring.

6. The vertical memory device of claim 1, wherein each of the gate electrodes extends in a second direction substantially parallel to the upper surface of the substrate, and the bit line extends in a third direction substantially parallel to the upper surface of the substrate and crossing the second direction, and
wherein the second upper wiring extends in the second direction and/or in the third direction.

7. The vertical memory device of claim 6, wherein the second lower contact plug is overlapped with the second upper wiring in the vertical direction.

8. The vertical memory device of claim 1, further comprising:
an isolation pattern on the substrate, wherein
the substrate includes a field region and an active region, the isolation pattern is on the field region and not formed on the active region.

9. The vertical memory device of claim 8, further comprising a gate structure on the peripheral circuit region of the substrate, wherein
an upper portion of the active region of the substrate includes an impurity region,
the second lower contact plug contacts the impurity region at the upper portion of the active region or the gate structure on the substrate, and
the dummy lower contact plug contacts the isolation pattern or a portion of the active region of the substrate at which the impurity region is not formed.

10. The vertical memory device of claim 8, wherein
the substrate further includes a dummy active region adjacent to the active region,
the second lower contact plug contacts an upper surface of the active region, and the dummy lower contact plug contacts an upper surface of the dummy active region.

11. The vertical memory device of claim 8, further comprising:
a gate structure on the peripheral circuit region of the substrate, and
a dummy gate structure on the peripheral circuit region of the substrate adjacent to the gate structure, wherein
the second lower contact plug is connected to the gate structure, and
the dummy lower contact plug is connected to the dummy gate structure.

12. The vertical memory device of claim 8, further comprising:
a transistor on the active region; wherein
the substrate includes a guard ring on an upper portion of the active region,
the guard ring surrounds the transistor, and
the second lower contact plug and the dummy lower contact plug are on the guard ring.

13. The vertical memory device of claim 12, wherein the active region is lightly doped with impurities, and the guard ring is heavily doped with impurities.

14. The vertical memory device of claim 12, wherein the dummy lower contact plug is one of a plurality of dummy lower contact plugs disposed adjacent to each other in a row on the guard ring.

15. The vertical memory device of claim 8, further comprising:
a gate structure on the substrate, wherein
the active region includes first, second and third active regions adjacent to each other,
the gate structure is on the first active region,
the second lower contact plug is on a portion of the first active region adjacent to the gate structure and on the second active region,
and the dummy lower contact plug is on the third active region.

16. The vertical memory device of claim 15, wherein an upper portion of each of the second and third active regions includes an impurity region, and
the second lower contact plug and the dummy lower contact plug contact an upper surface of the impurity region of the second active region and an upper surface of the impurity region of the third active region, respectively.

17. The vertical memory device of claim 1, wherein the dummy lower contact plug is one of a plurality of dummy lower contact plugs adjacent to the second lower contact plug, and
wherein the number of the plurality of dummy lower contact plugs is in a range of 2 to 4.

18. The vertical memory device of claim 1, wherein the bit line, the first upper wirings, and the second upper wiring are disposed at substantially the same level.

19. A vertical memory device, comprising:
a substrate including a cell region and a peripheral circuit region;
gate electrodes sequentially stacked and spaced apart from each other in a vertical direction on the cell region of the substrate, the gate electrodes being stacked in a staircase shape;
channels on the cell region of the substrate, each of the channels extending through the gate electrodes in the vertical direction;
charge storage structures on outer sidewalls of the channels, respectively;
first lower contact plugs on the cell region of the substrate, the first lower contact plugs extending in the vertical direction and contacting the gate electrodes, respectively;
a second lower contact plug on the peripheral circuit region of the substrate, the second lower contact plug extending in the vertical direction;
a dummy lower contact plug to which no electrical signal can be applied, the dummy lower contact plug on the peripheral circuit region of the substrate adjacent the second lower contact plug, the dummy lower contact plug extending in the vertical direction;
bit lines electrically connected to the channels;
first upper wirings electrically connected to the first lower contact plugs, respectively, the first upper wirings configured to apply an electrical signal to the first lower contact plugs;
a second upper wiring electrically connected to the second lower contact plug, the second upper wiring configured to apply an electrical signal to the second lower contact plug; and
an insulating interlayer between the dummy lower contact plug and the second upper wiring, an upper end of the dummy lower contact plug contacting the insulating interlayer so that the dummy lower contact plug and the second upper wiring are electrically insulated from each other.

20. The vertical memory device of claim 19, further comprising:
an upper contact plug extending through the insulating interlayer, wherein
the upper contact plug electrically connects the second upper wiring to the second lower contact plug.

* * * * *